US008723768B2

(12) United States Patent  
Egi et al.

(10) Patent No.: US 8,723,768 B2
(45) Date of Patent: May 13, 2014

(54) DISPLAY DEVICE

(75) Inventors: Yuji Egi, Kanagawa (JP); Takeshi Nishi, Kanagawa (JP); Kiyofumi Ogino, Kanagawa (JP); Shinya Sasagawa, Kanagawa (JP); Motomu Kurata, Kanagawa (JP); Hideomi Suzawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1050 days.

(21) Appl. No.: 11/806,071

(22) Filed: May 29, 2007

(65) Prior Publication Data

US 2008/0042926 A1    Feb. 21, 2008

(30) Foreign Application Priority Data

May 31, 2006   (JP) .................................. 2006-151950

(51) Int. Cl.
*G09G 3/34* (2006.01)
*G09G 3/00* (2006.01)
*C09K 19/00* (2006.01)
*G03B 21/60* (2014.01)

(52) U.S. Cl.
USPC ................. 345/84; 345/32; 428/1.1; 359/452

(58) Field of Classification Search
USPC .................................. 345/32, 84; 428/1.1, 141
See application file for complete search history.

(56) References Cited

U.S. PATENT DOCUMENTS

| 5,657,408 A * | 8/1997 | Ferm et al. ................ 385/43 |
| 5,805,252 A | 9/1998 | Shimada et al. |
| 5,909,314 A | 6/1999 | Oka et al. |
| 6,255,705 B1 | 7/2001 | Zhang et al. |
| 6,261,665 B1 | 7/2001 | Murata et al. |
| 6,297,908 B1 | 10/2001 | Suga |
| 6,326,723 B1 | 12/2001 | Raj et al. |
| 6,340,404 B1 | 1/2002 | Oka et al. |
| 6,426,787 B1 | 7/2002 | Satake et al. |
| 6,433,841 B1 | 8/2002 | Murade et al. |

(Continued)

FOREIGN PATENT DOCUMENTS

| EP | 1 215 513 A1 | 6/2002 |
| JP | 2000-056105 A | 2/2000 |

(Continued)

OTHER PUBLICATIONS

International Search Report (Application No. PCT/JP2007/061153) Date Sep. 4, 2007.

(Continued)

*Primary Examiner* — Charles V Hicks
(74) *Attorney, Agent, or Firm* — Nixon Peabody LLP; Jeffrey L. Costellia

(57) ABSTRACT

The display device includes an anti-reflection film having a plurality of projections over a display screen surface and a protective layer filling a space between the projections. The number of times of incidence of external light entering the display device on the anti-reflection film is increased; therefore, the amount of external light transmitted through the anti-reflection film is increased. Thus, the amount of external light reflected to a viewer side is reduced, and the cause of a reduction in visibility such as reflection can be eliminated. Further, since the plurality of projections is covered with a protective layer, entry of dust can be prevented, and physical strength of the anti-reflection film can be increased.

37 Claims, 37 Drawing Sheets

(56) References Cited

U.S. PATENT DOCUMENTS

| | | | |
|---|---|---|---|
| 6,468,844 B1 | 10/2002 | Yamazaki et al. | |
| 6,576,926 B1 | 6/2003 | Yamazaki et al. | |
| 6,777,254 B1 | 8/2004 | Yamazaki et al. | |
| 6,825,896 B2 | 11/2004 | Goto et al. | |
| 6,833,665 B2 | 12/2004 | Wachi et al. | |
| 6,951,400 B2 | 10/2005 | Chisholm et al. | |
| 7,094,452 B2 | 8/2006 | Yamashita et al. | |
| 7,142,361 B2* | 11/2006 | Olofson et al. | 359/452 |
| 7,445,733 B2 | 11/2008 | Arakawa et al. | |
| 8,004,637 B2 | 8/2011 | Kawata et al. | |
| 8,102,494 B2 | 1/2012 | Nishida et al. | |
| 2002/0044356 A1 | 4/2002 | Arakawa et al. | |
| 2002/0089750 A1 | 7/2002 | Hoshi | |
| 2002/0101155 A1 | 8/2002 | Kimura | |
| 2003/0102286 A1 | 6/2003 | Takahara et al. | |
| 2003/0169386 A1 | 9/2003 | Goto et al. | |
| 2003/0180476 A1* | 9/2003 | Yamashita et al. | 428/1.1 |
| 2004/0109305 A1 | 6/2004 | Chisholm et al. | |
| 2004/0191478 A1 | 9/2004 | Nishikawa et al. | |
| 2004/0201795 A1 | 10/2004 | Paukshto | |
| 2004/0227446 A1* | 11/2004 | Fujimoto et al. | 313/110 |
| 2004/0253413 A1* | 12/2004 | Baba et al. | 428/141 |
| 2005/0074579 A1 | 4/2005 | Suzuki et al. | |
| 2005/0094277 A1 | 5/2005 | Khusnatdinov et al. | |
| 2005/0190321 A1 | 9/2005 | Ohsawa | |
| 2005/0245078 A1 | 11/2005 | Ohnuma et al. | |
| 2006/0050387 A1 | 3/2006 | Arakawa et al. | |
| 2006/0139749 A1 | 6/2006 | Watanabe et al. | |
| 2006/0194020 A1 | 8/2006 | Naito et al. | |
| 2006/0245060 A1 | 11/2006 | Goto | |
| 2006/0250064 A1 | 11/2006 | Park et al. | |
| 2007/0059490 A1 | 3/2007 | Kaneko | |
| 2007/0284991 A1 | 12/2007 | Egi et al. | |
| 2008/0001156 A1 | 1/2008 | Sakakura et al. | |
| 2008/0129933 A1 | 6/2008 | Nishida et al. | |
| 2012/0081909 A1 | 4/2012 | Nishida et al. | |

FOREIGN PATENT DOCUMENTS

| | | |
|---|---|---|
| JP | 2001-264520 A | 9/2001 |
| JP | 2001-272505 | 10/2001 |
| JP | 2002-182003 | 6/2002 |
| JP | 2002-241193 | 8/2002 |
| JP | 2002-286906 A | 10/2002 |
| JP | 2002-321907 | 11/2002 |
| JP | 2003-043203 | 2/2003 |
| JP | 2003-240904 A | 8/2003 |
| JP | 2003-248102 | 9/2003 |
| JP | 2003-279705 | 10/2003 |
| JP | 2004-069877 | 3/2004 |
| JP | 2004-219626 | 8/2004 |
| JP | 2004-258380 | 9/2004 |
| JP | 2005-064324 A | 3/2005 |
| JP | 2005-099467 | 4/2005 |
| JP | 2005-173457 A | 6/2005 |
| JP | 2005-181740 | 7/2005 |
| JP | 2005-221906 A | 8/2005 |
| JP | 2005-234447 A | 9/2005 |
| JP | 2006-128665 | 5/2006 |
| JP | 2006-133617 A | 5/2006 |
| JP | 2008-009409 | 1/2008 |
| WO | WO-2004/092808 A2 | 10/2004 |
| WO | WO-2005/022971 | 3/2005 |
| WO | WO-2007/139209 A1 | 12/2007 |

OTHER PUBLICATIONS

Written Opinion (Application No. PCT/JP2007/061153) Dated Sep. 4, 2007.
Development of a technique for forming an ultrafine nonreflective structure (moth-eye) useful for mproving functions of a photonic device, , MORITEX news release, Jun. 20, 2002, MORITEX.
'International Search Report (Application No. PCT/JP2007/061152; PCT9711) Dated Jul. 3, 2007.
'Written Opinion (Application No. PCT/JP2007/061152; PCT9711) Dated Jul. 3, 2007.
European Search Report (Application No. 07744541.9; PCTEP09712) Dated Jul. 12, 2012.

* cited by examiner

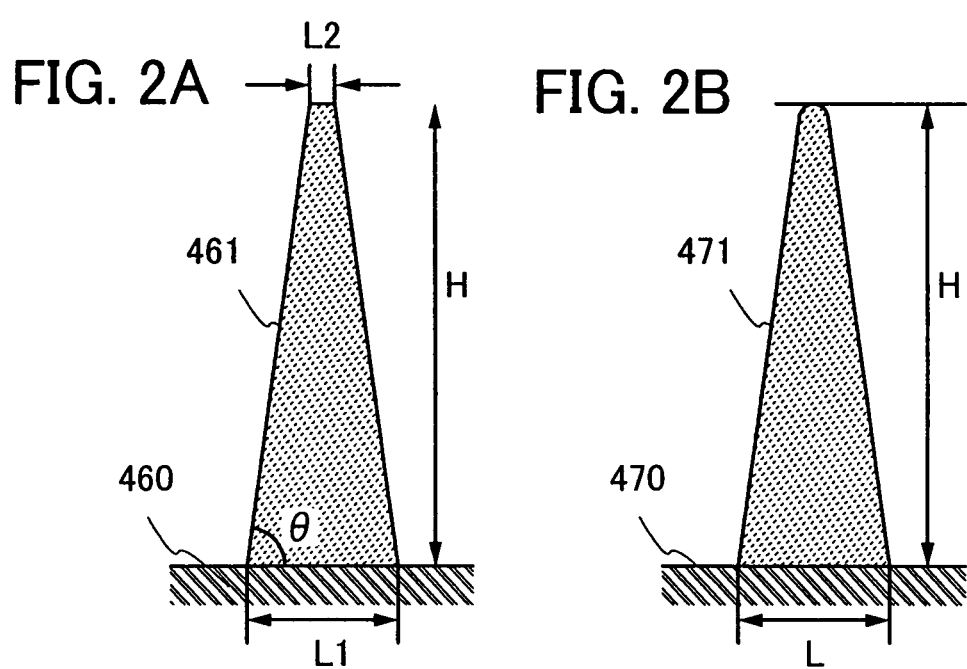
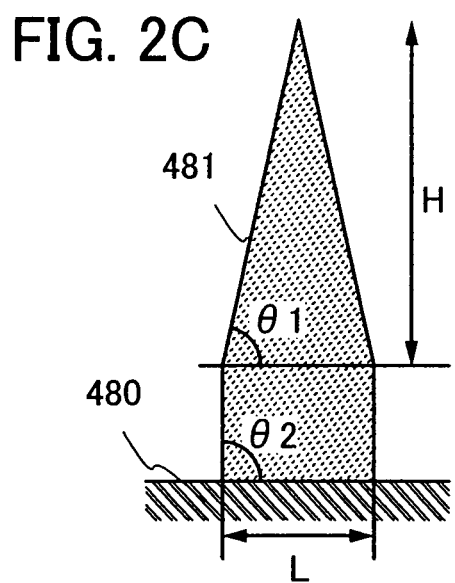

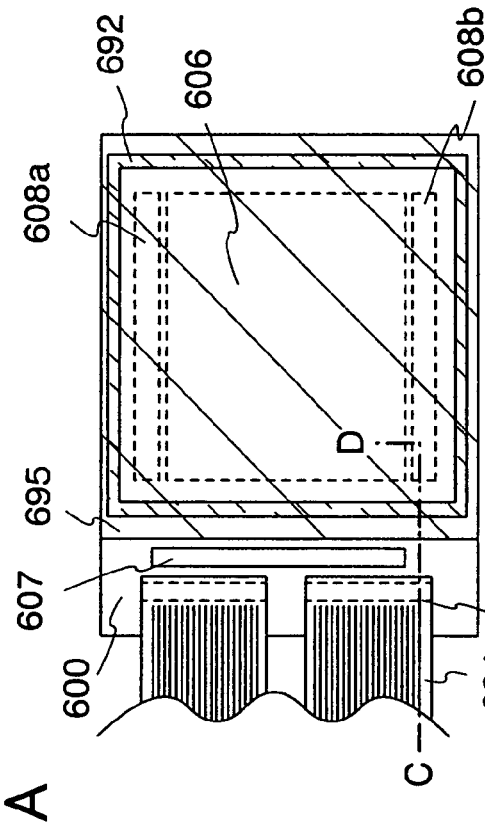
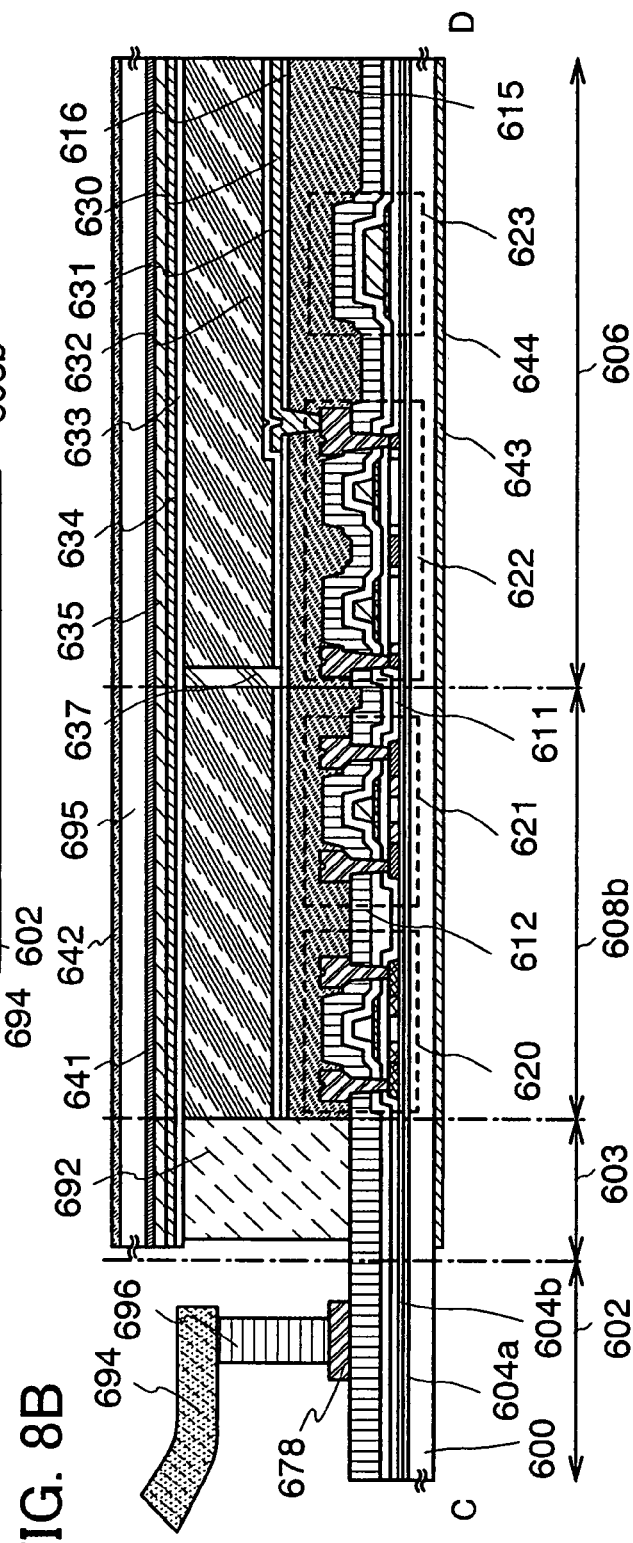
FIG. 8A
FIG. 8B

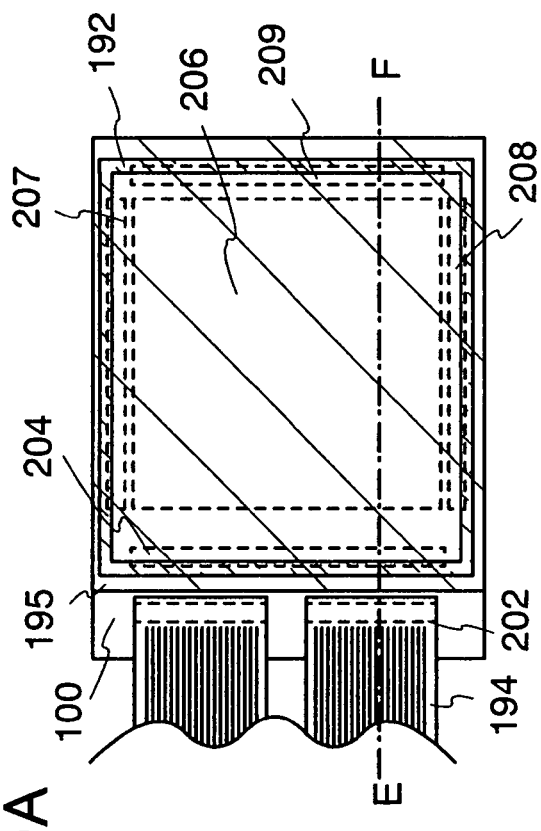
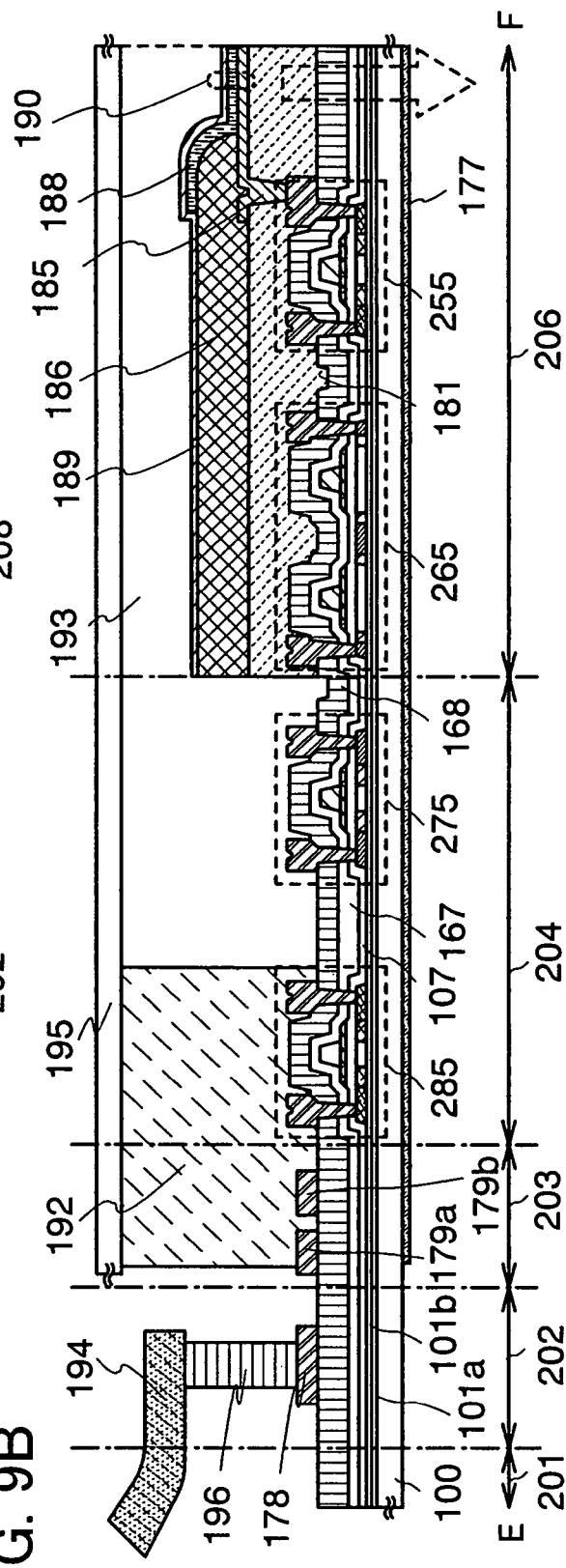

FIG. 20A
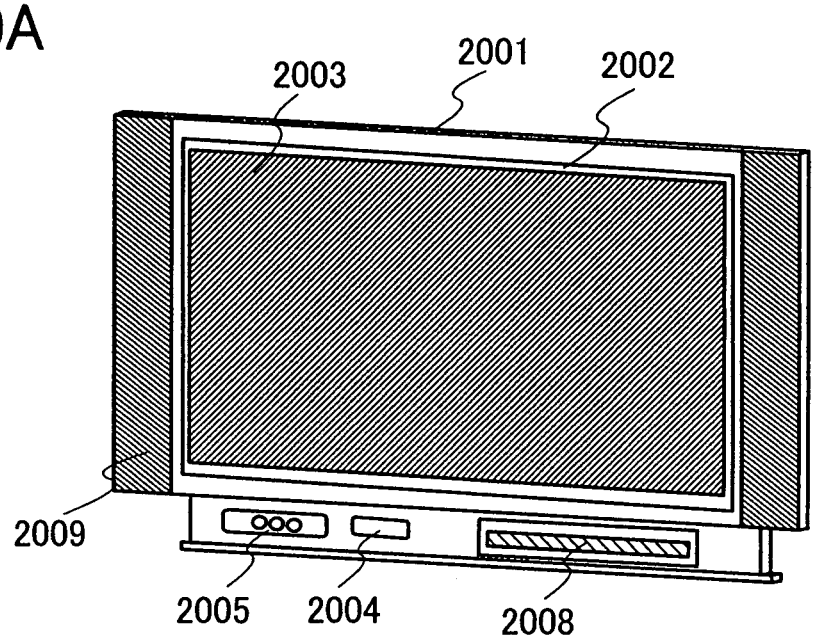
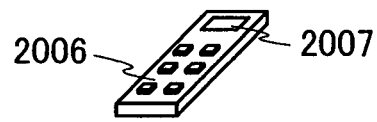
FIG. 20B
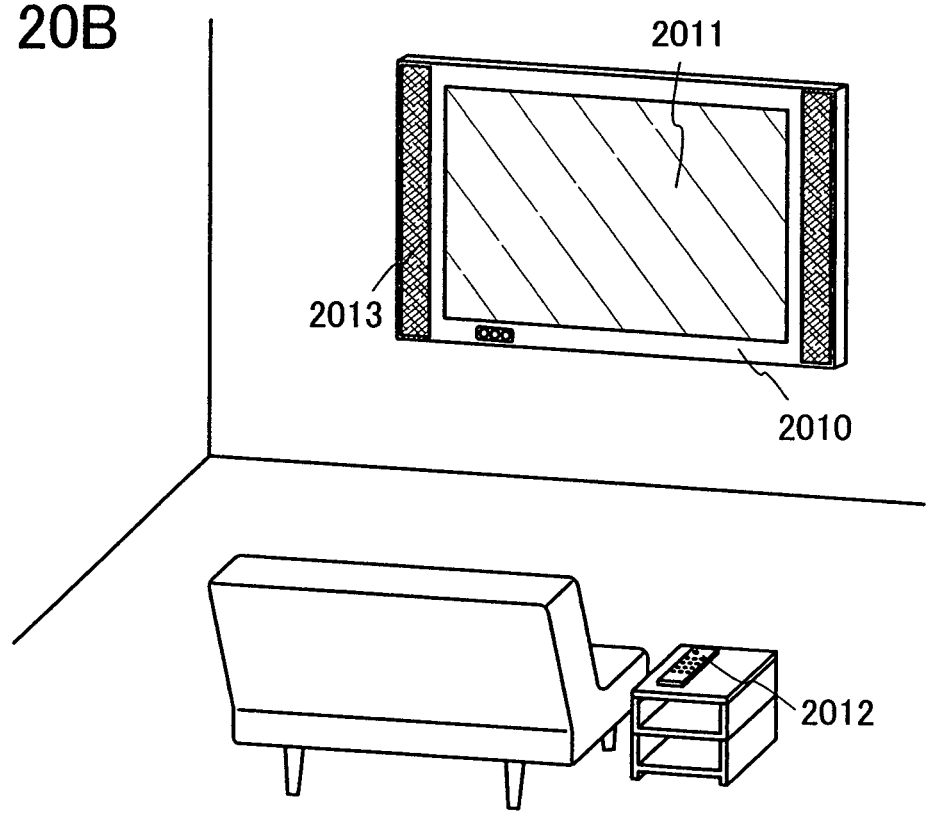

541  531  521  543

E  525a  503a  502  521  504  503b  525b  523  526  527  520  F

DISPLAY DEVICE

TECHNICAL FIELD

The present invention relates to a display device having an anti-reflection function.

BACKGROUND ART

In some display devices having various displays (such as a liquid crystal display, an electroluminescent display (hereinafter also referred to as an EL display), or a plasma display), there may be a case where it becomes difficult to see a display screen due to reflection of its surroundings by surface reflection of external light, so that visibility is decreased. This is a considerable problem particularly in an increase in size of the display device and outdoor use thereof.

In order to prevent such reflection of external light, a method of providing a display screen of a display device with an anti-reflection film has been employed. For example, there is a method of providing an anti-reflective film that has a multilayer structure of stacked layers having different refractive indices so as to be widely effective for a visible light wavelength range (see, for example, Reference 1: Japanese Published Patent Application No. 2003-248102). With a multilayer structure, external light beams reflected at each interface between the stacked layers interfere and cancel each other, which provides an anti-reflection effect.

DISCLOSURE OF INVENTION

However, with the above-described multilayer structure, a light beam, which cannot be cancelled, of the external light beams reflected at each layer interface is emitted to a viewer side as reflected light. In order to achieve mutual cancellation of external light beams, it is necessary to precisely control optical characteristics of materials, thicknesses, and the like of films stacked, and it has been difficult to perform anti-reflection treatment to all external light beams which are incident from various angles.

In view of the foregoing, a conventional anti-reflection film has a functional limitation, and an anti-reflection film having a higher anti-reflection function, and a display device having such an anti-reflection function have been demanded.

It is an object of the present invention to provide a high-visibility display device with an anti-reflection function that can further reduce reflection of external light, and a method for manufacturing such a display device.

A feature of the present invention is to use an anti-reflection film having a plurality of projections over a display screen surface of a display device as an anti-reflection film having an anti-reflection function to prevent reflection of external light and to provide a protective layer formed of a material having a lower refractive index than the projections so as to fill a space between the plurality of projections. Each projection of the anti-reflection film of the present invention preferably has a conical shape, and an angle made by a base and a lateral surface of each projection is preferably equal to or greater than 84° and less than 90°. Instead of a conical shape, each projection may have a needle-like shape, a shape of a cone with its apex cut off by a plane parallel to its base, a dome shape with a rounded top, or the like.

In the anti-reflection film of the present invention, a ratio of a base diameter to a height of each projection is 1:5 to 1:29, preferably 1:10, and the height is preferably 1 μm to 3 μm. When each projection is of this size, light transmittance is not decreased, and processing is relatively easy.

In the present invention, the thickness of the protective layer provided to fill a space between the projections of the anti-reflection film may be equivalent to the height of each projection, or may be larger than the height of each projection to cover the projections. In this case, surface unevenness of the anti-reflection film due to the projections is planarized by the protective layer. Alternatively, the thickness of the protective layer may be smaller than the height of each projection, and in this case, a portion of each projection closer to the base is selectively covered and a portion of each projection closer to the apex is exposed on the surface.

The projections can further reduce reflection of external light due to their shapes. However, when there is a foreign substance such as dirt or dust in air between the projections, the foreign substance causes reflection of external light and accordingly, there is a case where a sufficient anti-reflection effect for external light cannot be obtained. Since the protective layer is formed between the projections in the present invention, the entry of a contaminant such as dust into between the projections can be prevented. Therefore, a decrease in anti-reflection function due to entry of dust or the like can be prevented, and physical strength as the anti-reflection film can be increased by filling a space between the projections. Accordingly, reliability can be improved.

Since the protective layer filling a space between the projections is formed using a material having a lower refractive index than a material used for the projections, it has a smaller difference in refractive index with air than the material used for the projections. Interfacial reflection can be further suppressed.

The present invention can also be applied to a display device that is a device having a display function. The display device of the present invention includes, in its category, a light emitting display device in which a TFT is connected to a light emitting element having, between electrodes, a layer containing an organic material, an inorganic material, or a mixture of an organic material and an inorganic material that exhibits light emission called electroluminescence (hereinafter also referred to as EL); a liquid crystal display device which uses a liquid crystal element having a liquid crystal material as a display element; and the like. In the present invention, the display device refers to a device including a display element (such as a liquid crystal element or a light emitting element). Note that the display device may refer to a main body of a display panel in which a plurality of pixels each including a display element such as a liquid crystal element or an EL element and a peripheral driver circuit for driving these pixels are formed over a substrate. In addition, the display device may include one which is provided with a flexible printed circuit (FPC) or a printed wiring board (PWB) (such as an IC, a resistor, a capacitor, an inductor, or a transistor). Further, the display device may include an optical sheet such as a polarizing plate or a retardation plate. Furthermore, the display device may include a backlight (which may include a light guiding plate, a prism sheet, a diffuser sheet, a reflective sheet, or a light source (such as an LED or a cold cathode tube)).

Note that the display element and the display device can be in various modes and can include various elements. For example, a display medium of which contrast varies by an electromagnetic action can be used, such as an EL element (an organic EL element, an inorganic EL element, or an EL element containing an organic material and an inorganic material), an electron emitting element, a liquid crystal element, electronic ink, a grating light valve (GLV), a plasma display panel (PDP), a digital micromirror device (DMD), a piezoelectric ceramic display, or a carbon nanotube. Note that examples of display devices using the above display elements are as follows: an EL display, as a display device using an EL element; a field emission display (FED) or an SED flat-panel display (SED: Surface-conduction Electron-emitter Display), as a display device using an electron emitting element; a liquid crystal display, a transmissive liquid crystal display, a semi-transmissive liquid crystal display, or a reflective liquid crystal display, as a display device using a liquid crystal element; and electronic paper, as a display device using electronic ink.

One mode of the display device of the present invention includes an anti-reflection film having a plurality of projections over a display screen, and a protective layer having a lower refractive index than the plurality of projections between the plurality of projections. An angle made by a base and a slope of each projection is equal to or greater than 84° and less than 90°.

Another mode of the display device of the present invention includes a pair of substrates, at least one of which is a light-transmitting substrate, a display element provided between the pair of substrates, an anti-reflection film having a plurality of projections on an outer side of the light-transmitting substrate, and a protective layer having a lower refractive index than the plurality of projections between the plurality of projections, in which an angle made by a base and a slope of each projection is equal to or greater than 84° and less than 90°.

Another mode of the display device of the present invention includes a pair of light-transmitting substrates, a display element provided between the pair of light-transmitting substrates, a pair of anti-reflection films each having a plurality of projections on respective outer sides of the pair of light-transmitting substrates, and a protective layer having a lower refractive index than the plurality of projections between the plurality of projections, in which an angle made by a base and a slope of each projection is equal to or greater than 84° and less than 90°.

Each projection may have a conical shape, a needle-like shape, a shape of a cone with its apex cut off by a plane parallel to its base, a dome shape with a rounded top, or the like. The anti-reflection film can be formed of not a material with a uniform refractive index but a material of which a refractive index changes from a surface to a display screen side. For example, in each of the plurality of projections, a portion closer to the surface is formed of a material having a refractive index equivalent to air to reduce reflection, by the projection surface, of external light which is incident on each projection through air. On the other hand, a portion closer to the substrate on the display screen side is formed of a material having a refractive index equivalent to that of the substrate to further reduce reflection, by an interface between each projection and the substrate, of external light which propagates inside each projection and is incident on the substrate.

When a glass substrate is used as the substrate, since the refractive index of air is smaller than that of a glass substrate, each projection may have such a structure in which a portion closer to a surface (an apical portion in a case of a cone) is formed of a material having a lower refractive index, and a portion closer to a base of each projection is formed of a material having a higher refractive index, so that the refractive index increases from the apical portion to the base of the cone. When glass is used for the substrate, each projection can be formed of a film including fluoride, oxide, or nitride.

The display device including the anti-reflective film of the present invention includes a plurality of projections on its surface. External light is reflected to not a viewer side but another adjacent projection because the interface of each projection is not flat. Alternatively, external light propagates between the projections. Incident external light is partly transmitted through each projection, and reflected light is then incident on an adjacent projection. In this manner, external light reflected by interface of a projection repeats incidence between adjacent projections.

In other words, the number of times of incidence of external light entering the display device on the anti-reflection film is increased; therefore, the amount of external light transmitted through the anti-reflection film is increased. Thus, the amount of external light reflected to a viewer side is reduced, and the cause of a reduction in visibility such as reflection can be eliminated.

Furthermore, since the protective layer is formed between the projections in the present invention, the entry of a contaminant such as dust into between the projections can be prevented. Therefore, a decrease of an anti-reflection function due to entry of dust or the like can be prevented, and physical strength as the anti-reflection film can be increased by filling a space between the projections. Accordingly, reliability can be improved.

The present invention can provide a high-visibility and high-reliability display device having an anti-reflection function that can further reduce reflection of external light by providing the anti-reflection film having a plurality of projections on its surface and a protective layer between the projections. Accordingly, a more high-quality and high-performance display device can be manufactured.

BRIEF DESCRIPTION OF DRAWINGS

FIGS. 2A to 2C are conceptual diagrams of the present invention.

FIGS. 8A and 8B are a top view and a cross-sectional view showing a display device of the present invention, respectively.

FIGS. 9A and 9B are a top view and a cross-sectional view showing a display device of the present invention, respectively.

FIGS. 20A and 20B are diagrams each showing an electronic device of the present invention.

BEST MODE FOR CARRYING OUT THE INVENTION

Figure 1A:
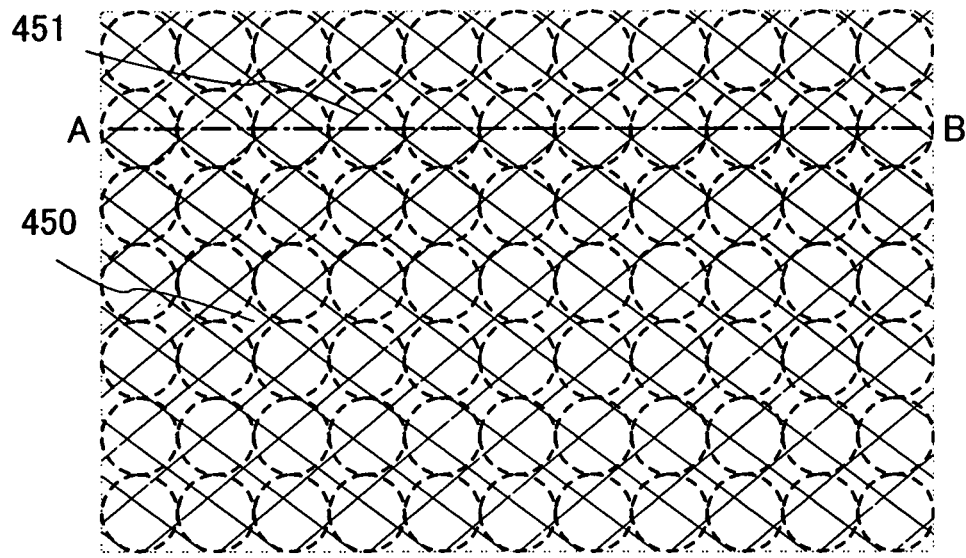
FIGS. 1A to 1C are conceptual diagrams of the present invention.

Hereinafter, embodiment modes and embodiments of the present invention will be described with reference to the accompanying drawings. However, it is easily understood by a person skilled in the art that the present invention can be carried out in many different modes, and the mode and the detail of the present invention can be variously changed without departing from the spirit and the scope thereof. Therefore, the present invention is not interpreted as being limited to the description of the following embodiment modes and embodiments. Note that the same reference numeral may be used to denote the same portions or portions having similar functions in different diagrams for explaining the structure of the embodiment modes with reference to drawings, and repetitive explanation thereof is omitted.

Embodiment Mode 1

This embodiment mode describes an example of a display device having an anti-reflection function that can further reduce reflection of external light, for the purpose of providing excellent visibility.

A feature of the present invention is to use an anti-reflection film having a plurality of projections over a display screen surface of a display device as an anti-reflection film having an anti-reflection function that prevents reflection of external light. Each projection of the anti-reflection film of the present invention preferably has a conical shape, and an angle made by a base and a lateral surface of each projection is preferably equal to or greater than 84° and less than 90°.

Figure 1B:
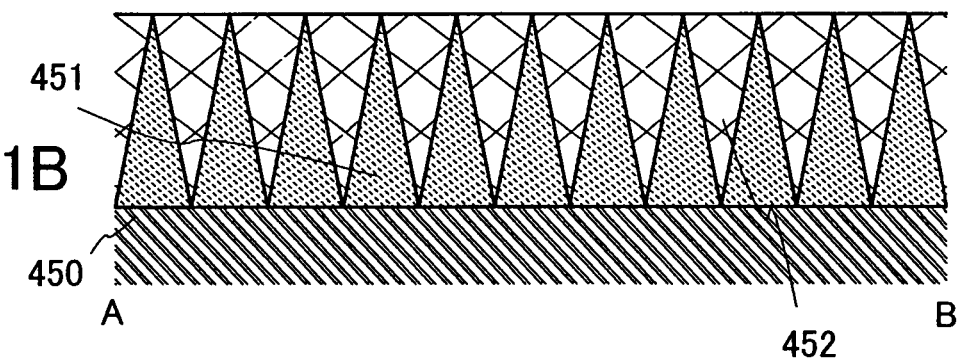
Figure 1C:
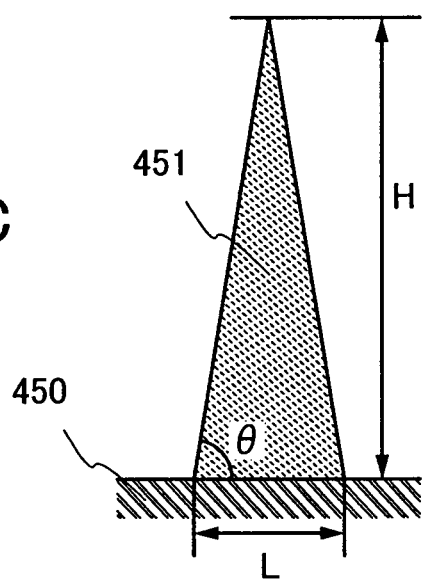

FIG. 1A shows a top view and FIGS. 1B and 1C show cross-sectional views of the anti-reflection film of the present invention. In FIGS. 1A to 1C, a plurality of projections 451 and a protective layer 452 are provided over a display screen surface of a display device 450. FIG. 1A is a top view of the display device of this embodiment mode, and FIG. 1B is a cross-sectional view of FIG. 1A taken along a line A-B. FIG. 1C is an enlarged view of FIG. 1B. As shown in FIGS. 1A and 1B, the projections 451 are provided adjacent to each other over a display screen.

As shown in FIG. 1C, in the anti-reflection film of the present invention, a ratio of a base diameter L of and a height H of each projection 451 is 1:5 or more (1:29 or less), preferably 1:10, and the height H is preferably 1 μm to 3 μm. When each of the projections 451 is of this size, light transmittance is not decreased, and processing is relatively easy.

In each projection of the present invention, an angle θ made by a base and a slope of each projection that is a protrusion is preferably equal to or greater than 84° and less than 90° as shown in FIG. 1C. When each projection has the above-mentioned angle, external light repeats reflection by and transmission through the plurality of projections. Therefore, the transmittance of external light through the projections can be increased, and the reflectance to a viewer side can be decreased.

Since the projections are provided over the display screen surface of the display device 450, the base of each projection and the display screen surface of the display device 450 are parallel to each other. Thus, an angle made by the slope of each projection and the display screen surface is also preferably equal to or greater than 84° and less than 90° similarly.

Instead of a conical shape, each projection may have a needle-like shape, a shape of a cone with its apex cut off by a plane parallel to its base, a dome shape with a rounded top, or the like. FIGS. 2A to 2C show examples of shape of each projection. FIG. 2A shows a shape having an upper base and a lower base, not a shape with a pointed top like a cone. Therefore, a cross-section on a plane perpendicular to the lower base is trapezoidal. In a projection 461 provided over a display device 460 as in FIG. 2A, a distance between the lower base and the upper base is referred to as a height H in the present invention.

FIG. 2B shows an example in which a projection 471 with a rounded top is provided over a display device 470. In this manner, each projection may have a shape with a rounded top and a curvature. In this case, the height H of each projection corresponds to a distance between the base and the highest point of the apical portion.

FIG. 2C shows an example in which a projection 481 having a plurality of angles, θ1 and θ2, is provided over a display device 480. In this manner, each projection may have a shape of a stack of a cylindrical shape and a conical shape. In this case, angles made by lateral surfaces and bases are different as indicated by θ1 and θ2. In the case of the projection 481 in FIG. 2C, θ1 is preferably equal to or greater than 84° and less than 90°, and the height H of each projection corresponds to the height of the conical shape with an oblique lateral surface.

Figure 3A:
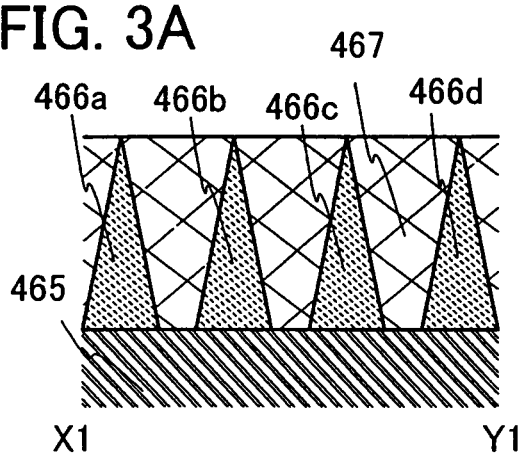
FIGS. 3A to 3F are conceptual diagrams of the present invention.
Figure 3D:
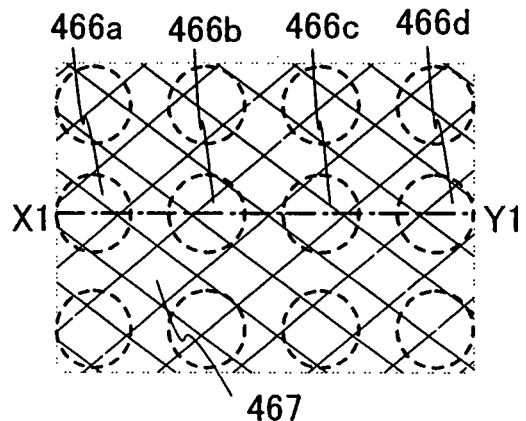
Figure 3B:
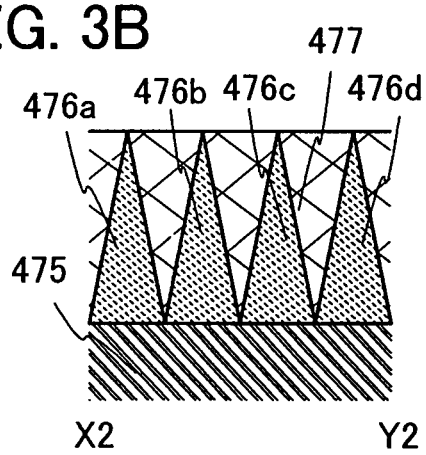
Figure 3E:
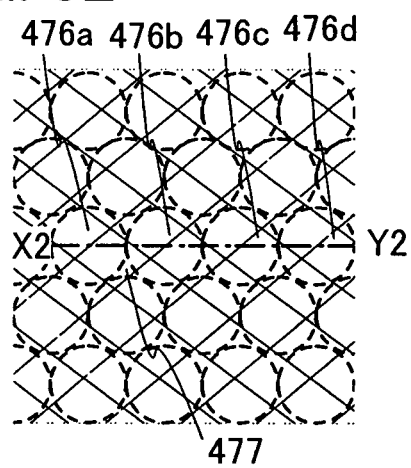
Figure 3C:
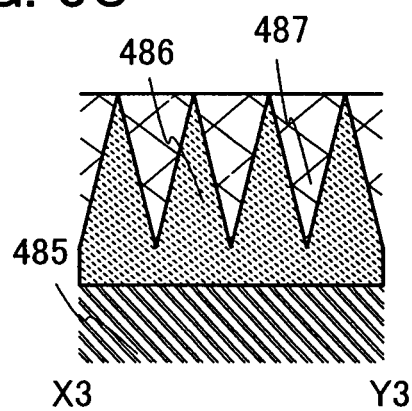
Figure 3F:
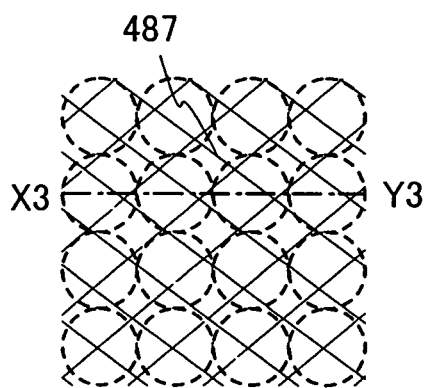

FIGS. 3A to 3F show examples of shape of the anti-reflection film having a plurality of projections. FIGS. 3A, 3B, and 3C separately show examples in which the plurality of projections are differently provided over a display screen surface. FIGS. 3D, 3E, and 3F are top views. FIG. 3A is a cross-sectional view of FIG. 3D along a line X1-Y1; FIG. 3B is a cross-sectional view of FIG. 3E along a line X2-Y2; and FIG. 3C is a cross-sectional view of FIG. 3F along a line X3-Y3.

FIGS. 3A and 3D show an example in which a plurality of projections 466a to 466d are adjacent to each other at regular intervals over a display screen of a display device 465 and a protective layer 467 is provided between the projections 466a to 466d. In this manner, projections do not necessarily need to be in contact with each other over a display screen. In the present invention, projections provided with intervals as described above are also called an anti-reflection film as a generic term for a portion having an anti-reflection function. Thus, even when projections are physically discontinuous and are not in a film shape, they are referred to as an anti-reflection film.

FIGS. 3B and 3E show an example in which a plurality of projections 476a to 476d are closely adjacent to and in contact with each other over a display screen of a display device 475 and a protective layer 477 is provided between the projections 476a to 476d. As shown in FIGS. 3B and 3E, the plurality of projections are provided in contact with each other so as to cover the display screen. When a display screen surface is covered with conical projections as much as possible in the above manner, there is an effect of an increase in the amount of light which is incident on the anti-reflection film.

FIGS. 3C and 3F show an example in which an anti-reflection film 486 with a plurality of projections is provided over a display screen of a display device 485 and a protective layer 487 is provided to fill a space between the projections. As shown in FIGS. 3C and 3F, the plurality of projections of the anti-reflection film may be a single continuous film, and the plurality of projections may be provided on a surface of the anti-reflection film. In this manner, the anti-reflection film of the present invention can have various shapes each having a plurality of projections.

Figure 37A:
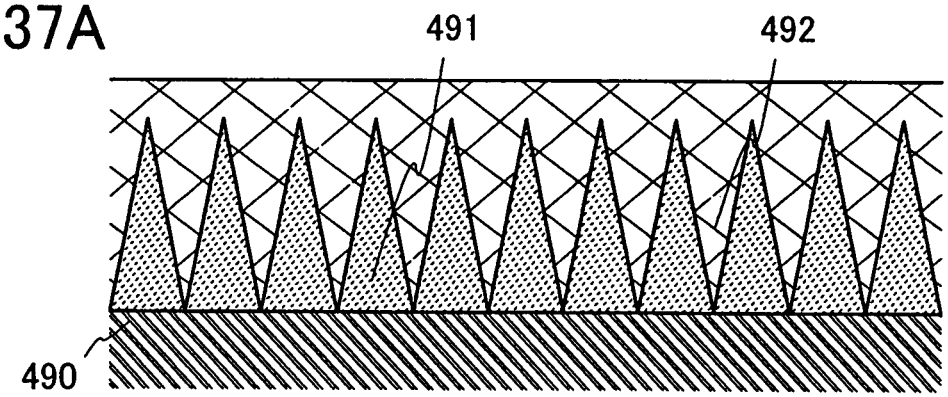
FIGS. 37A to 37D are cross-sectional views each showing a display device of the present invention.
Figure 37B:
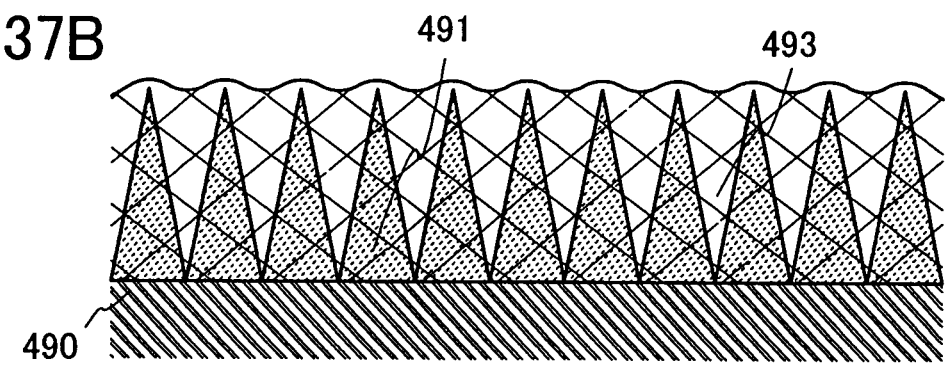

In the present invention, the protective layer has no limitation on its shape as long as it is provided between the projections. FIGS. 37A to 37D show examples of shape of the protective layer provided over the anti-reflection film having projections. The thickness of the protective layer provided to fill a space between the projections of the anti-reflection film may be equivalent to the height of each projection, or may be larger than the height of each projection to cover the projections as shown in FIGS. 37A and 37B. In this case, surface unevenness of the anti-reflection film due to the projections is reduced and planarized by the protective layer. FIG. 37A shows an example in which surface unevenness due to projections 491 provided on a surface of a display device 490 is planarized by providing a protective layer 492 to completely cover the projections 491.

FIG. 37B shows an example in which surface unevenness due to the projections 491 provided over the surface of the display device 490 is almost planarized by providing a protective layer 493 to completely cover the projections 491 while reflecting the uneven shape due to the projections 491 to some extent.

Figure 37C:
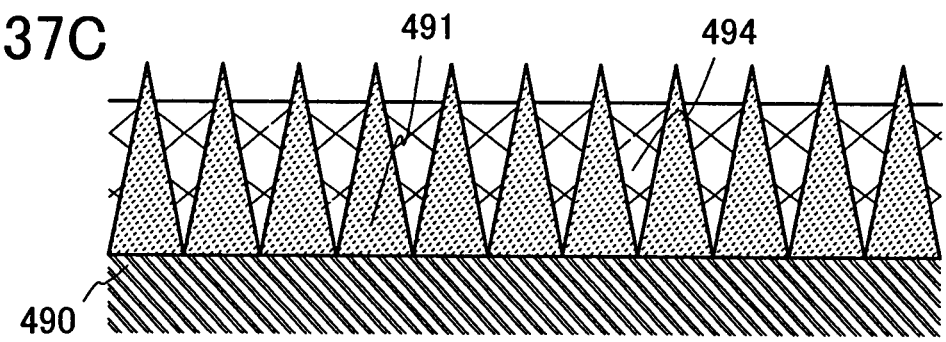

Alternatively, the thickness of the protective layer may be smaller than the height of each projection, and in this case, a portion of each projection closer to the base is selectively covered and a portion of each projection closer to the apex is exposed on the surface. FIG. 37C shows a structure in which a protective layer 494 selectively covers the projections 491 provided over the surface of the display device 490 so as to fill a space between the projections 491, and each apical portion of the projections 491 is exposed on the surface. With such a structure in which the projections 491 are exposed on the surface, external light is directly incident on the projections 491 without passing through the protective layer. Accordingly, an anti-reflection function can be enhanced.

Figure 37D:
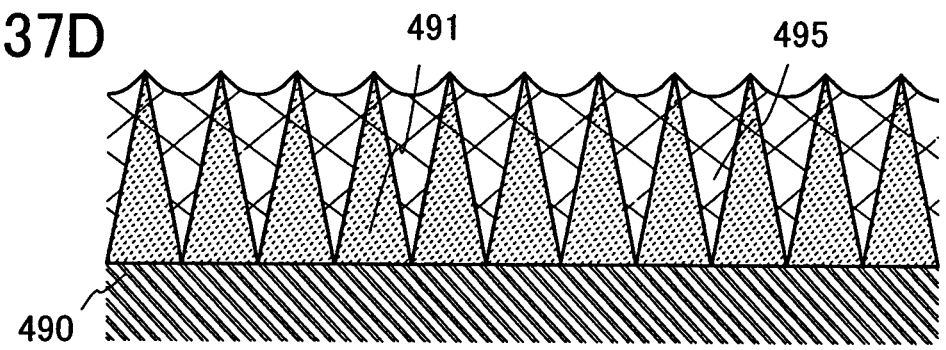

Depending on a formation method of the protective layer, a protective layer 495 formed between the projections 491 over the display device 490 may have a shape in which the thickness is decreased like a depression between the projections, as shown in FIG. 37D.

It is acceptable as long as the protective layer is formed using a material having a lower refractive index than at least a material used for the projections of the anti-reflection film. Accordingly, the material used for the protective layer can be appropriately determined because it is determined relative to materials of a substrate forming a display screen of the display device and an anti-reflection film having projections formed over the substrate.

The projections can further reduce reflection of external light due to their shapes. However, when there is a foreign substance such as dirt or dust in air between the projections, the foreign substance causes reflection of external light and accordingly, there is a case where a sufficient anti-reflection effect for external light cannot be obtained. Since the protective layer is formed between the projections in the present invention, the entry of a contaminant such as dust into between the projections can be prevented. Therefore, a decrease in anti-reflection function due to entry of dust or the like can be prevented, and physical strength as the anti-reflection film can be increased by filling a space between the projections. Accordingly, reliability can be improved.

Since the protective layer filling a space between the projections is formed using a material having a lower refractive index than a material used for the projections, it has a smaller difference in refractive index with air than the material used for each projection. Interfacial reflection can be further suppressed.

The anti-reflection film and the protective layer can be formed of not a material with a uniform refractive index but a material of which a refractive index changes from a surface to a display screen side. For example, in each of the plurality of projections, a portion closer to the surface is formed of a material having a refractive index equivalent to air to reduce reflection, by the projection surface, of external light which is incident on each projection through air. On the other hand, a portion closer to the substrate on the display screen side is formed of a material having a refractive index equivalent to that of the substrate to further reduce reflection, by an interface between each projection and the substrate, of external light which propagates inside each projection and is incident on the substrate. When a glass substrate is used as the substrate, since the refractive index of air is smaller than that of a glass substrate, each projection may have such a structure in which a portion closer to a surface (an apical portion in a case of a cone) is formed of a material having a low refractive index, and a portion closer to a base of each projection is formed of a material having a higher refractive index, so that the refractive index increases from the apical portion to the base of the cone.

A material used for forming the anti-reflection film may be appropriately selected in accordance with a material of the substrate forming a display screen surface, such as silicon, nitrogen, fluorine, oxide, nitride, or fluoride. The oxide may be silicon oxide ($SiO_2$), boric oxide ($B_2O_3$), sodium oxide ($NaO_2$), magnesium oxide (MgO), aluminum oxide (alumina) ($Al_2O_3$), potassium oxide ($K_2O$), calcium oxide (CaO), diarsenic trioxide (arsenious oxide) ($As_2O_3$), strontium oxide (SrO), antimony oxide ($Sb_2O_3$), barium oxide (BaO), indium tin oxide (ITO), zinc oxide (ZnO), indium zinc oxide (IZO) in which indium oxide is mixed with zinc oxide (ZnO), a conductive material in which indium oxide is mixed with silicon oxide ($SiO_2$), organic indium, organic tin, indium oxide containing tungsten oxide, indium zinc oxide containing tungsten oxide, indium oxide containing titanium oxide, indium tin oxide containing titanium oxide, or the like. The nitride may be aluminum nitride (AlN), silicon nitride (SiN), or the like. The fluoride may be lithium fluoride (LiF), sodium fluoride (NaF), magnesium fluoride ($MgF_2$), calcium fluoride ($CaF_2$), lanthanum fluoride ($LaF_3$), or the like. The anti-reflection film may include one or more kinds of the above-mentioned silicon, nitrogen, fluorine, oxide, nitride, and fluoride. A mixing ratio thereof may be appropriately set in accordance with a ratio of components (a composition ratio) of the substrate.

The anti-reflection film having a plurality of projections can be formed by forming a thin film by a sputtering method, a vacuum evaporation method, a PVD (Physical Vapor Deposition) method, or a CVD (Chemical Vapor Deposition) method such as a low-pressure CVD (LPCVD) method or a plasma CVD method and then etching the thin film into a desired shape. Alternatively, a droplet discharge method by which a pattern can be formed selectively, a printing method by which a pattern can be transferred or drawn (a method for forming a pattern such as screen printing or offset printing), a coating method such as a spin coating method, a dipping method, a dispenser method, or the like can be employed. Still alternatively, an imprinting technique or a nanoimprinting technique with which a nanoscale three-dimensional structure can be formed by a transfer technology can be employed. Imprinting and nanoimprinting are techniques with which a minute three-dimensional structure can be formed without using a photolithography process.

The protective layer can be formed using a material for forming the anti-reflection film, or the like. As a material having a lower refractive index, aerogel including silica, alumina, and carbon, or the like can be used. A manufacturing method thereof is preferably a wet process, and a droplet discharge method by which a pattern can be formed selectively, a printing method by which a pattern can be transferred or drawn (a method for forming a pattern such as screen printing or offset printing), a coating method such as a spin coating method, a dipping method, a dispenser method, or the like can be employed.

Figure 25:
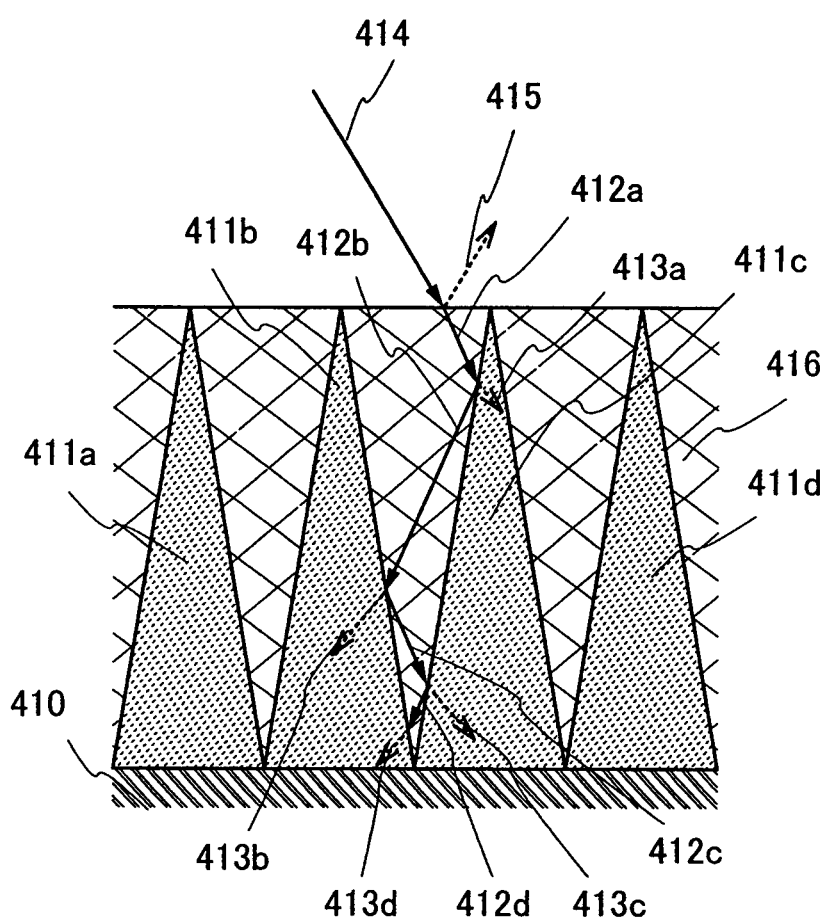
FIG. 25 is a conceptual diagram of the present invention.

An anti-reflection function of the anti-reflection film having a plurality of projections of the present invention is described with reference to FIG. 25. FIG. 25 shows an anti-reflection film having adjacent projections 411a, 411b, 411c, and 411d and a protective layer 416 over a display screen 410. External light 414 is partly reflected as reflected light 415 at an interface between an air and the protective layer 416, but transmitted light 412a is incident on the projection 411c. A part of the transmitted light 412a is transmitted as transmitted light 413a, and the other part is reflected at an interface between the protective layer 416 and the projection 411c as reflected light 412b. The reflected light 412b is then incident on the adjacent projection 411b. A part of the reflected light 412b is transmitted as transmitted light 413b, and the other part is reflected at an interface between the protective layer 416 and the projection 411b as reflected light 412c. The reflected light 412c is incident again on the adjacent projection 411c. A part of the reflected light 412c is transmitted as transmitted light 413c, and the other part is reflected at the interface between the protective layer 416 and the projection 411c as reflected light 412d. The reflected light 412d is also incident again on the adjacent projection 411b, and a part of the reflected light 412d is transmitted as transmitted light 413d.

In this manner, the display device including the anti-reflection film of the present invention includes a plurality of projections on its surface. External light is reflected to not a viewer side but another adjacent projection because the interface of each projection is not flat. Alternatively, external light propagates between the projections. Incident external light is partly transmitted through each projection, and reflected light is then incident on an adjacent projection. In this manner, external light reflected by interface of a projection repeats incidence between adjacent projections.

In other words, the number of times of incidence of external light entering the display device on the anti-reflection film is increased; therefore, the amount of external light transmitted through the anti-reflection film is increased. Thus, the amount of external light reflected to a viewer side is reduced, and the cause of a reduction in visibility such as reflection can be eliminated.

Furthermore, since the protective layer is formed between the projections in the present invention, the entry of a contaminant such as dust into between the projections can be prevented. Therefore, a decrease of an anti-reflection function due to entry of dust or the like can be prevented, and physical strength as the anti-reflection film can be increased by filling a space between the projections. Accordingly, reliability can be improved.

The present invention can provide a high-visibility display device having a high anti-reflection function that can further reduce reflection of external light by providing the anti-reflection film having a plurality of projections on its surface and the protective layer between the projections. Accordingly, a more high-quality and high-performance display device can be manufactured.

Embodiment Mode 2

This embodiment mode describes an example of a display device having an anti-reflection function that can further reduce reflection of external light, for the purpose of providing excellent visibility. Specifically, this embodiment mode describes a case of a display device having a passive-matrix structure.

Figure 5A:
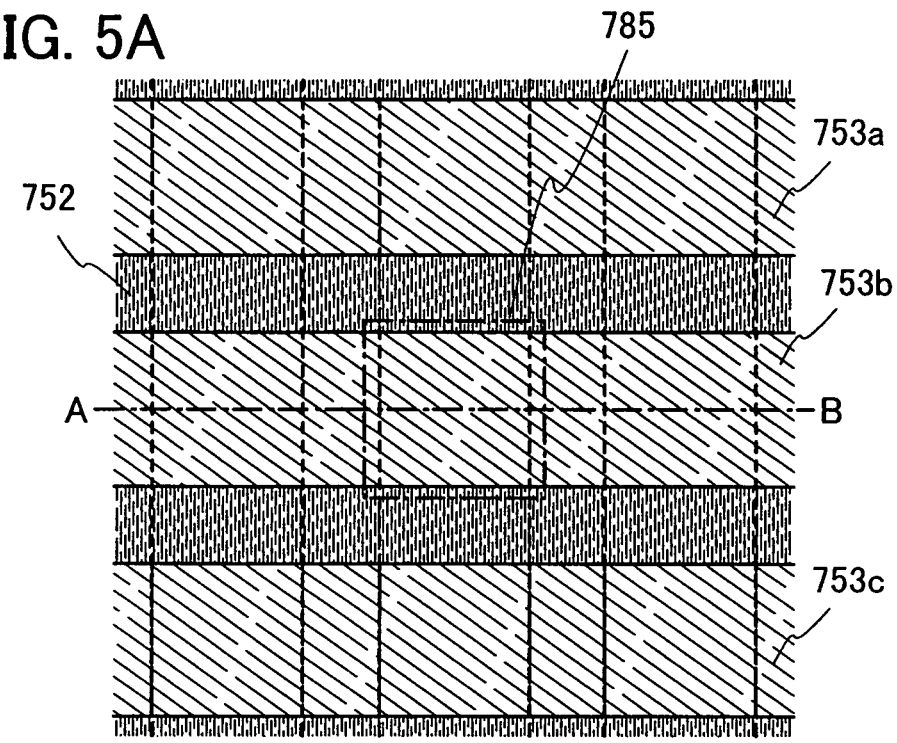
FIG. 5A is a top view and FIGS. 5B and 5C are cross-sectional views showing a display device of the present invention.
Figure 5B:
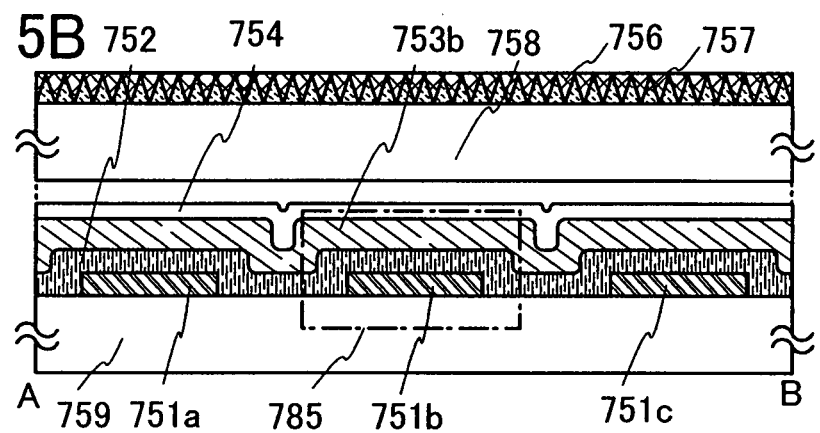

The display device includes a first electrode layer 751a, a first electrode layer 751b, and a first electrode layer 751c which extend in a first direction; an electroluminescent layer 752 which is provided to cover the first electrode layer 751a, the first electrode layer 751b, and the first electrode layer 751c; and a second electrode layer 753a, a second electrode layer 753b, and a second electrode layer 753c which extend in a second direction perpendicular to the first direction (see FIGS. 5A and 5B). The electroluminescent layer 752 is provided between the first electrode layer 751a, the first electrode layer 751b, and the first electrode layer 751c and the second electrode layer 753a, the second electrode layer 753b, and the second electrode layer 753c. In addition, an insulating layer 754 functioning as a protective film is provided to cover the second electrode layer 753a, the second electrode layer 753b, and the second electrode layer 753c (see FIGS. 5A and 5B). Note that when there is concern about the influence of a transverse electric field between each adjacent light emitting element, the electroluminescent layer 752 provided in each light emitting element may be separated.

Figure 5C:
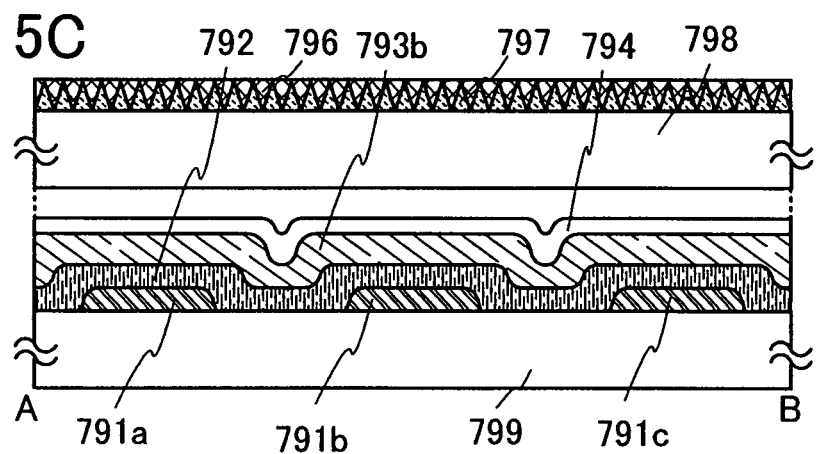

FIG. 5C shows a variation on FIG. 5B, in which a first electrode layer 791*a*, a first electrode layer 791*b*, a first electrode layer 791*c*, an electroluminescent layer 792, a second electrode layer 793*b*, and an insulating layer 794 that is a protective layer are provided. Like the first electrode layer 791*a*, the first electrode layer 791*b*, and the first electrode layer 791*c* in FIG. 5C, the first electrode layer may have a tapered shape, in which a radius of curvature changes continuously. A shape like the first electrode layer 791*a*, the first electrode layer 791*b*, and the first electrode layer 791*c* can be formed by a droplet discharge method or the like. When the first electrode layer has such a curved surface with a curvature, the coverage thereof by an insulating layer or a conductive layer stacked is favorable.

In addition, a partition (insulating layer) may be formed to cover an end portion of the first electrode layer. The partition (insulating layer) functions like a wall which separates between light emitting elements. Each of FIGS. 6A and 6B shows a structure in which an end portion of the first electrode layer is covered with a partition (insulating layer).

Figure 6A:
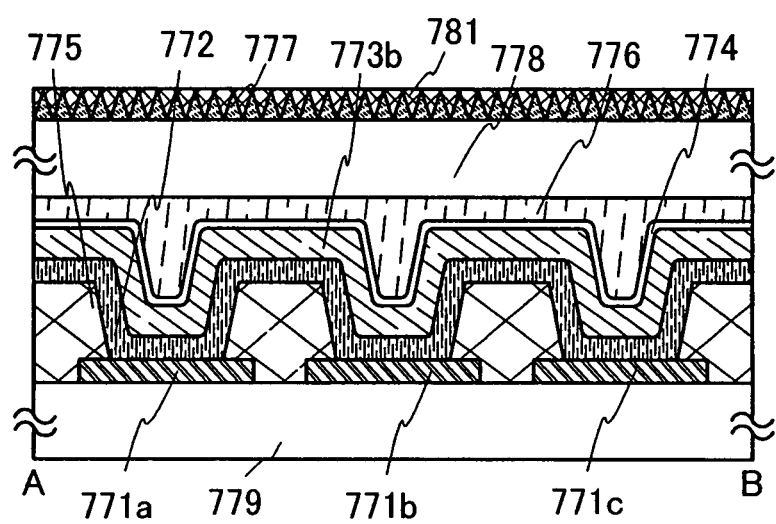
FIGS. 6A and 6B are cross-sectional views showing a display device of the present invention.

In one example of a light emitting element shown in FIG. 6A, a partition (insulating layer) 775 is formed to have a tapered shape to cover end portions of a first electrode layer 771*a*, a first electrode layer 771*b*, and a first electrode layer 771*c*. The partition (insulating layer) 775 is formed over the first electrode layer 771*a*, the first electrode layer 771*b*, and the first electrode layer 771*c* which are provided in contact with a substrate 779, and an electroluminescent layer 772, a second electrode layer 773*b*, an insulating layer 774, an insulating layer 776 and a substrate 778 are provided.

Figure 6B:
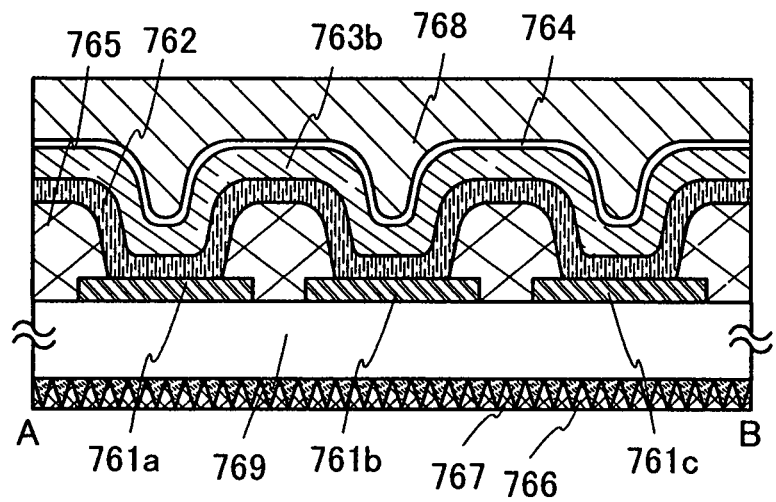

In one example of a light emitting element shown in FIG. 6B, a partition (insulating layer) 765 has a shape having a curvature, in which a curvature radius changes continuously. A first electrode layer 761*a*, a first electrode layer 761*b*, a first electrode layer 761*c*, an electroluminescent layer 762, a second electrode layer 763*b*, an insulating layer 764, and a insulating layer 768 are provided.

Figure 4:
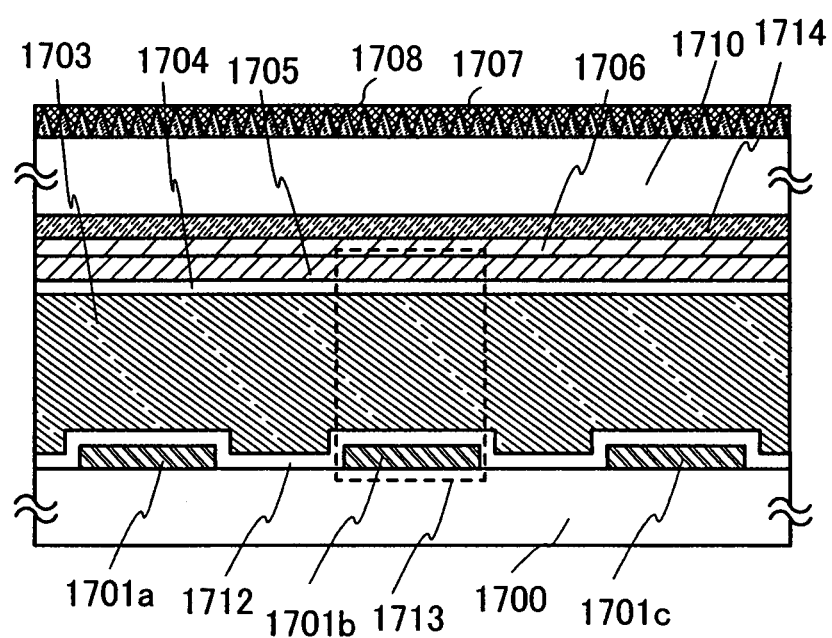
FIG. 4 is a cross-sectional view showing a display device of the present invention.

FIG. 4 shows a passive-matrix liquid crystal display device to which the present invention is applied. In FIG. 4, a substrate 1700 provided with first pixel electrode layers 1701*a*, 1701*b*, and 1701*c*, and an insulating layer 1712 functioning as an orientation film faces a substrate 1710 provided with an insulating layer 1704 functioning as an orientation film, an opposite electrode layer 1705, a colored layer 1706 functioning as a color filter, and a polarizing plate 1714, with a liquid crystal layer 1703 interposed therebetween.

A feature of the present invention is to use an anti-reflection film having a plurality of projections over a display screen surface of a display device as an anti-reflection film having an anti-reflection function that prevents reflection of external light. Each projection of the anti-reflection film of the present invention preferably has a conical shape, and an angle made by a base and a lateral surface of each projection is preferably equal to or greater than 84° and less than 90°. In this embodiment mode, surfaces of the substrates 778 and 1710 and substrates 758, 798, and 769, on a viewer side of a display screen are provided with anti-reflection films 777, 1707, 757, 797, and 767, respectively. Protective layers 781, 1708, 756, 796, and 766 are formed to fill a space between the projections of the anti-reflection films 777, 1707, 757, 797, and 767, respectively. Each of the anti-reflection films 777, 1707, 757, 797, and 767 is an anti-reflection film having a plurality of projections, and each projection has a conical shape in this embodiment mode.

Instead of a conical shape, each projection may have a needle-like shape, a shape of a cone with its apex cut off by a plane parallel to its base, a dome shape with a rounded top, or the like. The anti-reflection film can be formed of not a material with a uniform refractive index but a material of which a refractive index changes from a surface to a display screen side. For example, in each of the plurality of projections, a portion closer to the surface is formed of a material having a refractive index equivalent to air to further reduce reflection, by the projection surface, of external light which is incident on each projection through air. On the other hand, a portion closer to the substrate on the display screen side is formed of a material having a refractive index equivalent to that of the substrate to reduce reflection, by an interface between each projection and the substrate, of external light which propagates inside each projection and is incident on the substrate. When a glass substrate is used as the substrate, since the refractive index of air is smaller than that of a glass substrate, each projection may have such a structure in which a portion closer to a surface (an apical portion in a case of a cone) is formed of a material having a lower refractive index, and a portion closer to a base of each projection is formed of a material having a higher refractive index, so that the refractive index increases from the apical portion to the base of the cone.

A material used for forming the anti-reflection film may be appropriately selected in accordance with a material of the substrate forming a display screen surface, such as silicon, nitrogen, fluorine, oxide, nitride, or fluoride. The oxide may be silicon oxide ($SiO_2$), boric oxide ($B_2O_3$), sodium oxide ($NaO_2$), magnesium oxide (MgO), aluminum oxide (alumina) ($Al_2O_3$), potassium oxide ($K_2O$), calcium oxide (CaO), diarsenic trioxide (arsenious oxide) ($As_2O_3$), strontium oxide (SrO), antimony oxide ($Sb_2O_3$), barium oxide (BaO), indium tin oxide (ITO), zinc oxide (ZnO), indium zinc oxide (IZO) in which indium oxide is mixed with zinc oxide (ZnO), a conductive material in which indium oxide is mixed with silicon oxide ($SiO_2$), organic indium, organic tin, indium oxide containing tungsten oxide, indium zinc oxide containing tungsten oxide, indium oxide containing titanium oxide, indium tin oxide containing titanium oxide, or the like. The nitride may be aluminum nitride (AlN), silicon nitride (SiN), or the like. The fluoride may be lithium fluoride (LiF), sodium fluoride (NaF), magnesium fluoride ($MgF_2$), calcium fluoride ($CaF_2$), lanthanum fluoride ($LaF_3$), or the like. The anti-reflection film may include one or more kinds of the above-mentioned silicon, nitrogen, fluorine, oxide, nitride, and fluoride. A mixing ratio thereof may be appropriately set in accordance with a ratio of components (a composition ratio) of the substrate.

The anti-reflection film having a plurality of projections can be formed by forming a thin film by a sputtering method, a vacuum evaporation method, a PVD (Physical Vapor Deposition) method, or a CVD (Chemical Vapor Deposition) method such as a low-pressure CVD (LPCVD) method or a plasma CVD method and then etching the thin film into a desired shape. Alternatively, a droplet discharge method by which a pattern can be formed selectively, a printing method by which a pattern can be transferred or drawn (a method for forming a pattern such as screen printing or offset printing), a coating method such as a spin coating method, a dipping method, a dispenser method, or the like can be employed. Still alternatively, an imprinting technique or a nanoimprinting technique with which a nanoscale three-dimensional structure can be formed by a transfer technology can be employed. Imprinting and nanoimprinting are techniques with which a minute three-dimensional structure can be formed without using a photolithography process.

The display device including the anti-reflection film of this embodiment mode includes a plurality of projections on its surface. External light is reflected to not a viewer side but another adjacent projection because the interface of each projection is not flat. Alternatively, external light propagates between the projections. Incident external light is partly transmitted through each projection, and reflected light is then incident on an adjacent projection. In this manner, external light reflected by interface of a projection repeats incidence between adjacent projections.

The display device including the anti-reflection film of the present invention includes a plurality of projections on its surface. External light is reflected to not a viewer side but another adjacent projection because the interface of each projection is not flat. Alternatively, external light propagates between the projections. Incident external light is partly transmitted through each projection, and reflected light is then incident on an adjacent projection. In this manner, external light reflected by interface of a projection repeats incidence between adjacent projections.

In other words, the number of times of incidence of external light entering the display device on the anti-reflection film is increased; therefore, the amount of external light transmitted through the anti-reflection film is increased. Thus, the amount of external light reflected to a viewer side is reduced, and the cause of a reduction in visibility such as reflection can be eliminated.

Furthermore, since the protective layer is formed between the projections in the present invention, the entry of a contaminant such as dust into between the projections can be prevented. Therefore, a decrease of an anti-reflection function due to entry of dust or the like can be prevented, and physical strength as the anti-reflection film can be increased by filling a space between the projections. Accordingly, reliability can be improved.

A glass substrate, a quartz substrate, or the like can be used as each of the substrates 758, 769, 778, 798, 1700, and 1710 and substrates 759, 779, and 799. A flexible substrate may alternatively be used. The flexible substrate refers to a substrate which can be curved, and an example thereof is a plastic substrate made of polycarbonate, polyarylate, polyethersulfone, or the like. Alternatively, a film (made of polypropylene, polyester, vinyl, polyvinyl fluoride, vinyl chloride, polyamide, or the like), an inorganic film formed by evaporation, or the like can be used.

The partition (insulating layer) 765 and the partition (insulating layer) 775 may be formed using an inorganic insulating material such as silicon oxide, silicon nitride, silicon oxynitride, aluminum oxide, aluminum nitride, or aluminum oxynitride; an acrylic acid, a methacrylic acid, or a derivative thereof; a heat-resistant high molecular compound such as polyimide, aromatic polyamide, or polybenzimidazole; or a siloxane resin. Alternatively, a resin material such as a vinyl resin like polyvinyl alcohol or polyvinylbutyral, an epoxy resin, a phenol resin, a novolac resin, an acrylic resin, a melamine resin, or a urethane resin may be used. Further, an organic material such as benzocyclobutene, parylene, fluorinated arylene ether, or polyimide, a composition material containing a water-soluble homopolymer and a water-soluble copolymer, or the like may be used. The partition (insulating layer) 765 and the partition (insulating layer) 775 can be formed by a vapor-phase growth method such as a plasma CVD method or a thermal CVD method, or a sputtering method. Alternatively, they can be formed by a droplet discharge method or a printing method (such as screen printing or offset printing by which a pattern is formed). A film obtained by a coating method, an SOG film, or the like can also be used.

After forming a conductive layer, an insulating layer, or the like by discharging a composition by a droplet discharge method, a surface thereof may be planarized by pressing with pressure to improve planarity. As a pressing method, unevenness may be reduced by moving a roller-shaped object over the surface, or the surface may be perpendicularly pressed with a flat plate-shaped object. A heating step may be performed at the time of pressing. Alternatively, surface unevenness may be eliminated with an air knife after softening or melting the surface with a solvent or the like. A CMP method may be alternatively used for polishing the surface. This step may be employed in planarizing the surface when unevenness is generated by a droplet discharge method.

The present invention can provide a high-visibility display device having a high anti-reflection function that can further reduce reflection of external light by providing the anti-reflection film having a plurality of projections on its surface. Accordingly, a more high-quality and high-performance display device can be manufactured.

This embodiment mode can be freely combined with Embodiment Mode 1.

Embodiment Mode 3

This embodiment mode describes an example of a display device having an anti-reflection function that can further reduce reflection of external light, for the purpose of providing excellent visibility. This embodiment mode describes a display device having a different structure from that of Embodiment Mode 2. Specifically, this embodiment mode describes a case where the display device has an active-matrix structure.

Figure 36A:
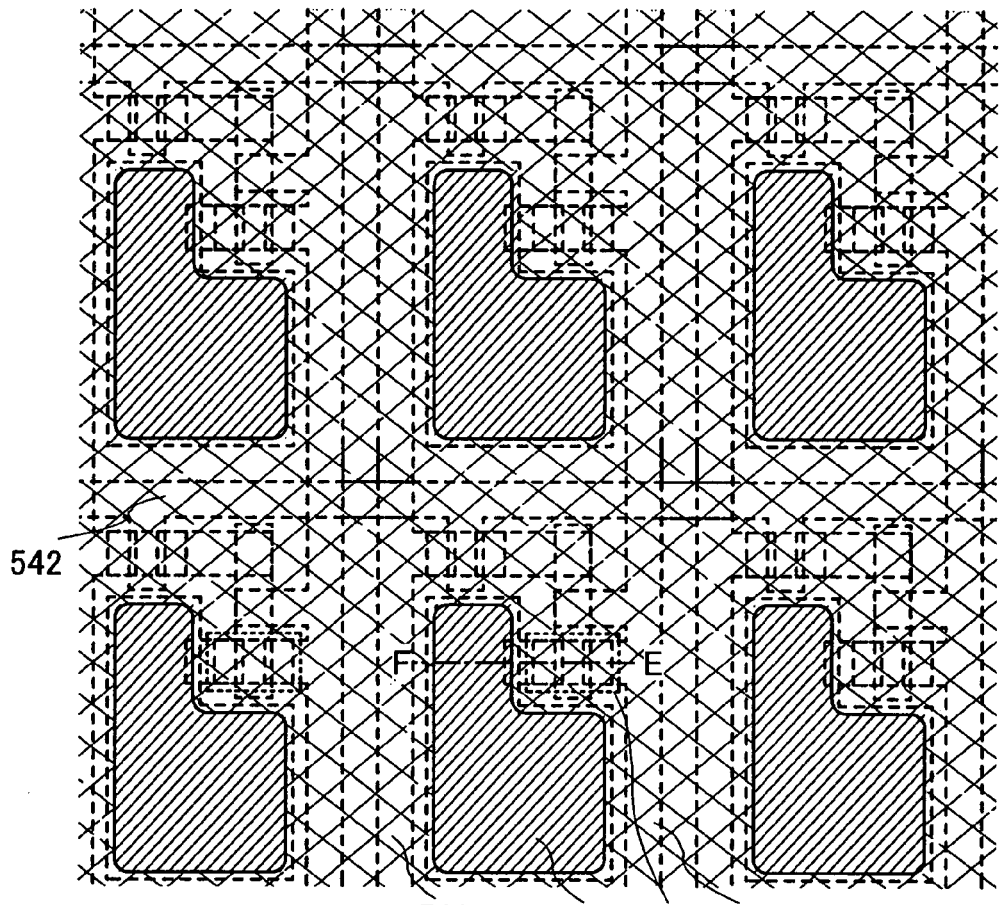
FIGS. 36A and 36B are a top view and a cross-sectional view showing a display device of the present invention, respectively.
Figure 36B:
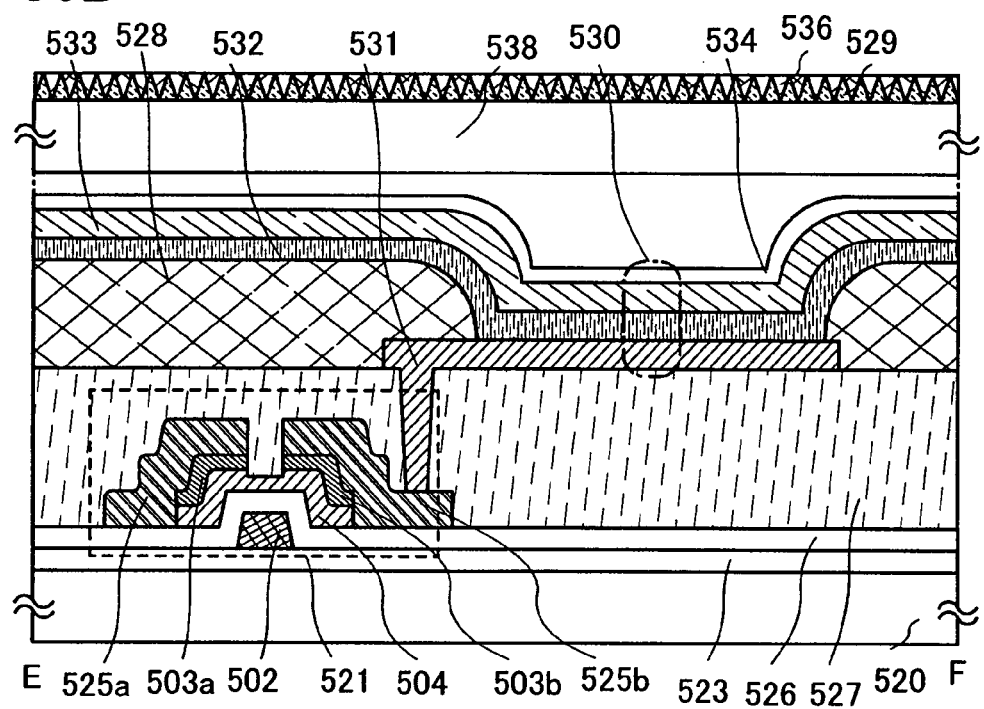

FIG. 36A shows a top view of the display device, and FIG. 36B shows a cross-sectional view of FIG. 36A taken along a line E-F. Although an electroluminescent layer 532, a second electrode layer 533, and an insulating layer 534 are omitted and not shown in FIG. 36A, each of them is provided as shown in FIG. 36B.

First wirings that extend in a first direction and second wirings that extend in a second direction perpendicular to the first direction are provided over a substrate 520 provided with an insulating layer 523 as a base film. One of the first wirings is connected to a source electrode or a drain electrode of a transistor 521, and one of the second wirings is connected to a gate electrode of the transistor 521. A first electrode layer 531 is connected to a wiring layer 525b that is the source electrode or the drain electrode of the transistor 521, which is not connected to the first wiring, and a light emitting element 530 is formed using a stacked structure of the first electrode layer 531, the electroluminescent layer 532, and the second electrode layer 533. A partition (insulating layer) 528 is provided between adjacent light emitting elements, and the electroluminescent layer 532 and the second electrode layer 533 are stacked over the first electrode layer and the partition (insulating layer) 528. An insulating layer 534 functioning as a protective layer and a substrate 538 functioning as a sealing substrate are provided over the second electrode layer 533. As the transistor 521, an inversed staggered thin film transistor is used (see FIGS. 36A and 36B). Light which is emitted from the light emitting element 530 is extracted from the substrate 538 side. Thus, a surface of the substrate 538 on a viewer side is provided with an anti-reflection film 529 with a plurality of projections of the present invention and a protective layer 536 filling a space between the projections of the anti-reflection film.

FIGS. 36A and 36B in this embodiment mode show an example in which the transistor 521 is a channel-etch inversed-staggered transistor. In FIGS. 36A and 36B, the transistor 521 includes a gate electrode layer 502, a gate insulating layer 526, a semiconductor layer 504, semiconductor layers 503a and 503b having one conductivity type, wiring layers 525a and 525b, one of which serves as a source electrode layer and the other as a drain electrode layer.

The semiconductor layer can be formed using the following material: an amorphous semiconductor (hereinafter also referred to as an "AS") manufactured by a vapor-phase growth method using a semiconductor material gas typified by silane or germane or a sputtering method; a polycrystalline semiconductor that is formed by crystallizing the amorphous semiconductor by utilizing light energy or thermal energy; a semiamorphous (also referred to as microcrystalline or microcrystal) semiconductor (hereinafter also referred to as a "SAS"); or the like.

The SAS is a semiconductor having an intermediate structure between an amorphous structure and a crystalline structure (including a single crystal and a polycrystal) and having a third state which is stable in terms of free energy, and includes a crystalline region having short-range order and lattice distortion. The SAS is formed by glow discharge decomposition (plasma CVD) of a gas containing silicon. $SiH_4$ is used as the gas containing silicon. Alternatively, $Si_2H_6$, $SiH_2Cl_2$, $SiHCl_3$, $SiCl_4$, $SiF_4$, or the like can be used. Further, $F_2$ or $GeF_4$ may be mixed. This gas containing silicon may be diluted with $H_2$, or $H_2$ and one or more rare gas elements of He, Ar, Kr, and Ne. By further promotion of lattice distortion by inclusion of a noble gas element such as helium, argon, krypton, or neon, a favorable SAS with its stability increased can be obtained. The semiconductor layer may be formed by stacking an SAS layer formed from a fluorine-based gas and an SAS layer formed from a hydrogen-based gas.

The amorphous semiconductor is typified by hydrogenated amorphous silicon, and the crystalline semiconductor is typified by polysilicon or the like. Polysilicon (polycrystalline silicon) includes so-called high-temperature polysilicon which contains polysilicon formed at a process temperature of 800° C. or higher as the main component, so-called low-temperature polysilicon which contains polysilicon formed at a process temperature of 600° C. or lower as the main component, and polysilicon crystallized by adding an element which promotes crystallization or the like. Naturally, as described above, a semiamorphous semiconductor, or a semiconductor which includes a crystalline phase in a portion of a semiconductor layer can be used.

In a case where a crystalline semiconductor layer is used as the semiconductor layer, the crystalline semiconductor layer may be manufactured by using a laser crystallization method, a thermal crystallization method, a thermal crystallization method using an element which promotes crystallization such as nickel, or the like. A microcrystalline semiconductor, which is a SAS, can be crystallized by laser light irradiation to improve crystallinity. In a case where the element which promotes crystallization is not introduced, hydrogen is released until a concentration of hydrogen contained in an amorphous silicon film becomes $1 \times 10^{20}$ atoms/cm$^3$ or less by heating the amorphous silicon layer at a temperature of 500° C. for one hour in a nitrogen atmosphere before irradiating the amorphous silicon layer with laser light. This is because the amorphous silicon layer containing much hydrogen is damaged when irradiated with laser light. The heat treatment for crystallization can be performed using a heating furnace, laser irradiation, irradiation with light emitted from a lamp (also referred to as lamp annealing), or the like. An example of a heating method is an RTA method such as a GRTA (Gas Rapid Thermal Annealing) method or an LRTA (Lamp Rapid Thermal Annealing) method. GRTA is a method for performing heat treatment using a high-temperature gas, and LRTA is a method for performing heat treatment by lamp light.

The crystallization may be performed by adding an element which promotes crystallization (also referred to as a catalyst element or a metal element) to the amorphous semiconductor layer and performing heat treatment (at 550° C. to 750° C. for 3 minutes to 24 hours) in a crystallization step in which an amorphous semiconductor layer is crystallized to form a crystalline semiconductor layer. As the element which promotes crystallization, one or more elements of iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

Any method can be used to introduce a metal element into the amorphous semiconductor layer as long as the method is capable of making the metal element exist on the surface of or inside of the amorphous semiconductor layer. For example, a sputtering method, a CVD method, a plasma treatment method (including a plasma CVD method), an adsorption method, or a method in which a metal salt solution is applied can be employed. Among them, the method using a solution is simple and easy, and advantageous in terms of easy concentration control of the metal element. It is preferable to form an oxide film by irradiation with UV light in an oxygen atmosphere, a thermal oxidation method, a treatment with ozone water or hydrogen peroxide including a hydroxyl radical, or the like in order to improve wettability of the surface of the amorphous semiconductor layer to spread an aqueous solution over the entire surface of the amorphous semiconductor layer.

In order to remove the element which promotes crystallization from the crystalline semiconductor layer or reduce the element, a semiconductor layer containing an impurity element is formed in contact with the crystalline semiconductor layer, which functions as a gettering sink. The impurity element may be an impurity element imparting n-type conductivity, an impurity element imparting p-type conductivity, a noble gas element, or the like. For example, one or more elements of phosphorus (P), nitrogen (N), arsenic (As), antimony (Sb), bismuth (Bi), boron (B), helium (He), neon (Ne), argon (Ar), krypton (Kr), and xenon (Xe) can be used. A semiconductor layer containing a noble gas element is formed in contact with the crystalline semiconductor layer containing the element which promotes crystallization, and heat treatment (at 550° C. to 750° C. for 3 minutes to 24 hours) is performed. The element which promotes crystallization in the crystalline semiconductor layer moves into the semiconductor layer containing a noble gas element; thus, the element which promotes crystallization in the crystalline semiconductor layer is removed or reduced. After that, the semiconductor layer containing a noble gas element, which serves as a gettering sink, is removed.

Laser irradiation can be performed by relatively moving a laser beam and the semiconductor layer. In laser irradiation, a marker can also be formed in order to overlap a beam with high accuracy or control a start position or an end position of laser irradiation. The marker may be formed over the substrate at the same time as the formation of the amorphous semiconductor film.

In a case of using laser irradiation, a continuous-wave laser beam (CW laser beam) or a pulsed laser beam can be used. An applicable laser beam is a beam emitted from one or more kinds of the following lasers: a gas laser such as an Ar laser, a Kr laser, or an excimer laser; a laser using, as a medium, single-crystalline YAG; $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$, to which one or more of Nd, Yb, Cr, Ti, Ho, Er, Tm, and Ta is added as a dopant; a glass laser; a ruby laser; an alexandrite laser; a Ti:sapphire laser; a copper vapor laser; and a gold vapor laser. A crystal having a large grain diameter can be obtained by irradiation with the fundamental wave of the above laser beam or the second harmonic to the fourth harmonic of the fundamental wave thereof. For example, the second harmonic (532 nm) or the third harmonic (355 nm) of a Nd:YVO$_4$ laser (the fundamental wave: 1064 nm) can be used. This laser can emit either a CW laser beam or a pulsed laser beam. When the laser emits a CW laser beam, a power density of the laser needs to be about 0.01 MW/cm$^2$ to 100 MW/cm$^2$ (preferably, 0.1 MW/cm$^2$ to 10 MW/cm$^2$). A scanning rate is set to about 10 cm/sec to 2000 cm/sec for irradiation.

Note that the laser using, as a medium, single-crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$, to which one or more of Nd, Yb, Cr, Ti, Ho, Er, Tm, and Ta is added as a dopant; an Ar ion laser; or a Ti:sapphire laser can be a CW laser. Alternatively, it can be pulsed at a repetition rate of 10 MHz or more by performing Q-switching operation, modelocking, or the like. When a laser beam is pulsed at a repetition rate of 10 MHz or more, the semiconductor layer is irradiated with a pulsed laser beam after being melted by a preceding laser beam and before being solidified. Therefore, unlike a case of using a pulsed laser having a low repetition rate, the interface between the solid phase and the liquid phase can be moved continuously in the semiconductor layer, so that crystal grains grown continuously in the scanning direction can be obtained.

When ceramic (polycrystal) is used as a medium, the medium can be formed into a desired shape in a short time at low cost. In the case of using a single crystal, a columnar medium having a diameter of several millimeters and a length of several tens of millimeters is generally used. However, in the case of using ceramic, a larger medium can be formed.

A concentration of a dopant such as Nd or Yb in a medium, which directly contributes to light emission, cannot be changed largely either in a single crystal or a polycrystal. Therefore, there is limitation to some extent on improvement in laser output by increasing the concentration. However, in the case of using ceramic, the size of the medium can be significantly increased compared with the case of using a single crystal, and thus, significant improvement in output can be achieved.

Furthermore, in the case of using ceramic, a medium having a parallelepiped shape or a rectangular solid shape can be easily formed. When a medium having such a shape is used and emitted light propagates inside the medium in zigzag, an emitted light path can be extended. Therefore, the light is amplified largely and can be emitted with high output. In addition, since a laser beam emitted from a medium having such a shape has a quadrangular shape in cross-section at the time of emission, it has an advantage over a circular beam in being shaped into a linear beam. By shaping the laser beam emitted as described above using an optical system, a linear beam having a length of 1 mm or less on a shorter side and a length of several millimeters to several meters on a longer side can be easily obtained. Further, by uniformly irradiating the medium with excited light, the linear beam has a uniform energy distribution in a long-side direction. Moreover, the semiconductor layer is preferably irradiated with the laser beam at an incident angle θ (0°<θ<90°) because laser interference can be prevented.

By irradiating the semiconductor layer with this linear beam, the entire surface of the semiconductor layer can be annealed more uniformly. When uniform annealing is needed to both ends of the linear beam, a device of providing slits at the both ends so as to shield a portion where energy is decayed, or the like against light is necessary.

When the linear beam with uniform intensity, which is obtained as described above, is used for annealing the semiconductor layer and a display device is manufactured using this semiconductor layer, the display device have favorable and uniform characteristics.

The laser light irradiation may be performed in an inert gas atmosphere such as in a rare gas or nitrogen. This can suppress surface roughness of the semiconductor layer due to laser light irradiation and variation of threshold value which is caused by variation of interface state density.

The amorphous semiconductor layer may be crystallized by a combination of heat treatment and laser light irradiation, or several times of heat treatment or laser light irradiation alone.

The gate electrode layer can be formed by a sputtering method, an evaporation method, a CVD method, or the like. The gate electrode layer may be formed using an element such as tantalum (Ta), tungsten (W), titanium (Ti), molybdenum (Mo), aluminum (Al), copper (Cu), chromium (Cr), or neodymium (Nd) or an alloy or compound material containing the element as its main component. Alternatively, the gate electrode layer may be formed using a semiconductor film typified by a polycrystalline silicon film doped with an impurity element such as phosphorus, or an AgPdCu alloy. The gate electrode layer may be a single layer or stacked layers.

Although the gate electrode layer is formed in a tapered shape in this embodiment mode, the present invention is not limited thereto. The gate electrode layer may have a stacked structure, in which only one layer may have a tapered shape and the other layer may have a perpendicular side by anisotropic etching. The gate electrode layers stacked may have different taper angles or the same taper angle. When the gate electrode layer has a tapered shape, the coverage thereof with a film to be stacked thereover is improved, and defects can be reduced. Accordingly, reliability is improved.

The source electrode layer or the drain electrode layer can be formed by forming a conductive film by a PVD method, a CVD method, an evaporation method, or the like and then etching the conductive film into a desired shape. Alternatively, a conductive layer can be selectively formed in a desired position by a droplet discharge method, a printing method, a dispenser method, an electroplating method, or the like. Still alternatively, a reflow method or a damascene method may be used. The source electrode layer or the drain electrode layer is formed using an element such as Ag, Au, Cu, Ni, Pt, Pd, Ir, Rh, W, Al, Ta, Mo, Cd, Zn, Fe, Ti, Si, Ge, Zr, or Ba, or an alloy or a nitride thereof. Alternatively, a stacked structure thereof may be used.

The insulating layers 523, 526, 527, and 534 may be formed using an inorganic insulating material such as silicon oxide, silicon nitride, silicon oxynitride, aluminum oxide, aluminum nitride, or aluminum oxynitride; an acrylic acid, a methacrylic acid, or a derivative thereof; a heat resistant high molecular compound such as polyimide, aromatic polyamide, or polybenzimidazole; or a siloxane resin. Alternatively, a resin material such as a vinyl resin like polyvinyl alcohol or polyvinylbutyral, an epoxy resin, a phenol resin, a novolac resin, an acrylic resin, a melamine resin, or a urethane resin may be used. Further, an organic material such as benzocyclobutene, parylene, fluorinated arylene ether, or polyimide, a composition material containing a water-soluble homopolymer and a water-soluble copolymer, or the like may be used. The insulating layers 523, 526, 527, and 534 can be formed by a vapor-phase growth method such as a plasma CVD method or a thermal CVD method, or a sputtering method. Alternatively, they can be formed by a droplet discharge method or a printing method (such as screen printing or offset printing by which a pattern is formed). A film obtained by a coating method, an SOG film, or the like can also be used.

After forming a conductive layer, an insulating layer, or the like by discharging a composition by a droplet discharge method, a surface thereof may be planarized by pressing with pressure to improve planarity. As a pressing method, unevenness may be reduced by moving a roller-shaped object over the surface, or the surface may be perpendicularly pressed with a flat plate-shaped object. A heating step may be performed at the time of pressing. Alternatively, surface unevenness may be eliminated with an air knife after softening or melting the surface with a solvent or the like. A CMP method may be alternatively used for polishing the surface. This step may be employed in planarizing the surface when unevenness is generated by a droplet discharge method.

Without limitation to this embodiment mode, the thin film transistor may have a single-gate structure in which a single channel formation region is formed, a double-gate structure in which two channel formation regions are formed, or a triple-gate structure in which three channel formation regions are formed. In addition, a thin film transistor in a peripheral driver circuit region may also have a single-gate structure, a double-gate structure, or a triple-gate structure.

Note that without limitation to the manufacturing method of a thin film transistor described in this embodiment mode, the present invention can be used in a top-gate structure (such as a staggered structure or a coplanar structure), a bottom-gate structure (such as an inverted coplanar structure), a dual-gate structure including two gate electrode layers provided above and below a channel region each with a gate insulating film interposed therebetween, or other structures.

Figure 7A:
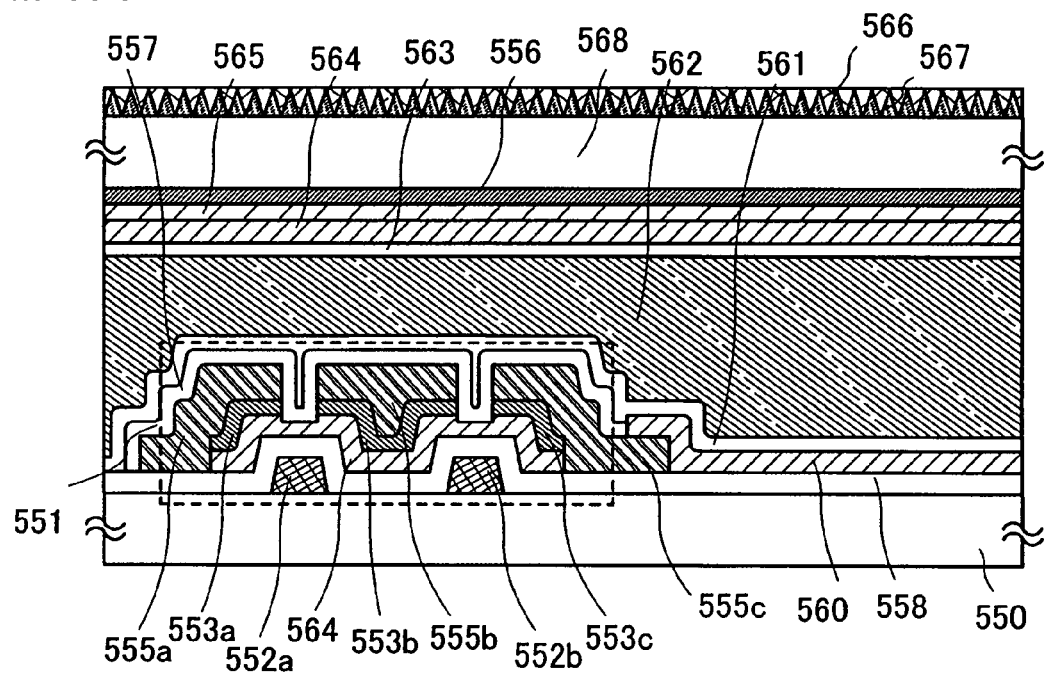
FIGS. 7A and 7B are cross-sectional views showing a display device of the present invention.
Figure 7B:
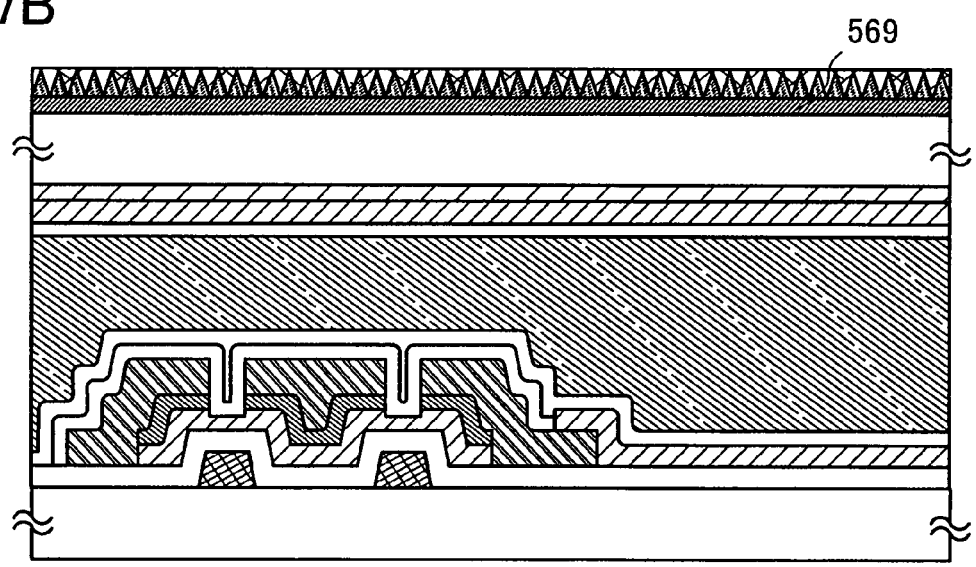

Each of FIGS. 7A and 7B shows an active-matrix liquid crystal display device to which the present invention is applied. In each of FIGS. 7A and 7B, a substrate 550 provided with a transistor 551 having a multi-gate structure, a pixel electrode layer 560, and an insulating layer 561 functioning as an orientation film faces a substrate 568, which is an opposite substrate, provided with an insulating layer 563 functioning as an orientation film, a conductive layer 564 functioning as an opposite electrode layer, a colored layer 565 functioning as a color filter, and a polarizer (also referred to as a polarizing plate) 556, with a liquid crystal layer 562 interposed therebetween. A surface of the substrate 568 on a viewer side is provided with an anti-reflection film 567 with a plurality of projections of the present invention and a protective layer 566 filling a space between the projections of the anti-reflection film 567.

The display device of FIG. 7A is an example in which the anti-reflection film 567 is provided on an outer side of the substrate 568 and the polarizer 556, the colored layer 565, and the conductive layer 564 are sequentially provided on an inner side. However, the polarizer 569 may be provided on the outer side of the substrate 568 (on a viewer side) as shown in FIG. 7B, and in that case, the anti-reflection film 567 may be provided over a surface of the polarizer 569. The stacked structure of the polarizer and the colored layer is also not limited to that of FIG. 7A and may be appropriately determined depending on materials of the polarizer and the colored layer or conditions of a manufacturing process.

Figure 13:
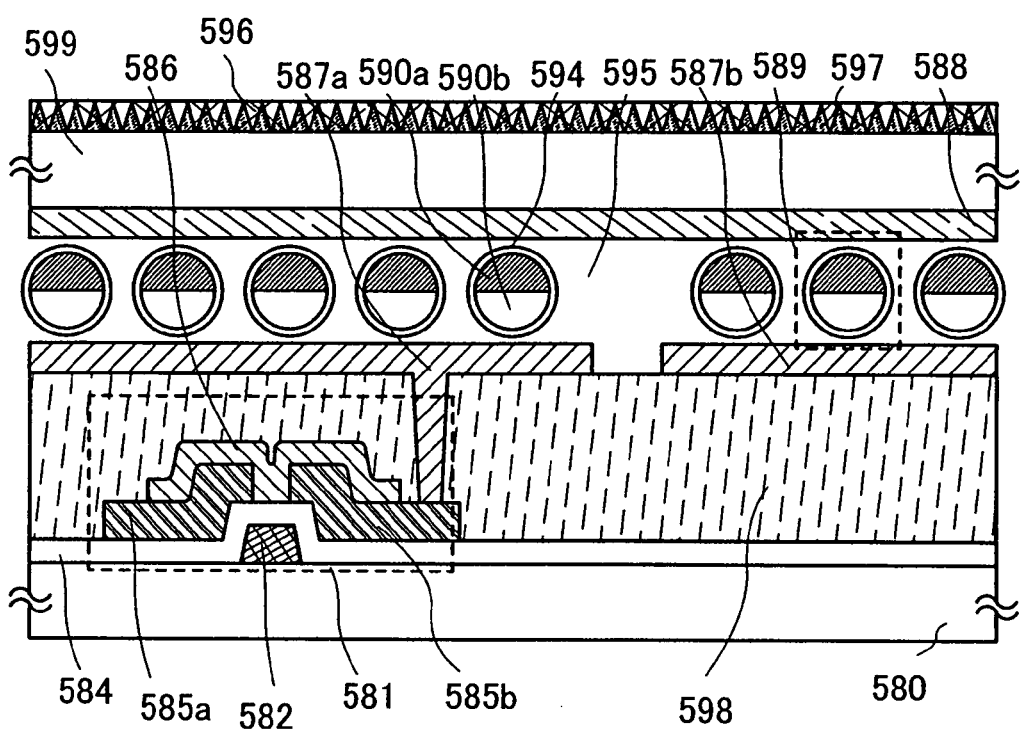
FIG. 13 is a cross-sectional view showing a display device of the present invention.

FIG. 13 shows active-matrix electronic paper to which the present invention is applied. Although FIG. 13 shows an active-matrix type, the present invention can also be applied to a passive-matrix type.

Although each of FIGS. 7A and 7B shows a liquid crystal display element as an example of a display element, a display device using a twisting ball display system may be used. A twisting ball display system is a method in which display is performed by arranging spherical particles each of which is colored separately in black and white between the first electrode layer and the second electrode layer, and generating a potential difference between the first electrode layer and the second electrode layer so as to control the directions of the spherical particles.

A transistor 581 is an inverted coplanar thin film transistor, which includes a gate electrode layer 582, a gate insulating layer 584, wiring layers 585*a* and 585*b*, and a semiconductor layer 586. In addition, the wiring layer 585*b* is electrically connected to the first electrode layers 587*a* and 587*b* through an opening formed in an insulating layer 598. Between the first electrode layers 587*a* and 587*b*, and the second electrode layer 588, spherical particles 589, each of which includes a black region 590*a* and a white region 590*b*, and a cavity 594 which is filled with liquid around the black region 590*a* and the white region 590*b*, are provided. A space around the spherical particle 589 is filled with a filler 595 such as a resin (see FIG. 13). A surface of a substrate 596 on a viewer side is provided with an anti-reflection film 597 with a plurality of projections of the present invention and a protective layer 596 filling a space between the projections of the anti-reflection film 597.

Instead of the twisting ball, an electrophoretic element can also be used. A microcapsule having a diameter of approximately 10 μm to 20 μm, in which a transparent liquid, and positively charged white microparticles and negatively charged black microparticles are encapsulated, is used. In the microcapsule which is provided between the first electrode layer and the second electrode layer, when an electric field is applied by the first electrode layer and the second electrode layer, the white microparticles and the black microparticles migrate to opposite sides to each other, so that white or black can be displayed. A display element using this principle is an electrophoretic display element, and is called electronic paper in general. The electrophoretic display element has higher reflectance than a liquid crystal display element, and thus, an auxiliary light is unnecessary, less power is consumed, and a display portion can be recognized in a dusky place. Even when power is not supplied to the display portion, an image which has been displayed once can be maintained. Thus, it is possible that a displayed image can be stored, even if a semiconductor device having a display function is distanced from a source of an electric wave.

The transistor may have any structure, as long as the transistor can serve as a switching element. The semiconductor layer may be formed using various semiconductors such as an amorphous semiconductor, a crystalline semiconductor, a polycrystalline semiconductor, and a microcrystalline semiconductor, or an organic transistor may be formed using an organic compound.

A feature of the present invention is to use an anti-reflection film having a plurality of projections over a display screen surface of a display device as an anti-reflection film having an anti-reflection function that prevents reflection of external light. Each projection of the anti-reflection film of the present invention preferably has a conical shape, and an angle made by a base and a lateral surface of each projection is preferably equal to or greater than 84° and less than 90°. In this embodiment mode, the surfaces of the substrates 538, 568, and 596 on the viewer sides of the display screens are provided with the anti-reflection films 529, 567, and 597, respectively. The protective layers 536, 566, and 597 are provided so as to fill a space between the projections of the anti-reflection films 529, 567, and 597, respectively. Each of the anti-reflection films 529, 567, and 597 is an anti-reflection film having a plurality of projections, and each projection has a conical shape in this embodiment mode.

Instead of a conical shape, each projection may have a needle-like shape, a shape of a cone with its apex cut off by a plane parallel to its base, a dome shape with a rounded top, or the like. The anti-reflection film can be formed of not a material with a uniform refractive index but a material of which a refractive index changes from a surface to a display screen side. For example, in each of the plurality of projections, a portion closer to the surface is formed of a material having a refractive index equivalent to air to further reduce reflection, by the projection surface, of external light which is incident on each projection through air. On the other hand, a portion closer to the substrate on the display screen side is formed of a material having a refractive index equivalent to that of the substrate to reduce reflection, by an interface between each projection and the substrate, of external light which propagates inside each projection and is incident on the substrate. When a glass substrate is used as the substrate, since the refractive index of air is smaller than that of a glass substrate, each projection may have such a structure in which a portion closer to a surface (an apical portion in a case of a cone) is formed of a material having a lower refractive index, and a portion closer to a base of each projection is formed of a material having a higher refractive index, so that the refractive index increases from the apical portion to the base of the cone.

A material used for forming the anti-reflection film may be appropriately selected in accordance with a material of the substrate forming a display screen surface, such as silicon, nitrogen, fluorine, oxide, nitride, or fluoride. The oxide may be silicon oxide ($SiO_2$), boric oxide ($B_2O_3$), sodium oxide ($NaO_2$), magnesium oxide (MgO), aluminum oxide (alumina) ($Al_2O_3$), potassium oxide ($K_2O$), calcium oxide (CaO), diarsenic trioxide (arsenious oxide) ($As_2O_3$), strontium oxide (SrO), antimony oxide ($Sb_2O_3$), barium oxide (BaO), indium tin oxide ($K_2O$), zinc oxide (ZnO), indium zinc oxide (IZO) in which indium oxide is mixed with zinc oxide (ZnO), a conductive material in which indium oxide is mixed with silicon oxide ($SiO_2$), organic indium, organic tin, indium oxide containing tungsten oxide, indium zinc oxide containing tungsten oxide, indium oxide containing titanium oxide, indium tin oxide containing titanium oxide, or the like. The nitride may be aluminum nitride (AlN), silicon nitride (SiN), or the like. The fluoride may be lithium fluoride (LiF), sodium fluoride (NaF), magnesium fluoride ($MgF_2$), calcium fluoride ($CaF_2$), lanthanum fluoride ($LaF_3$), or the like. The anti-reflection film may include one or more kinds of the above-mentioned silicon, nitrogen, fluorine, oxide, nitride, and fluoride. A mixing ratio thereof may be appropriately set in accordance with a ratio of components (a composition ratio) of the substrate.

The anti-reflection film having a plurality of projections can be formed by forming a thin film by a sputtering method, a vacuum evaporation method, a PVD (Physical Vapor Deposition) method, or a CVD (Chemical Vapor Deposition) method such as a low-pressure CVD (LPCVD) method or a plasma CVD method and then etching the thin film into a desired shape. Alternatively, a droplet discharge method by which a pattern can be formed selectively, a printing method by which a pattern can be transferred or drawn (a method for forming a pattern such as screen printing or offset printing), a coating method such as a spin coating method, a dipping method, a dispenser method, or the like can be employed. Still alternatively, an imprinting technique or a nanoimprinting technique with which a nanoscale three-dimensional structure can be formed by a transfer technology can be employed. Imprinting and nanoimprinting are techniques with which a minute three-dimensional structure can be formed without using a photolithography process.

It is acceptable as long as the protective layer is formed using a material having a lower refractive index than at least a material used for the projections of the anti-reflection film. Accordingly, the material used for the protective layer can be appropriately determined because it is determined relative to materials of a substrate forming a display screen of the display device and an anti-reflection film having projections formed over the substrate.

The protective layer can be formed using a material for forming the anti-reflection film, or the like. As a material having a lower refractive index, aerogel including silica, alumina, and carbon, or the like can be used. A manufacturing method thereof is preferably a wet process, and a droplet discharge method by which a pattern can be formed selectively, a printing method by which a pattern can be transferred or drawn (a method for forming a pattern such as screen printing or offset printing), a coating method such as a spin coating method, a dipping method, a dispenser method, or the like can be employed.

The display device including the anti-reflection film of the present invention includes a plurality of projections on its surface. External light is reflected to not a viewer side but another adjacent projection because the interface of each projection is not flat. Alternatively, external light propagates between the projections. Incident external light is partly transmitted through each projection, and reflected light is then incident on an adjacent projection. In this manner, external light reflected by interface of a projection repeats incidence between adjacent projections.

In other words, the number of times of incidence of external light entering the display device on the anti-reflection film is increased; therefore, the amount of external light transmitted through the anti-reflection film is increased. Thus, the amount of external light reflected to a viewer side is reduced, and the cause of a reduction in visibility such as reflection can be eliminated.

Furthermore, since the protective layer is formed between the projections in the present invention, the entry of a contaminant such as dust into between the projections can be prevented. Therefore, a decrease of an anti-reflection function due to entry of dust or the like can be prevented, and physical strength as the anti-reflection film can be increased by filling a space between the projections. Accordingly, reliability can be improved.

The present invention can provide a high-visibility and high-reliability display device having a high anti-reflection function that can further reduce reflection of external light by providing the anti-reflection film having a plurality of projections on its surface and the protective film between the projections. Accordingly, a more high-quality and high-performance display device can be manufactured.

This embodiment mode can be freely combined with Embodiment Mode 1.

Embodiment Mode 4

This embodiment mode describes an example of a display device having an anti-reflection function that can further reduce reflection of external light, for the purpose of providing excellent visibility. Specifically, this embodiment mode describes a liquid crystal display device using a liquid crystal display element as a display element.

FIG. 8A is a top view of a liquid crystal display device having an anti-reflection film, and FIG. 8B is a cross-sectional view of FIG. 8A along a line C-D. In the top view of FIG. 8A, the anti-reflection film is omitted.

As shown in FIG. 8A, a pixel region 606, a driver circuit region 608a that is a scan line driver circuit region, and a driver circuit region 608b that is a scan line driver circuit region are sealed between a substrate 600 and an opposite substrate 695 with a sealant 692. A driver circuit region 607 that is a signal line driver circuit region formed using a driver IC is provided over a substrate 600. In the pixel region 606, a transistor 622 and a capacitor 623 are provided, and in the driver circuit region 608b, a driver circuit including a transistor 620 and a transistor 621 is provided. An insulating substrate similar to that in the above embodiment mode can be used as the substrate 600. Although there is concern that a substrate made of a synthetic resin generally has lower allowable temperature limit than other substrates, the substrate can be employed by transfer after a manufacturing process using a high heat-resistance substrate.

In the pixel region 606, the transistor 622 functioning as a switching element is provided over the substrate 600 with a base film 604a and a base film 604b interposed therebetween. In this embodiment mode, the transistor 622 is a multi-gate thin film transistor (TFT), which includes a semiconductor layer including impurity regions that function as a source region and a drain region, a gate insulating layer, a gate electrode layer having a stacked structure of two layers, and a source electrode layer and a drain electrode layer. The source electrode layer or the drain electrode layer is in contact with and electrically connects the impurity region of the semiconductor layer and a pixel electrode layer 630. A thin film transistor can be manufactured by many methods. For example, a crystalline semiconductor film is employed as an active layer. A gate electrode is provided over a crystalline semiconductor film with a gate insulating film interposed therebetween. An impurity element can be added to the active layer using the gate electrode. By addition of an impurity element using the gate electrode in this manner, a mask does not need to be formed for addition of an impurity element. The gate electrode can have a single-layer structure or a stacked structure. The impurity region can be formed into a high-concentration impurity region and a low-concentration impurity region by controlling the concentration thereof. A thin film transistor having a low-concentration impurity region in this manner is referred to as an LDD (Lightly Doped Drain) structure. The low-concentration impurity region can be formed to be overlapped by the gate electrode, and such a thin film transistor is referred to as a GOLD (Gate Overlapped LDD) structure. The thin film transistor is formed to have an n-type polarity by using phosphorus (P) in the impurity region. In a case of a p-type polarity, boron (B) or the like may be added. After that, an insulating film 611 and an insulating film 612 are formed to cover the gate electrode and the like. Dangling bonds of the crystalline semiconductor film can be terminated by a hydrogen element mixed in the insulating film 611 (and the insulating film 612).

In order to further improve planarity, an insulating film 615 and an insulating film 616 may be formed as interlayer insulating films. The insulating film 615 and the insulating film 616 can be formed using an organic material, an inorganic material, or a stacked structure thereof. For example, the insulating film 615 and the insulating film 616 can be formed of a material selected from substances including an inorganic insulating material such as silicon oxide, silicon nitride, silicon oxynitride, silicon nitride oxide, aluminum nitride, aluminum oxynitride, aluminum nitride oxide having a higher content of nitrogen than that of oxygen, aluminum oxide, diamond-like carbon (DLC), polysilazane, a nitrogen-containing carbon (CN), PSG (phosphosilicate glass), BPSG (borophosphosilicate glass), and alumina. Alternatively, an organic insulating material may be used; an organic material may be either photosensitive or non-photosensitive; and polyimide, acrylic, polyamide, polyimide amide, a resist, benzocyclobutene, a siloxane resin, or the like can be used. Note that the siloxane resin corresponds to a resin having Si—O—Si bonds. Siloxane has a skeleton structure formed from a bond of silicon (Si) and oxygen (O). As a substituent, an organic group containing at least hydrogen (for example, an alkyl group or aromatic hydrocarbon) is used. A fluoro group may be used as the substituent. Alternatively, an organic group containing at least hydrogen and a fluoro group may be used as the substituent.

By using a crystalline semiconductor film, the pixel region and the driver circuit region can be formed over the same substrate. In that case, the transistor in the pixel region and the transistor in the driver circuit region 608b are formed simultaneously. The transistor used in the driver circuit region 608b constitutes a part of a CMOS circuit. Although the thin film transistor included in the CMOS circuit has a GOLD structure, it may have an LDD structure like the transistor 622.

Without limitation to this embodiment mode, the thin film transistor of the pixel region may have a single-gate structure in which a single channel formation region is formed, a double-gate structure in which two channel formation regions are formed, or a triple-gate structure in which three channel formation regions are formed. In addition, the thin film transistor of a peripheral driver circuit region may also have a single-gate structure, a double-gate structure, or a triple-gate structure.

Note that without limitation to the manufacturing method of a thin film transistor described in this embodiment mode, the present invention can be used in a top-gate structure (such as a staggered structure), a bottom-gate structure (such as an inverted staggered structure), a dual-gate structure including two gate electrode layers provided above and below a channel region each with a gate insulating film interposed therebetween, or another structure.

Next, an insulating layer 631 called an orientation film is formed by a printing method or a droplet discharge method to cover the pixel electrode layer 630 and the insulating film 616. Note that the insulating layer 631 can be selectively formed by using a screen printing method or an offset printing method. After that, rubbing treatment is performed. The rubbing treatment is not necessarily performed when the mode of liquid crystal is, for example, a VA mode. An insulating layer 633 functioning as an orientation film is similar to the insulating layer 631. Then, the sealant 692 is formed by a droplet discharge method in a peripheral region of the pixel region.

After that, the opposite substrate 695 provided with the insulating layer 633 functioning as an orientation film, a conductive layer 634 functioning as an opposite electrode, a colored layer 635 functioning as a color filter, a polarizer 641 (also referred to as a polarizing plate), and an anti-reflection film 642 is attached to the substrate 600 that is a TFT substrate with a spacer 637 interposed therebetween, and a liquid crystal layer 632 is provided in a gap therebetween. Since the liquid crystal display device of this embodiment mode is of transmissive type, a polarizer (polarizing plate) 643 is provided on a side of the substrate 600 opposite to the side of having elements. The polarizer can be provided over the substrate using an adhesive layer. The sealant may be mixed with a filler, and further, the opposite substrate 695 may be provided with a shielding film (black matrix), or the like. Note that the color filter or the like may be formed of materials exhibiting red (R), green (G), and blue (B) when the liquid crystal display device performs full color display. When performing monochrome display, the colored layer may be omitted or formed of a material exhibiting at least one color.

The display device in FIGS. 8A and 8B is an example in which the anti-reflection film 642 is provided on an outer side of the opposite substrate 695 and the polarizer 641, the colored layer 635, and the conductive layer 634 are sequentially provided on an inner side. However, the polarizer may be provided on the outer side of the substrate 695 (on a viewer side), and in that case, the anti-reflection film may be provided over a surface of the polarizer (polarizing plate). The stacked structure of the polarizer and the colored layer is also not limited to FIGS. 8A and 8B and may be appropriately determined depending on materials of the polarizer and the colored layer or conditions of a manufacturing process.

Note that the color filter is not provided in some cases where light-emitting diodes (LEDs) of RGB or the like are arranged as a backlight and a successive additive color mixing method (field sequential method) in which color display is performed by time division is employed. The black matrix is preferably provided so as to overlap a transistor and a CMOS circuit for the sake of reducing reflection of external light by wirings of the transistor and the CMOS circuit. Note that the black matrix may be provided so as to overlap a capacitor. This is because reflection by a metal film forming the capacitor can be prevented.

The liquid crystal layer can be formed by a dispenser method (dropping method), or an injecting method by which liquid crystal is injected using a capillary phenomenon after attaching the substrate 600 including an element to the opposite substrate 695. A dropping method is preferably employed when using a large-sized substrate to which it is difficult to apply an injecting method.

Although the spacer may be provided in such a way that particles each having a size of several micrometers are sprayed, the spacer in this embodiment mode is formed by a method in which a resin film is formed over an entire surface of the substrate and then etched. A material of the spacer is applied by a spinner and then subjected to light exposure and development to form a predetermined pattern. Moreover, the material is heated at 150° C. to 200° C. in a clean oven or the like so as to be hardened. The thus manufactured spacer can have various shapes depending on the conditions of the light exposure and development. It is preferable that the spacer have a columnar shape with a flat top so that mechanical strength of the liquid crystal display device can be secured when the opposite substrate is attached. The shape can be conical, pyramidal, or the like, and there is no particular limitation on the shape.

Subsequently, a terminal electrode layer 678 electrically connected to the pixel portion is provided with an FPC 694 that is a wiring board for connection, through an anisotropic conductive layer 696. The FPC 694 functions to transmit external signals or potential. Through the above steps, a liquid crystal display device having a display function can be manufactured.

A wiring and a gate electrode layer which are included in the transistor, the pixel electrode layer 630, and the conductive layer 634 that is an opposite electrode layer can be formed using a material selected from indium tin oxide (ITO), indium zinc oxide (IZO) in which indium oxide is mixed with zinc oxide (ZnO), a conductive material in which indium oxide is mixed with silicon oxide ($SiO_2$), organoindium, organotin, indium oxide containing tungsten oxide, indium zinc oxide containing tungsten oxide, indium oxide containing titanium oxide, or indium tin oxide containing titanium oxide; a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu) or silver (Ag), an alloy thereof, or metal nitride thereof.

The polarizing plate and the liquid crystal layer may be stacked with a retardation plate interposed therebetween.

A feature of the present invention is to use an anti-reflection film having a plurality of projections over a display screen surface of a display device as an anti-reflection film having an anti-reflection function that prevents reflection of external light. Each projection of the anti-reflection film of the present invention preferably has a conical shape, and an angle made by a base and a lateral surface of each projection is preferably equal to or greater than 84° and less than 90°. In this embodiment mode, the surface of the opposite substrate 695 on a viewer side of a display screen is provided with the anti-reflection film 642. The anti-reflection film 642 is an anti-reflection film having a plurality of projections, and each projection has a conical shape in this embodiment mode. In this embodiment mode, the anti-reflection film 642 is an anti-reflection film including a protective layer so as to fill a space between the projections.

Instead of a conical shape, each projection may have a needle-like shape, a shape of a cone with its apex cut off by a plane parallel to its base, a dome shape with a round apex, or the like. The anti-reflection film can be formed of not a material with a uniform refractive index but a material of which a refractive index changes from a surface to a display screen side. For example, in each of the plurality of projections, a portion closer to the surface is formed of a material having a refractive index equivalent to that of air to further reduce reflection, by the projection surface, of external light which is incident on each projection through air. On the other hand, a portion closer to the substrate side on the display screen side is formed of a material having a refractive index equivalent to that of the substrate to reduce reflection, by an interface between each projection and the substrate, of external light which propagates inside each projection and is incident on the substrate. When a glass substrate is used as the substrate, since the refractive index of air is smaller than that of a glass substrate, each projection may have such a structure in which a portion closer to a surface (an apical portion in a case of a cone) is formed of a material having a lower refractive index, and a portion closer to a base of each projection is formed of a material having a higher refractive index, so that the refractive index increases from the apical portion to the base of the cone of the cone.

The display device including the anti-reflection film of the present invention includes a plurality of projections on its surface. External light is reflected to not a viewer side but another adjacent projection because the interface of each projection is not flat. Alternatively, external light propagates between the projections. Incident external light is partly transmitted through each projection, and reflected light is then incident on an adjacent projection. In this manner, external light reflected by interface of a projection repeats incidence between adjacent projections.

In other words, the number of times of incidence of external light entering the display device on the anti-reflection film is increased; therefore, the amount of external light transmitted through the anti-reflection film is increased. Thus, the amount of external light reflected to a viewer side is reduced, and the cause of a reduction in visibility such as reflection can be eliminated.

Furthermore, since the protective layer is formed between the projections in the present invention, the entry of a contaminant such as dust into between the projections can be prevented. Therefore, a decrease of an anti-reflection function due to entry of dust or the like can be prevented, and physical strength as the anti-reflection film can be increased by filling a space between the projections. Accordingly, reliability can be improved.

The present invention can provide a high-visibility and high-reliability display device having a high anti-reflection function that can further reduce reflection of external light by providing the anti-reflection film having a plurality of projections on its surface and the protective film between the projections. Accordingly, a more high-quality and high-performance display device can be manufactured.

This embodiment mode can be freely combined with Embodiment Mode 1.

Embodiment Mode 5

This embodiment mode describes an example of a display device having an anti-reflection function that can further reduce reflection of external light, for the purpose of providing excellent visibility. Specifically, this embodiment mode describes a light emitting display device using a light emitting element as a display element. A manufacturing method of the display device in this embodiment mode is described in detail with reference to FIGS. 9A and 9B and FIG. 12.

As a base film, a base film 101a is formed using a silicon nitride oxide film with a thickness of 10 nm to 200 nm (preferably 50 nm to 150 nm) over a substrate 100 having an insulating surface, and a base film 101b is formed thereover using a silicon oxynitride film with a thickness of 50 nm to 200 nm (preferably 100 nm to 150 nm), by a sputtering method, a PVD (Physical Vapor Deposition) method, a CVD (Chemical Vapor Deposition) method such as a low-pressure CVD (LPCVD) method or a plasma CVD method, or the like. Alternatively, an acrylic acid, a methacrylic acid, or a derivative thereof; a heat-resistant high molecular compound such as polyimide, aromatic polyamide, or polybenzimidazole; or a siloxane resin may be used. Alternatively, a resin material such as a vinyl resin like polyvinyl alcohol or polyvinylbutyral, an epoxy resin, a phenol resin, a novolac resin, an acrylic resin, a melamine resin, or a urethane resin may be used. Further, an organic material such as benzocyclobutene, parylene, fluorinated arylene ether, or polyimide, a composition material containing a water-soluble homopolymer and a water-soluble copolymer, or the like may be used. Moreover, an oxazole resin can be used, and for example, a photo-curing polybenzoxazole or the like can be used.

A droplet discharge method, a printing method (a method for forming a pattern such as screen printing or offset printing), a coating method such as a spin coating method, a dipping method, a dispenser method, or the like can also be used. In this embodiment mode, the base film 101a and the base film 101b are formed by a plasma CVD method. As the substrate 100, a glass substrate, a quartz substrate, or a silicon substrate, a metal substrate, or a stainless steel substrate provided with an insulating film on the surface may be used. In addition, a plastic substrate having heat resistance sufficient to withstand a processing temperature of this embodiment mode may be used, or a flexible film-like substrate may be used. As the plastic substrate, a substrate made of PET (polyethylene terephthalate), PEN (polyethylenenaphthalate), or PES (polyethersulfone) can be used, and as the flexible substrate, a substrate made of a synthetic resin such as acrylic can be used. Since the display device manufactured in this embodiment mode has a structure in which light from a light emitting element is extracted through the substrate 100, the substrate 100 needs to have a light-transmitting property.

The base film can be formed using silicon oxide, silicon nitride, silicon oxynitride, silicon nitride oxide, or the like and may have either a single-layer structure or a stacked structure of two or more layers.

Next, a semiconductor film is formed over the base film. The semiconductor film may be formed with a thickness of 25 nm to 200 nm (preferably, 30 nm to 150 nm) by any of various methods (such as a sputtering method, an LPCVD method, or a plasma CVD method). In this embodiment mode, it is preferable to use a crystalline semiconductor film which is obtained by crystallizing an amorphous semiconductor film with a laser beam.

The semiconductor film obtained in this manner may be doped with a slight amount of an impurity element (boron or phosphorus) to control a threshold voltage of a thin film transistor. This doping with an impurity element may be performed to the amorphous semiconductor film before the crystallization step. When the doping with an impurity element is performed to the amorphous semiconductor film, activation of the impurity element can be performed by subsequent heat treatment for crystallization. In addition, defects and the like caused by doping can be improved.

Next, the crystalline semiconductor film is etched into a desired shape to form a semiconductor layer.

The etching may be performed by either plasma etching (dry etching) or wet etching; however, plasma etching is suitable for treating a large-sized substrate. As an etching gas, a fluorine-based gas such as $CF_4$ or $NF_3$ or a chlorine-based gas such as $Cl_2$ or $BCl_3$ is used, to which an inert gas such as He or Ar may be appropriately added. Alternatively, electric discharge machining can be performed locally when the etching is performed using atmospheric pressure discharge, in which case a mask layer does not need to be formed over the entire surface of the substrate.

In the present invention, a conductive layer forming a wiring layer or an electrode layer, a mask layer used for forming a predetermined pattern, or the like may be formed by a method capable of selectively forming a pattern, such as a droplet discharge method. A droplet discharge (ejection) method (also referred to as an ink-jet method depending on its method) can form a predetermined pattern (of a conductive layer or an insulating layer) by selectively discharging (ejecting) droplets of a composition mixed for a specific purpose. In this case, treatment for controlling wettability or adhesiveness may be performed to a subject region. Alternatively, a method by which a pattern can be transferred or drawn, such as a printing method (a method for forming a pattern such as screen printing or offset printing) or a dispenser method can be used.

A mask used in this embodiment mode is formed using a resin material such as an epoxy resin, an acrylic resin, a phenol resin, a novolac resin, a melamine resin, or a urethane resin. Alternatively, an organic material such as benzocyclobutene, parylene, fluorinated arylene ether, or polyimide having a light-transmitting property; a compound material made by polymerization of a siloxane-based polymer or the like; a composition material containing a water-soluble homopolymer and a water-soluble copolymer; or the like may be used. Still alternatively, a commercial resist material containing a photosensitizer may be used. For example, a positive type resist or a negative type resist may be used. In a case of using a droplet discharge method, even when using any of the above materials, a surface tension and a viscosity are appropriately controlled by adjusting the concentration of a solvent or adding a surfactant or the like.

A gate insulating layer 107 is formed to cover the semiconductor layer. The gate insulating layer is formed using an insulating film containing silicon with a thickness of 10 nm to 150 nm by a plasma CVD method, a sputtering method, or the like. The gate insulating layer may be formed using a known material such as an oxide material or nitride material of silicon typified by silicon nitride, silicon oxide, silicon oxynitride, or silicon nitride oxide, and it may have either a single-layer structure or a stacked structure. The gate insulating layer may be formed to have a three-layer structure of a silicon nitride film, a silicon oxide film, and a silicon nitride film. Alternatively, a single layer of a silicon oxynitride film or a stacked layer of two layers may be used.

Next, a gate electrode layer is formed over the gate insulating layer 107. The gate electrode layer can be formed by a sputtering method, an evaporation method, a CVD method, or the like. The gate electrode layer may be formed using an element selected from tantalum (Ta), tungsten (W), titanium (Ti), molybdenum (Mo), aluminum (Al), copper, (Cu), chromium (Cr), and neodymium (Nd), or an alloy material or a compound material containing the above element as its main component. Alternatively, the gate electrode layer may be formed using a semiconductor film typified by a polycrystalline silicon film doped with an impurity element such as phosphorus, or an AgPdCu alloy. The gate electrode layer may be a single layer or stacked layers.

Although the gate electrode layer is formed in a tapered shape in this embodiment mode, the present invention is not limited thereto. The gate electrode layer may have a stacked structure in which only one layer has a tapered shape and the other layer has a perpendicular side by anisotropic etching. The gate electrode layers stacked may have different taper angles or the same taper angle, as in this embodiment mode. When the gate electrode layer has a tapered shape, the coverage thereof by a film to be stacked thereover is improved, and defects can be reduced. Accordingly, reliability is improved.

Through the etching step in forming the gate electrode layer, the gate insulating layer 107 may be etched to a certain extent and the thickness thereof may be reduced (so-called film reduction).

An impurity element is added to the semiconductor layer to form an impurity region. The impurity region can be formed into a high-concentration impurity region and a low-concentration impurity region by controlling the concentration thereof. A thin film transistor having a low-concentration impurity region is referred to as an LDD (Lightly Doped Drain) structure. The low-concentration impurity region can be formed to be overlapped by the gate electrode, and such a thin film transistor is referred to as a GOLD (Gate Overlapped LDD) structure. The thin film transistor is formed to have an n-type polarity by using phosphorus (P) in the impurity region. In a case of a p-type polarity, boron (B) or the like may be added.

In this embodiment mode, a region where the impurity region is overlapped by the gate electrode layer with the gate insulating layer interposed therebetween is referred to as a Lov region, and a region where the impurity region is not overlapped by the gate electrode layer with the gate insulating layer interposed therebetween is referred to as a Loff region. In FIG. 9B, the impurity regions are indicated by hatching and white, which does not mean that an impurity element is not added to the white portion. They are indicated in this manner so that it is easily recognized that the concentration distribution of an impurity element in this region reflects a mask or conditions of doping. Note that this applies to other drawings of this specification.

Heat treatment, intense light irradiation, or laser light irradiation may be performed to activate the impurity element. At the same time as the activation, plasma damage to the gate insulating layer and the interface between the gate insulating layer and the semiconductor layer can be repaired.

Then, a first interlayer insulating layer is formed to cover the gate electrode layer and the gate insulating layer. In this embodiment mode, the first interlayer insulating layer has a stacked structure of an insulating film 167 and an insulating film 168. The insulating film 167 and the insulting film 168 can be formed using a silicon nitride film, a silicon nitride oxide film, a silicon oxynitride film, a silicon oxide film, or the like by a sputtering method or a plasma CVD method, or another insulating film containing silicon may be used as a single layer or a stacked structure of three or more layers.

In addition, heat treatment is performed in a nitrogen atmosphere at 300° C. to 550° C. for 1 to 12 hours to hydrogenate the semiconductor layer. Preferably, it is performed at 400° C. to 500° C. This step is a step of terminating dangling bonds of the semiconductor layer with hydrogen which is contained in the insulating film 167 that is the interlayer insulating layer. In this embodiment mode, heat treatment is performed at 410° C.

The insulating film 167 and the insulating film 168 can be formed using a material selected from substances including an inorganic insulating material, such as aluminum nitride (AlN), aluminum oxynitride (AlON), aluminum nitride oxide (AlNO) having a higher content of nitrogen than that of oxygen, aluminum oxide, diamond-like carbon (DLC), nitrogen-containing carbon (CN), and polysilazane. Alternatively, a material containing siloxane may be used. An organic insulating material may be used, and as an organic material, polyimide, acrylic, polyamide, polyimide amide, a resist, or benzocyclobutene can be used. Moreover, an oxazole resin can be used, and for example, a photo-curing polybenzoxazole or the like can be used.

Next, a contact hole (opening) is formed in the insulating film 167, the insulating film 168, and the gate insulating layer 107 using a mask made of a resist so as to reach the semiconductor layer. A conductive film is formed to cover the opening, and the conductive film is etched to form a source electrode layer or a drain electrode layer which is electrically connected to a part of a source region or a drain region. The source electrode layer or drain electrode layer can be formed by forming a conductive film by a PVD method, a CVD method, an evaporation method, or the like and then etching the conductive film into a desired shape. A conductive layer can be selectively formed in a predetermined position by a droplet discharge method, a printing method, a dispenser method, an electroplating method, or the like. Furthermore, a reflow method or a damascene method may be used. The source electrode layer or drain electrode layer is formed using a metal such as Ag, Au, Cu, Ni, Pt, Pd, Ir, Rh, W, Al, Ta, Mo, Cd, Zn, Fe, Ti, Si, Ge, Zr, or Ba, or an alloy or a metal nitride thereof. In addition, it may have a stacked structure thereof.

Through the above steps, an active matrix substrate can be manufactured, which includes a thin film transistor 285 that is a p-channel thin film transistor having a p-type impurity region in a Lov region and a thin film transistor 275 that is an n-channel thin film transistor having an n-type impurity region in a Lov region in a peripheral driver circuit region 204, and a thin film transistor 265 that is a multi-channel n-channel thin film transistor having an n-type impurity region in a Loff region and a thin film transistor 245 that is a p-channel thin film transistor having a p-type impurity region in a Lov region in the pixel region 206.

Without limitation to this embodiment mode, a thin film transistor may have a single-gate structure in which a single channel formation region is formed, a double-gate structure in which two channel formation regions are formed, or a triple-gate structure in which three channel formation regions are formed. In addition, the thin film transistor in the peripheral driver circuit region may also have a single-gate structure, a double-gate structure, or a triple-gate structure.

Next, an insulating film 181 is formed as a second interlayer insulating layer. In FIGS. 9A and 9B, a reference numeral 201 denotes a separation region for separation by scribing; 202, an external terminal connection region which is an attachment portion of an FPC; 203, a wiring region which is a lead wiring region of a peripheral portion; 204, a peripheral driver circuit region; and 206, a pixel region. In the wiring region 203, a wiring 179a and a wiring 179b are provided, and in the external terminal connection region 202, a terminal electrode layer 178 connected to an external terminal is provided.

The insulating film 181 can be formed of a material selected from substances including an inorganic insulating material such as silicon oxide, silicon nitride, silicon oxynitride, silicon nitride oxide, aluminum nitride (AlN), aluminum oxide containing nitrogen (also referred to as aluminum oxynitride) (AlON), aluminum nitride containing oxygen (also referred to as aluminum nitride oxide) (AlNO), aluminum oxide, diamond-like carbon (DLC), nitrogen-containing carbon (CN), PSG (phosphosilicate glass), BPSG (borophosphosilicate glass), and alumina. Alternatively, a siloxane resin may be used. Furthermore, an organic insulating material may be used; an organic material may be either photosensitive or non-photosensitive; and polyimide, acrylic, polyamide, polyimide amide, a resist, benzocyclobutene, polysilazane, or a low-dielectric constant (Low-k) material can be used. Moreover, an oxazole resin can be used, and for example, a photo-curing polybenzoxazole or the like can be used. Since an interlayer insulating layer provided for planarization needs to have high heat resistance, high insulating property, and high planarity, the insulating film 181 is preferably formed by a coating method typified by a spin coating method.

Instead, the insulating film 181 can be formed by dipping, spray coating, a doctor knife, a roll coater, a curtain coater, a knife coater, CVD, evaporation, or the like. The insulating film 181 may be formed by a droplet discharge method. In a case of using a droplet discharge method, a material liquid can be saved. Alternatively, a method like a droplet discharge method by which a pattern can be transferred or drawn, such as a printing method (a method for forming a pattern such as screen printing or offset printing), a dispenser method, or the like can be used.

A minute opening, that is, a contact hole is formed in the insulating film 181 in the pixel region 206.

Next, a first electrode layer 185 (also referred to as a pixel electrode layer) is formed in contact with the source electrode layer or the drain electrode layer. The first electrode layer 185 functions as an anode or a cathode, and may be formed using a film containing as its main component an element selected from Ti, Ni, W, Cr, Pt, Zn, Sn, In, and Mo or an alloy or compound material containing the above element such as $TiN$, $TiSi_xN_y$, $WSi_x$, $WN_x$, $WSi_xN_y$, or NbN, or a stacked film thereof with a total thickness of 100 nm to 800 nm.

In this embodiment mode, the display device has a structure in which a light emitting element is used as a display element and light from the light emitting element is extracted through the first electrode layer 185; therefore, the first electrode layer 185 has a light transmitting property. The first electrode layer 185 is formed by forming a transparent conductive film and then etching the transparent conductive film into a desired shape.

In the present invention, the first electrode layer 185 that is a light-transmitting electrode layer may be specifically formed using a transparent conductive film made of a conductive material having a light transmitting property, such as indium oxide containing tungsten oxide, indium zinc oxide containing tungsten oxide, indium oxide containing titanium oxide, or indium tin oxide containing titanium oxide. It is needless to say that indium tin oxide (ITO), indium zinc oxide (IZO), indium tin oxide to which silicon oxide is added (ITSO), or the like can also be used.

Even in a case of using a material such as a metal film which does not have a light transmitting property, light can be transmitted through the first electrode layer 185 by forming the first electrode layer 185 very thin (preferably, a thickness of approximately 5 nm to 30 nm) so as to be able to transmit light. A metal thin film which can be used for the first electrode layer 185 is a conductive film made of titanium, tungsten, nickel, gold, platinum, silver, aluminum, magnesium, calcium, lithium, or an alloy thereof.

The first electrode layer 185 can be formed by an evaporation method, a sputtering method, a CVD method, a printing method, a dispenser method, a droplet discharge method, or the like. In this embodiment mode, the first electrode layer 185 is manufactured by a sputtering method using indium zinc oxide containing tungsten oxide. The first electrode layer 185 preferably has a thickness in total of 100 nm to 800 nm.

The first electrode layer 185 may be polished by a CMP method or by cleaning with a polyvinyl alcohol-based porous body so that a surface of the first electrode layer 185 is planarized. After polishing by a CMP method, ultraviolet irradiation, oxygen plasma treatment, or the like may be performed to the surface of the first electrode layer 185.

After the first electrode layer 185 is formed, heat treatment may be performed. Through this heat treatment, moisture included in the first electrode layer 185 is released. Therefore, degasification or the like is not caused in the first electrode layer 185. Even when a light emitting material which is easily deteriorated by moisture is formed over the first electrode layer, the light emitting material is not deteriorated. Accordingly, a highly reliable display device can be manufactured.

Next, an insulating layer 186 (also called a partition, a barrier, or the like) is formed to cover an end portion of the first electrode layer 185, and the source electrode layer or the drain electrode layer.

The insulating layer 186 can be formed using silicon oxide, silicon nitride, silicon oxynitride, silicon nitride oxide, or the like and may have a single-layer structure or a stacked structure of two layers, three layers, or the like. The insulating film 186 can alternatively be formed using a material selected from substances including an inorganic insulating material, such as aluminum nitride, aluminum oxynitride having a higher content of oxygen than that of nitrogen, aluminum nitride oxide having a higher content of nitrogen than that of oxygen, aluminum oxide, diamond-like carbon (DLC), nitrogen-containing carbon, or polysilazane. Alternatively, a material containing siloxane may be used. Furthermore, an organic insulating material may be used; an organic material may be either photosensitive or non-photosensitive; and polyimide, acrylic, polyamide, polyimide amide, a resist, benzocyclobutene, or polysilazane can be used. Moreover, an oxazole resin can be used, and for example, a photo-curing polybenzoxazole or the like can be used.

The insulating layer 186 can be formed by a sputtering method, a PVD (Physical Vapor Deposition) method, a CVD (Chemical Vapor Deposition) method such as a low-pressure CVD (LPCVD) method or a plasma CVD method, a droplet discharge method by which a pattern can be formed selectively, a printing method by which a pattern can be transferred or drawn (a method for forming a pattern such as screen printing or offset printing), a dispenser method, a coating method such as a spin coating method, a dipping method, or the like.

The etching into a desired shape may be performed by either plasma etching (dry etching) or wet etching; however, plasma etching is suitable for treating a large-sized substrate. As an etching gas, a fluorine-based gas such as $CF_4$ or $NF_3$ or a chlorine-based gas such as $Cl_2$ or $BCl_3$ is used, to which an inert gas such as He or Ar may be appropriately added. Alternatively, electric discharge machining may be performed locally when the etching process is performed using atmospheric pressure discharge, in which case a mask layer does not need to be formed over the entire surface of the substrate.

In FIG. 9A, a wiring layer formed of the same material and in the same step as the second electrode layer is electrically connected to the wiring layer which is formed of the same material and in the same step as the gate electrode layer.

An electroluminescent layer 188 is formed over the first electrode layer 185. Note that, although FIG. 9B shows only one pixel, respective electroluminescent layers corresponding to colors of R (red), G (green), and B (blue) are separately formed in this embodiment mode.

Next, a second electrode layer 189 is formed using a conductive film over the electroluminescent layer 188. For the second electrode layer 189, Al, Ag, Li, Ca, an alloy or a compound thereof such as MgAg, MgIn, AlLi, or $CaF_2$, or calcium nitride may be used. Thus, a light emitting element 190 including the first electrode layer 185, the electroluminescent layer 188, and the second electrode layer 189 is formed (see FIG. 9B).

In the display device of this embodiment mode shown in FIGS. 9A and 9B, light emitted from the light emitting element 190 is transmitted through the first electrode layer 185 and extracted in a direction indicated by an arrow in FIG. 9B.

In this embodiment mode, an insulating layer may be provided as a passivation film (protective film) over the second electrode layer 189. It is effective to provide a passivation film to cover the second electrode layer 189 in this manner. The passivation film can be formed using a single layer or a stacked layer of an insulating film including silicon nitride, silicon oxide, silicon oxynitride, silicon nitride oxide, aluminum nitride, aluminum oxynitride, aluminum nitride oxide having a higher content of nitrogen than that of oxygen, aluminum oxide, diamond-like carbon (DLC), or nitrogen-containing carbon. Alternatively, the passivation film may be formed using a siloxane resin.

In this case, a film providing good coverage is preferably used as the passivation film. A carbon film, especially, a DLC film is effective. The DLC film can be formed at a temperature in the range of room temperature to 100° C.; therefore, the DLC film can be easily formed over the electroluminescent layer 188 having low heat resistance. The DLC film can be formed by a plasma CVD method (typically, an RF plasma CVD method, a microwave CVD method, an electron cyclotron resonance (ECR) CVD method, a thermal filament CVD method, or the like), a combustion flame method, a sputtering method, an ion beam evaporation method, a laser evaporation method, or the like. A hydrogen gas and a hydrocarbon-based gas (for example, $CH_4$, $C_2H_2$, $C_6H_6$, or the like) are used as a reaction gas which is used for forming a DLC film. The reaction gas is ionized by glow discharge, and the ions are accelerated to collide with a negatively self-biased cathode; accordingly, a DLC film is formed. A CN film may be formed using a $C_2H_4$ gas and an $N_2$ gas as a reaction gas. The DLC film has a high blocking effect on oxygen and can suppress oxidation of the electroluminescent layer 188. Accordingly, the electroluminescent layer 188 can be prevented from oxidizing during a subsequent sealing step.

The substrate 100 provided with the light emitting element 190 and a sealing substrate 195 are fixed to each other with a sealant 192 to seal the light emitting element (see FIGS. 9A and 9B). As the sealant 192, it is typically preferable to use a visible light curable resin, an ultraviolet ray curable resin, or a heat curable resin. For example, a bisphenol-A liquid resin, a bisphenol-A solid resin, a bromine-containing epoxy resin, a bisphenol-F resin, a bisphenol-AD resin, a phenol resin, a cresol resin, a novolac resin, a cycloaliphatic epoxy resin, an Epi-Bis type (Epichlorohydrin-Bisphenol) epoxy resin, a glycidyl ester resin, a glycidyl amine resin, a heterocyclic epoxy resin, or a modified epoxy resin can be used. Note that a region surrounded by the sealant may be filled with a filler 193, or nitrogen may be enclosed by sealing the region in a nitrogen atmosphere. Since the display device of this embodiment mode is of bottom emission type, the filler 193 does not need to have a light transmitting property. However, in a case of employing a structure in which light is extracted through the filler 193, the filler 193 needs to have a light transmitting property. Typically, a visible light curing, ultraviolet curing, or thermosetting epoxy resin may be used. Through the above steps, a display device having a display function with the use of a light emitting element of this embodiment mode is completed. Alternatively, the filler can be dropped in a liquid state and encapsulated in the display device. When a substance having a hygroscopic property such as a drying agent is used as the filler, a higher water-absorbing effect can be obtained, and element deterioration can be prevented.

In order to prevent element deterioration due to moisture, a drying agent is provided in an EL display panel. In this embodiment mode, the drying agent is provided in a depression portion formed in the sealing substrate so as to surround the pixel region, so that it does not interfere with a reduction in thickness. Further, since the drying agent having a water-absorbing function is formed in a large area by forming the drying agent in a region corresponding to the gate wiring layer, a high water-absorbing effect can be obtained. In addition, since the drying agent is also formed over the gate wiring layer which does not contribute to light emission, a reduction in light extraction efficiency can be prevented.

This embodiment mode describes the case where the light emitting element is sealed with a glass substrate. Sealing treatment is treatment for protecting the light emitting element from moisture. Therefore, any of the following method can be used: a method in which a light emitting element is mechanically sealed with a cover material, a method in which a light emitting element is sealed with a thermosetting resin or an ultraviolet curable resin, and a method in which a light emitting element is sealed with a thin film of metal oxide, metal nitride, or the like having high barrier capability. As the cover material, glass, ceramics, plastic, or a metal can be used. However, when light is emitted to the cover material side, the cover material needs to have a light-transmitting property. The cover material is attached to the substrate over which the above-mentioned light emitting element is formed, with a sealant such as a thermosetting resin or an ultraviolet curable resin, and a sealed space is formed by curing the resin with heat treatment or ultraviolet light irradiation treatment. It is also effective to provide a moisture absorbing material typified by barium oxide in the sealed space. The moisture absorbing material may be provided on the sealant or over a partition or a peripheral portion so as not to block light emitted from the light emitting element. Further, a space between the cover material and the substrate over which the light emitting element is formed can also be filled with a thermosetting resin or an ultraviolet curable resin. In this case, it is effective to add a moisture absorbing material typified by barium oxide in the thermosetting resin or the ultraviolet curable resin.

Figure 12:
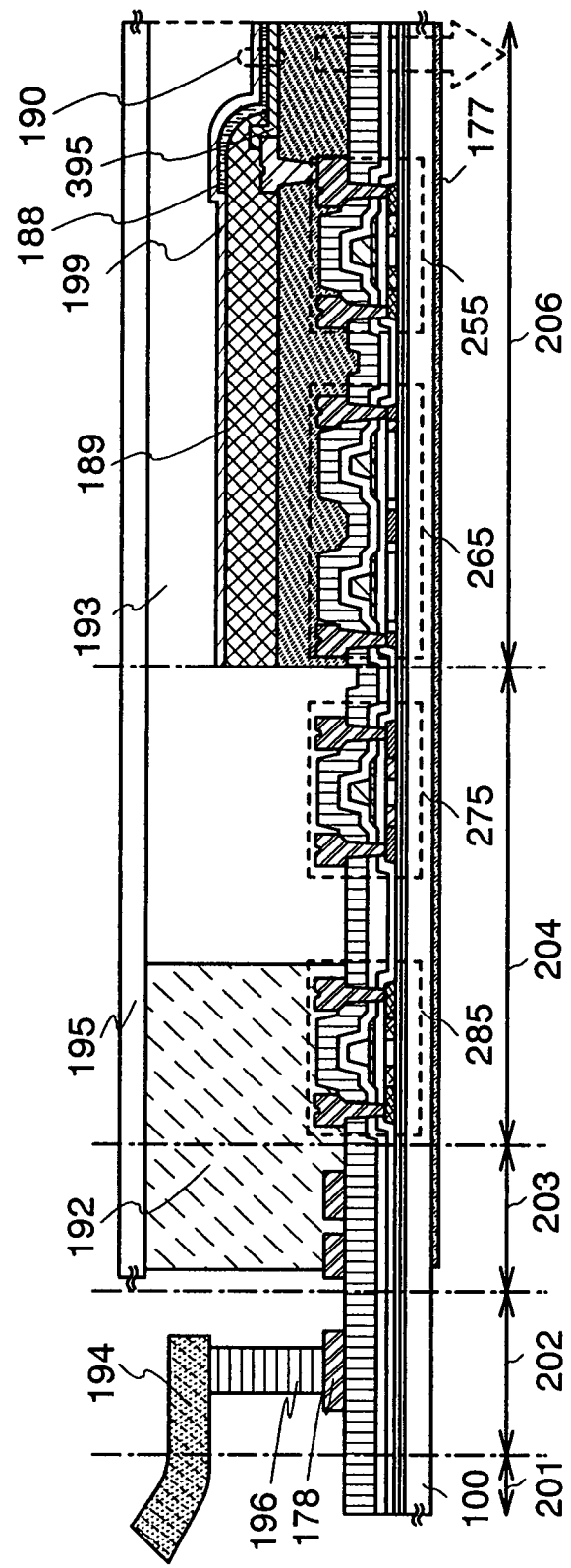
FIG. 12 is a cross-sectional view showing a display device of the present invention.

FIG. 12 shows an example in which the source electrode or the drain electrode layer is connected to the first electrode layer through a wiring layer so as to be electrically connected instead of being directly in contact, in the display device of FIGS. 9A and 9B manufactured in this embodiment mode. In the display device shown in FIG. 12, the source electrode layer or the drain electrode layer of the thin film transistor which drives the light emitting element is electrically connected to a first electrode layer 395 through a wiring layer 199. Moreover, in FIG. 12, the first electrode layer 395 is partially stacked over the wiring layer 199; however, the first electrode layer 395 may be formed first and then the wiring layer 199 may be formed on the first electrode layer 395.

In this embodiment mode, an FPC 194 is connected to the terminal electrode layer 178 by an anisotropic conductive layer 196 in the external terminal connection region 202 so as to have an electrical connection with outside. Moreover, as shown in FIG. 9A that is a top view of the display device, the display device manufactured in this embodiment mode includes a peripheral driver circuit region 207 and a peripheral driver circuit region 208 having scan line driver circuits, in addition to the peripheral driver circuit region 204 and a peripheral driver circuit region 209 having signal line driver circuits.

In this embodiment mode, the above-described circuits are used; however, the present invention is not limited thereto and an IC chip may be mounted as a peripheral driver circuit by a COG method or a TAB method. Moreover, a gate line driver circuit and a source line driver circuit may be provided in any number.

In the display device of the present invention, a driving method for image display is not particularly limited, and for example, a dot sequential driving method, a line sequential driving method, an area sequential driving method, or the like may be used. Typically, the line sequential driving method is used, and a time division gray scale driving method or an area gray scale driving method may be appropriately used. Further, a video signal inputted to the source line of the display device may be either an analog signal or a digital signal. The driver circuit and the like may be appropriately designed in accordance with the video signal.

Since each of the display devices shown in FIGS. 9A and 9B and FIG. 12 has a bottom-emission structure, light is emitted through the substrate 100 that is an element substrate. Therefore, a viewer side is on the substrate 100 side. Thus, a light-transmitting substrate is used as the substrate 100, and an anti-reflection film 177 is provided on an outer side that corresponds to a viewer side. The anti-reflection film 177 has a plurality of projections on its surface, and each projection has a conical shape in this embodiment mode. In this embodiment mode, the anti-reflection film 177 is an anti-reflection film including a protective layer so as to fill a space between the projections.

Instead of a conical shape, each projection may have a needle-like shape, a shape of a cone with its apex cut off by a plane parallel to its base, a dome shape with a rounded top, or the like. The anti-reflection film can be formed of not a material with a uniform refractive index but a material of which a refractive index changes from a surface to a display screen side. For example, in each of the plurality of projections, a portion closer to the surface is formed of a material having a refractive index equivalent to air to further reduce reflection, by the projection surface, of external light which is incident on each projection through air. On the other hand, a portion closer to the substrate on the display screen side is formed of a material having a refractive index equivalent to that of the substrate to reduce reflection, by an interface between each projection and the substrate, of external light which propagates inside each projection and is incident on the substrate. When a glass substrate is used as the substrate, since the refractive index of air is smaller than that of a glass substrate, each projection may have such a structure in which a portion closer to a surface (an apical portion in a case of a cone) is formed of a material having a lower refractive index, and a portion closer to a base of each projection is formed of a material having a higher refractive index, so that the refractive index increases from the apical portion to the base of the cone.

The display device including the anti-reflection film of the present invention includes a plurality of projections on its surface. External light is reflected to not a viewer side but another adjacent projection because the interface of each projection is not flat. Alternatively, external light propagates between the projections. Incident external light is partly transmitted through each projection, and reflected light is then incident on an adjacent projection. In this manner, external light reflected by interface of a projection repeats incidence between adjacent projections.

In other words, the number of times of incidence of external light entering the display device on the anti-reflection film is increased; therefore, the amount of external light transmitted through the anti-reflection film is increased. Thus, the amount of external light reflected to a viewer side is reduced, and the cause of a reduction in visibility such as reflection can be eliminated.

Furthermore, since the protective layer is formed between the projections in the present invention, the entry of a contaminant such as dust into between the projections can be prevented. Therefore, a decrease of an anti-reflection function due to entry of dust or the like can be prevented, and physical strength as the anti-reflection film can be increased by filling a space between the projections. Accordingly, reliability can be improved.

The present invention can provide a high-visibility and high-reliability display device having a high anti-reflection function that can further reduce reflection of external light by providing the anti-reflection film having a plurality of projections on its surface and the protective film between the projections. Accordingly, a more high-quality and high-performance display device can be manufactured.

This embodiment mode can be freely combined with Embodiment Mode 1.

Embodiment Mode 6

A display device having a light emitting element can be formed by applying the present invention, and the emitting element emits light by any one of bottom emission, top emission, and dual emission. This embodiment mode describes examples of dual emission and top emission with reference to FIGS. 10 and 11.

Figure 11:
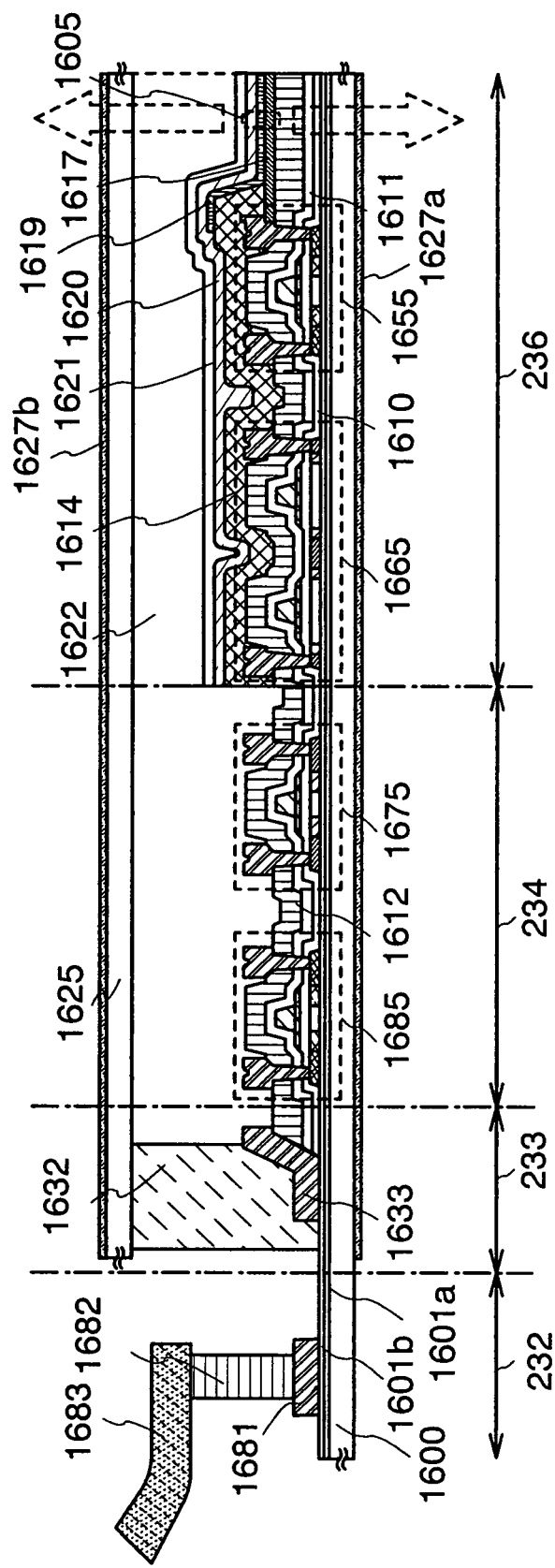
FIG. 11 is a cross-sectional view showing a display device of the present invention.

A display device shown in FIG. 11 includes an element substrate 1600, a thin film transistor 1655, a thin film transistor 1665, a thin film transistor 1675, a thin film transistor 1685, a first electrode layer 1617, an electroluminescent layer 1619, a second electrode layer 1620, a filler 1622, a sealant 1632, an insulating film 1601a, an insulating film 1601b, a gate insulating layer 1610, an insulating film 1611, an insulating film 1612, an insulating layer 1614, a sealing substrate 1625, a wiring layer 1633, a terminal electrode layer 1681, an anisotropic conductive layer 1682, an FPC 1683, and anti-reflection films 1627a and 1627b. The display device also includes an external terminal connection region 232, a sealing region 233, a peripheral driver circuit region 234, and a pixel region 236. The filler 1622 can be formed by a dropping method using a composition in a liquid state. A light emitting display device is sealed by attaching the element substrate 1600 provided with the filler by a dropping method and the sealing substrate 1625 to each other.

The display device shown in FIG. 11 has a dual-emission structure, in which light is emitted through both the element substrate 1600 and the sealing substrate 1625 in directions of arrows. Therefore, a light-transmitting electrode layer is used as each of the first electrode layer 1617 and the second electrode layer 1620.

In this embodiment mode, the first electrode layer 1617 and the second electrode layer 1620 each of which is a light-transmitting electrode layer may be formed using a transparent conductive film made of a conductive material having a light-transmitting property, specifically, indium oxide containing tungsten oxide, indium zinc oxide containing tungsten oxide, indium oxide containing titanium oxide, indium tin oxide containing titanium oxide, or the like. It is needless to say that indium tin oxide (ITO), indium zinc oxide (IZO), indium tin oxide to which silicon oxide is added (ITSO), or the like can also be used.

Even in a case of using a material such as a metal film which does not have a light transmitting property, light can be transmitted through the first electrode layer 1617 and the second electrode layer 1620 by forming the first electrode layer 1617 and the second electrode layer 1620 very thin (preferably, a thickness of approximately 5 nm to 30 nm) so as to be able to transmit light. A metal thin film which can be used for the first electrode layer 1617 and the second electrode layer 1620 is a conductive film made of titanium, tungsten, nickel, gold, platinum, silver, aluminum, magnesium, calcium, lithium, or an alloy thereof.

As described above, the display device of FIG. 11 has a structure in which light emitted from a light emitting element 1605 is emitted from both sides through both the first electrode layer 1617 and the second electrode layer 1620.

Figure 10:
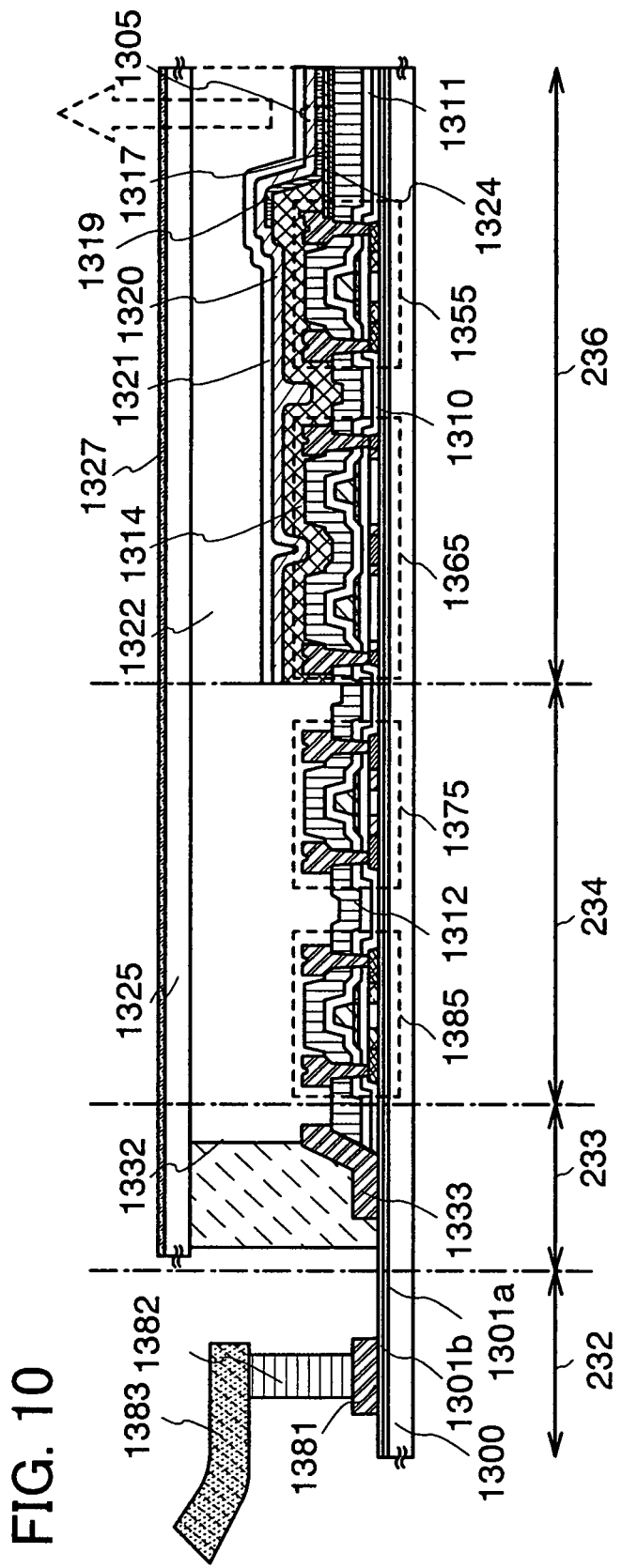
FIG. 10 is a cross-sectional view showing a display device of the present invention.

A display device of FIG. 10 has a structure for top emission in a direction of an arrow. The display device shown in FIG. 10 includes an element substrate 1300, a thin film transistor 1355, a thin film transistor 1365, a thin film transistor 1375, a thin film transistor 1385, a wiring layer 1324, a first electrode layer 1317, an electroluminescent layer 1319, a second electrode layer 1320, a protective film 1321, a filler 1322, a sealant 1332, an insulating film 1301a, an insulating film 1301b, a gate insulating layer 1310, an insulating film 1311, an insulating film 1312, an insulating layer 1314, a sealing substrate 1325, a wiring layer 1333, a terminal electrode layer 1381, an anisotropic conductive layer 1382, and an FPC 1383.

In each of the display devices in FIGS. 10 and 11, an insulating layer stacked over the terminal electrode layer is removed by etching. When the display device has a structure in which an insulating layer having moisture permeability is not provided in the vicinity of a terminal electrode layer, reliability is improved. The display device of FIG. 10 includes an external terminal connection region 232, a sealing region 233, a peripheral driver circuit region 234, and a pixel region 236. In the display device of FIG. 10, the wiring layer 1324 that is a metal layer having reflectivity is formed below the first electrode layer 1317 in the display device having a dual emission structure shown in FIG. 11. The first electrode layer 1317 that is a transparent conductive film is formed over the wiring layer 1324. Since it is acceptable as long as the wiring layer 1324 has reflectivity, the wiring layer 1324 may be formed using a conductive film made of titanium, tungsten, nickel, gold, platinum, silver, copper, tantalum, molybdenum, aluminum, magnesium, calcium, lithium, or an alloy thereof. It is preferable to use a substance having reflectivity in a visible light range, and a TiN film is used in this embodiment mode. In addition, the first electrode layer 1317 may be formed using a conductive film, and in that case, the wiring layer 1324 having reflectivity may be omitted.

Each of the first electrode layer 1317 and the second electrode layer 1320 may be formed using a transparent conductive film made of a conductive material having a light-transmitting property, specifically, indium oxide containing tungsten oxide, indium zinc oxide containing tungsten oxide, indium oxide containing titanium oxide, indium tin oxide containing titanium oxide, or the like. It is needless to say that indium tin oxide (ITO), indium zinc oxide (IZO), indium tin oxide to which silicon oxide is added (ITSO), or the like can also be used.

Even in a case of using a material such as a metal film which does not have a light transmitting property, light can be transmitted through the second electrode layer 1320 by forming the second electrode layer 1320 very thin (preferably, a thickness of approximately 5 nm to 30 nm) so as to be able to transmit light. A metal thin film which can be used as the second electrode layer 1320 is a conductive film made of titanium, tungsten, nickel, gold, platinum, silver, aluminum, magnesium, calcium, lithium, or an alloy thereof.

Each pixel of the display device formed using the light emitting element can be driven by a simple matrix mode or an active matrix mode. Furthermore, either a digital drive or an analog drive may be employed.

A sealing substrate may be provided with a color filter (colored layer). The color filter (colored layer) can be formed by an evaporation method or a droplet discharge method. When the color filter (colored layer) is used, high-definition display can also be performed. This is because broad peaks of emission spectra of R, G, and B can be corrected to sharp peaks by the color filter (colored layer).

Full color display can be achieved by using a material exhibiting monochromatic light emission in combination with a color filter or a color conversion layer. For example, the color filter (colored layer) or the color conversion layer may be formed over the sealing substrate and then attached to the element substrate.

Naturally, display with monochromatic light emission may be performed. For instance, an area-color display device using monochromatic light emission may be formed. A passive-matrix display portion is suitable for the area-color display device, and characters and symbols can be mainly displayed thereon.

Since the display device shown in FIG. 11 has a dual-emission structure, light is emitted through both the element substrate 1600 and the sealing substrate 1625. Therefore, a viewer side is on each of the element substrate 1600 side and the sealing substrate 1625 side. Thus, a light-transmitting substrate is used as each of the element substrate 1600 and the sealing substrate 1625, and the anti-reflection films 1627a and 1627b are provided on respective outer sides that correspond to viewer sides. On the other hand, since the display device shown in FIG. 10 has a top-emission structure, the sealing substrate 1325 on a viewer side is a light-transmitting substrate. An anti-reflection film 1327 is provided on an outer side thereof. Each of the anti-reflection films 1627a, 1627b, and 1327 has a plurality of projections on its surface, and each projection has a conical shape in this embodiment mode. In this embodiment mode, each of the anti-reflection films 1627a, 1627b, and 1327 is an anti-reflection film including a protective layer so as to fill a space between the projections.

Instead of a conical shape, each projection may have a needle-like shape, a shape of a cone with its apex cut off by a plane parallel to its base, a dome shape with a rounded top, or the like. The anti-reflection film can be formed of not a material with a uniform refractive index but a material of which a refractive index changes from a surface to a display screen side. For example, in each of the plurality of projections, a portion closer to the surface is formed of a material having a refractive index equivalent to air to further reduce reflection, by the projection surface, of external light which is incident on each projection through air. On the other hand, a portion closer to the substrate on the display screen side is formed of a material having a refractive index equivalent to that of the substrate to reduce reflection, by an interface between each projection and the substrate, of external light which propagates inside each projection and is incident on the substrate. When a glass substrate is used as the substrate, since the refractive index of air is smaller than that of a glass substrate, each projection may have such a structure in which a portion closer to a surface (an apical portion in a case of a cone) is formed of a material having a lower refractive index, and a portion closer to a base of each projection is formed of a material having a higher refractive index, so that the refractive index increases from the apical portion to the base of the cone.

The display device including the anti-reflection film of the present invention includes a plurality of projections over its surface. External light is reflected to not a viewer side but another adjacent projection because the interface of each projection is not flat. Alternatively, external light propagates between the projections. Incident external light is partly transmitted through each projection, and reflected light is then incident on an adjacent projection. In this manner, external light reflected by interface of a projection repeats incidence between adjacent projections.

In other words, the number of times of incidence of external light entering the display device on the anti-reflection film is increased; therefore, the amount of external light transmitted through the anti-reflection film is increased. Thus, the amount of external light reflected to a viewer side is reduced, and the cause of a reduction in visibility such as reflection can be eliminated.

Furthermore, since the protective layer is formed between the projections in the present invention, the entry of a contaminant such as dust into between the projections can be prevented. Therefore, a decrease of an anti-reflection function due to entry of dust or the like can be prevented, and physical strength as the anti-reflection film can be increased by filling a space between the projections. Accordingly, reliability can be improved.

The present invention can provide a high-visibility and high-reliability display device having a high anti-reflection function that can further reduce reflection of external light by providing the anti-reflection film having a plurality of projections on its surface and the protective film between the projections. Accordingly, a more high-quality and high-performance display device can be manufactured.

This embodiment mode can be freely combined with Embodiment Mode 1.

Embodiment Mode 7

This embodiment mode describes an example of a display device having an anti-reflection function that can further reduce reflection of external light, for the purpose of providing excellent visibility. Specifically, this embodiment mode describes a light emitting display device using a light emitting element as a display element.

This embodiment mode describes a structure of a light emitting element which can be employed as a display element of the display device of the present invention, with reference to FIGS. 22A to 22D.

FIGS. 22A to 22D each show an element structure of a light emitting element. In the light emitting element, an electroluminescent layer 860, in which an organic compound and an inorganic compound are mixed, is interposed between a first electrode layer 870 and a second electrode layer 850. The electroluminescent layer 860 includes a first layer 804, a second layer 803, and a third layer 802 as shown, and in particular, the first layer 804 and the third layer 802 are highly characteristic.

The first layer 804 is a layer which functions to transport holes to the second layer 803, and includes at least a first organic compound and a first inorganic compound showing an electron-accepting property to the first organic compound. What is important is that the first organic compound and the first inorganic compound are not only simply mixed, but the first inorganic compound shows an electron-accepting property to the first organic compound. This structure generates many holes (carriers) in the first organic compound, which originally has almost no inherent carriers, and thus, a highly excellent hole-injecting property and a highly excellent hole-transporting property can be obtained.

Therefore, the first layer 804 can have not only an advantageous effect that is considered to be obtained by mixing an inorganic compound (such as improvement in heat resistance) but also excellent conductivity (particularly a hole-injecting property and a hole-transporting property in the first layer 804). This excellent conductivity is an advantageous effect that cannot be obtained in a conventional hole-transporting layer in which an organic compound and an inorganic compound, which do not electronically interact with each other, are simply mixed. This advantageous effect can make a drive voltage lower than a conventional one. In addition, since the first layer 804 can be made thicker without causing an increase in drive voltage, short circuit of the element due to dust and the like can be suppressed.

It is preferable to use a hole-transporting organic compound as the first organic compound because holes (carriers) are generated in the first organic compound as described above. Examples of the hole-transporting organic compound include, but are not limited to, phthalocyanine (abbr.: $H_2Pc$), copper phthalocyanine (abbr.: CuPc), vanadyl phthalocyanine (abbr.: VOPc), 4,4',4"-tris(N,N-diphenylamino)triphenylamine (abbr.: TDATA), 4,4',4"-tris[N-(3-methylphenyl)-N-phenylamino]triphenylamine (abbr.: MTDATA), 1,3,5-tris[N,N-di(m-tolyl)amino]benzene (abbr.: m-MTDAB), N,N'-diphenyl-N,N'-bis(3-methylphenyl)-1,1'-biphenyl-4,4'-diamine (abbr.: TPD), 4,4'-bis[N-(1-naphthyl)-N-phenylamino]biphenyl (abbr.: NPB), 4,4'-bis{N-[4-di(m-tolyl)amino]phenyl-N-phenylamino}biphenyl (abbr.: DNTPD), 4,4',4"-tris(N-carbazolyl)triphenylamine (abbr.: TCTA), and the like. In addition, among the compounds mentioned above, aromatic amine compounds as typified by TDATA, MTDATA, m-MTDAB, TPD, NPB, DNTPD, and TCTA can easily generate holes (carriers), and are a suitable group of compounds for the first organic compound.

On the other hand, the first inorganic compound may be any material as long as the material can easily accept electrons from the first organic compound, and various kinds of metal oxides and metal nitrides can be used. An oxide of a transition metal that belongs to any of Groups 4 to 12 of the periodic table is preferable because such an oxide of a transition metal easily shows an electron-accepting property. Specifically, titanium oxide, zirconium oxide, vanadium oxide, molybdenum oxide, tungsten oxide, rhenium oxide, ruthenium oxide, zinc oxide, or the like can be used. In addition, among the metal oxides mentioned above, oxides of transition metals that belong to any of Groups 4 to 8 have a higher electron-accepting property, which are a preferable group of compounds. In particular, vanadium oxide, molybdenum oxide, tungsten oxide, and rhenium oxide are preferable since they can be formed by vacuum evaporation and can be easily handled.

Note that the first layer 804 may be formed by stacking a plurality of layers each including a combination of the organic compound and the inorganic compound as described above, or may further include another organic compound or another inorganic compound.

Next, the third layer 802 is described. The third layer 802 is a layer which functions to transport electrons to the second layer 803, and includes at least a third organic compound and a third inorganic compound showing an electron-donating property to the third organic compound. What is important is that the third organic compound and the third inorganic compound are not only simply mixed but also the third inorganic compound shows an electron-donating property to the third organic compound. This structure generates many electrons (carriers) in the third organic compound which has originally almost no inherent carriers, and a highly excellent electron-injecting property and a highly excellent electron-transporting property can be obtained.

Therefore, the third layer 802 can have not only an advantageous effect that is considered to be obtained by mixing an inorganic compound (such as improvement in heat resistance) but also excellent conductivity (particularly an electron-injecting property and an electron-transporting property in the third layer 802). This excellent conductivity is an advantageous effect that cannot be obtained in a conventional electron-transporting layer in which an organic compound and an inorganic compound, which do not electronically interact with each other, are simply mixed. This advantageous effect can make a drive voltage lower than the conventional one. In addition, since the third layer 802 can be made thick without causing an increase in drive voltage, short circuit of the element due to dust and the like can be suppressed.

It is preferable to use an electron-transporting organic compound as the third organic compound because electrons (carriers) are generated in the third organic compound as described above. Examples of the electron-transporting organic compound include, but are not limited to, tris(8-quinolinolato)aluminum (abbr.: $Alq_3$), tris(4-methyl-8-quinolinolato)aluminum (abbr.: $Almq_3$), bis(10-hydroxybenzo[h]-quinolinato)beryllium (abbr.: $BeBq_2$), bis(2-methyl-8-quinolinolato)(4-phenylphenolato)aluminum (abbr.: BAlq), bis[2-(2'-hydroxyphenyl)benzoxazolato]zinc (abbr.: $Zn(BOX)_2$), bis[2-(2'-hydroxyphenyl)benzothiazolato]zinc (abbr.: $Zn(BTZ)_2$), bathophenanthroline (abbr.: BPhen), bathocuproin (abbr.: BCP), 2-(4-biphenylyl)-5-(4-tert-butylphenyl)-1,3,4-oxadiazole (abbr.: PBD), 1,3-bis[5-(4-tert-butylphenyl)-1,3,4-oxadiazol-2-yl]benzene (abbr.: OXD-7), 2,2',2''-(1,3,5-benzenetriyl)-tris(1-phenyl-1H-benzimidazole) (abbr.: TPBI), 3-(4-biphenylyl)-4-phenyl-5-(4-tert-butylphenyl)-1,2,4-triazole (abbr.: TAZ), 3-(4-biphenylyl)-4-(4-ethylphenyl)-5-(4-tert-butylphenyl)-1,2,4-triazole (abbr.: p-EtTAZ), and the like. In addition, among the compounds mentioned above, chelate metal complexes each having a chelate ligand including an aromatic ring as typified by $Alq_3$, $Almq_3$, $BeBq_2$, BAlq, $Zn(BOX)_2$, $Zn(BTZ)_2$, and the like; organic compounds each having a phenanthroline skeleton as typified by BPhen, BCP, and the like; and organic compounds having an oxadiazole skeleton as typified by PBD, OXD-7, and the like can easily generate electrons (carriers), and are suitable groups of compounds for the third organic compound.

On the other hand, the third inorganic compound may be any material as long as the material can easily donate electrons to the third organic compound, and various kinds of metal oxide and metal nitride can be used. Alkali metal oxide, alkaline earth metal oxide, rare earth metal oxide, alkali metal nitride, alkaline earth metal nitride, and rare earth metal nitride are preferable because they easily show an electron-donating property. Specifically, lithium oxide, strontium oxide, barium oxide, erbium oxide, lithium nitride, magnesium nitride, calcium nitride, yttrium nitride, lanthanum nitride, and the like can be used. In particular, lithium oxide, barium oxide, lithium nitride, magnesium nitride, and calcium nitride are preferable because they can be formed by vacuum evaporation and can be easily handled.

Note that the third layer 802 may be formed by stacking a plurality of layers each including a combination of the organic compound and the inorganic compound as described above, or may further include another organic compound or another inorganic compound.

Next, the second layer 803 is described. The second layer 803 is a layer which functions to emit light, and includes a second organic compound that has a light emitting property. A second inorganic compound may also be included. The second layer 803 can be formed by using various light-emitting organic compounds and inorganic compounds. However, since it is believed to be hard to make a current flow through the second layer 803 as compared with the first layer 804 or the third layer 802, the thickness of the second layer 803 is preferably approximately 10 nm to 100 nm.

The second organic compound is not particularly limited as long as it is a light-emitting organic compound, and examples of the second organic compound include, for example, 9,10-di(2-naphthyl)anthracene (abbr.: DNA), 9,10-di(2-naphthyl)-2-tert-butylanthracene (abbr.: t-BuDNA), 4,4'-bis(2,2-diphenylvinyl)biphenyl (abbr.: DPVBi), coumarin 30, coumarin 6, coumarin 545, coumarin 545T, perylene, rubrene, periflanthene, 2,5,8,11-tetra(tert-butyl)perylene (abbr.: TBP), 9,10-diphenylanthracene (abbr.: DPA), 5,12-diphenyltetracene, 4-(dicyanomethylene)-2-methyl-[p-(dimethylamino)styryl]-4H-pyran (abbr.: DCM1), 4-(dicyanomethylene)-2-methyl-6-[2-(julolidine-9-yl)ethenyl]-4H-pyran (abbr.: DCM2), 4-(dicyanomethylene)-2,6-bis[p-(dimethylamino)styryl]-4H-pyran (abbr.: BisDCM), and the like. In addition, it is also possible to use a compound capable of generating phosphorescence such as bis[2-(4',6'-difluorophenyl)pyridinato-$N,C^{2'}$]iridium(picolinate) (abbr.: FIrpic), bis{2-[3',5'-bis(trifluoromethyl)phenyl]pyridinato-N, $C^{2'}$}iridium(picolinate) (abbr.: Ir($CF_3$ ppy)$_2$(pic)), tris(2-phenylpyridinato-$N,C^{2'}$)iridium (abbr.: Ir(ppy)$_3$), bis(2-phenylpyridinato-$N,C^{2'}$)iridium(acetylacetonate) (abbr.: Ir(ppy)$_2$ (acac)), bis[2-(2'-thienyl)pyridinato-$N,C^{3'}$]iridium (acetylacetonate) (abbr.: Ir(thp)$_2$(acac)), bis(2-phenylquinolinato-$N,C^{2'}$)iridium(acetylacetonate) (abbr.: Ir(pq)$_2$(acac)), or bis[2-(2'-benzothienyl)pyridinato-$N,C^{3'}$]iridium(acetylacetonate) (abbr.: Ir(btp)$_2$(acac)).

A triplet excitation light-emitting material containing a metal complex or the like may be used for the second layer 803 in addition to a singlet excitation light-emitting material. For example, among pixels emitting red, green, and blue light, the pixel emitting red light whose luminance is reduced by half in a relatively short time is formed by using a triplet excitation light-emitting material and the other pixels are formed by using a singlet excitation light-emitting material. A triplet excitation light-emitting material has a feature of favorable light-emitting efficiency and less power consumption to obtain the same luminance. In other words, when a triplet excitation light-emitting material is used for a red pixel, only a small amount of current needs to be applied to a light-emitting element, and thus, reliability can be improved. A pixel emitting red light and a pixel emitting green light may be formed using a triplet excitation light-emitting material and a pixel emitting blue light may be formed using a singlet excitation light-emitting material to reduce power consumption. Power consumption can be further reduced by forming a light-emitting element which emits green light that is highly visible to human eyes by using a triplet excitation light-emitting material.

The second layer 803 may include not only the second organic compound as described above, which produces light emission, but also another organic compound. Examples of organic compounds that can be added include, but are not limited to, TDATA, MTDATA, m-MTDAB, TPD, NPB, DNTPD, TCTA, Alq$_3$, Almq$_3$, BeBq$_2$, BAlq, Zn(BOX)$_2$, Zn(BTZ)$_2$, BPhen, BCP, PBD, OXD-7, TPBI, TAZ, p-Et-TAZ, DNA, t-BuDNA, and DPVBi, which are mentioned above, and further, 4,4'-bis(N-carbazolyl)biphenyl (abbr.: CBP), 1,3,5-tris[4-(N-carbazolyl)phenyl]benzene (abbr.: TCPB), and the like. It is preferable that the organic compound, which is added in addition to the second organic compound, have higher excitation energy than the second organic compound and be added in larger amounts than that of the second organic compound in order to make the second organic compound emit light efficiently (which makes it possible to prevent concentration quenching of the second organic compound). Alternatively, as another function, the added organic compound may emit light along with the second organic compound (which makes it possible to emit white light or the like).

The second layer 803 may have a structure in which light emitting layers having different light emission wavelength bands are each formed in pixels so as to perform color display. Typically, light emitting layers corresponding to respective luminescent colors of R (red), G (green), and B (blue) are formed. In this case, color purity can be improved and specular surface (reflection) of a pixel portion can be prevented by providing a filter that transmits light of a certain light emission wavelength band on a light emission side of the pixels. By providing the filter, a circular polarizing plate or the like, which has been conventionally thought to be required, can be omitted, thereby reducing loss of light emitted from the light emitting layers. In addition, a change in hue, which is caused in the case where a pixel portion (a display screen) is seen obliquely, can be reduced.

The material which can be used for the second layer 803 is preferable either a low-molecular organic light-emitting material or a high molecular organic light emitting material. A high molecular organic light emitting material has high physical strength in comparison with a low molecular material, and a durability of an element is high. In addition, manufacturing of an element is relatively easy because a high molecular organic light emitting material can be formed by coating.

Since the color of light is determined by a material of the light emitting layer, a light emitting element that emits light of a desired color can be formed by selecting the material. As the high molecular electroluminescent material that can be used to form the light emitting layer, a polyparaphenylene vinylene based material, a polyparaphenylene based material, a polythiophene based material, or a polyfluorene based material can be given.

As the polyparaphenylene vinylene based material, a derivative of poly(paraphenylenevinylene) [PPV]: poly(2,5-dialkoxy-1,4-phenylenevinylene) [RO-PPV]; poly[2-(2'-ethyl-hexoxy)-5-methoxy-1,4-phenylenevinylene][MEH-PPV]; poly[2-(dialkoxyphenyl)-1,4-phenylenevinylene] [ROPh-PPV]; or the like can be used. As the polyparaphenylene based material, a derivative of polyparaphenylene[PPP]: poly(2,5-dialkoxy-1,4-phenylene) [RO-PPP]; poly(2,5-dihexoxy-1,4-phenylene); or the like can be used. As the polythiophene based material, a derivative of polythiophene [PT]: poly(3-alkylthiophene) [PAT]; poly(3-hexylthiophene) [PHT]; poly(3-cyclohexylthiophene) [PCHT]; poly(3-cyclohexyl-4-methylthiophene)[PCHMT]; poly(3,4-dicyclohexylthiophene)[PDCHT]; poly[3-(4-octylphenyl)-thiophene][POPT]; poly[3-(4-octylphenyl)-2,2-bithiophene][PTOPT]; or the like can be used. As the polyfluorene based material, a derivative of polyfluorene[PF]: poly(9,9-dialkylfluorene)[PDAF]; poly(9,9-dioctylfluorene) [PDOF]; or the like can be given.

The second inorganic compound may be any inorganic compound as long as the inorganic compound does not easily quench light emission of the second organic compound, and various kinds of metal oxide and metal nitride can be used. In particular, an oxide of a metal that belongs to Group 13 or 14 of the periodic table is preferable because light emission of the second organic compound is not easily quenched by such an oxide, and specifically, aluminum oxide, gallium oxide, silicon oxide, and germanium oxide are preferable. However, the second inorganic compound is not limited thereto.

Note that the second layer 803 may be formed by stacking a plurality of layers each including a combination of the organic compound and the inorganic compound as described above, or may further include another organic compound or another inorganic compound. A layer structure of the light-emitting layer can be changed, and an electrode layer for injecting electrons may be provided or a light-emitting material may be dispersed, instead of providing a specific electron-injecting region or light-emitting region. Such a change can be permitted unless it departs from the spirit of the present invention.

A light emitting element formed using the above-described material emits light when biased forwardly. A pixel of a display device formed with the light emitting element can be driven by a simple matrix mode or an active matrix mode. In either mode, each pixel is made to emit light by applying a forward bias thereto in specific timing, and the pixel is in a non-light-emitting state for a certain period. By applying a reverse bias at this non-light-emitting time, reliability of the light emitting element can be improved. In the light emitting element, there is a deterioration mode in which emission intensity is decreased under specific driving conditions or a deterioration mode in which a non-light-emitting region is enlarged in the pixel and luminance is apparently decreased. However, progression of deterioration can be slowed down by alternating driving. Thus, reliability of the light emitting display device can be improved. Either a digital drive or an analog drive can be employed.

Thus, a color filter (colored layer) may be formed over a sealing substrate. The color filter (colored layer) can be formed by an evaporation method or a droplet discharge method. When the color filter (colored layer) is used, high-definition display can also be performed. This is because broad peaks of the emission spectra of R, G, and B can be corrected to sharp peaks by the color filter (colored layer).

Full color display can be achieved by forming a material exhibiting monochromatic light emission in combination with a color filter or a color conversion layer. For example, the color filter (colored layer) or the color conversion layer may be formed over the sealing substrate and then attached to the element substrate.

Naturally, display with monochromatic light emission may be performed. For instance, an area-color display device using monochromatic light emission may be formed. A passive-matrix display portion is suitable for the area-color display device, and characters and symbols can be mainly displayed thereon.

Figure 22A:
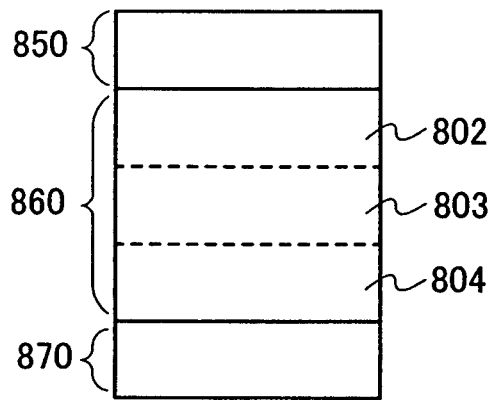
FIGS. 22A to 22D are cross-sectional views each showing a structure of a light emitting element applicable to the present invention.
Figure 22B:
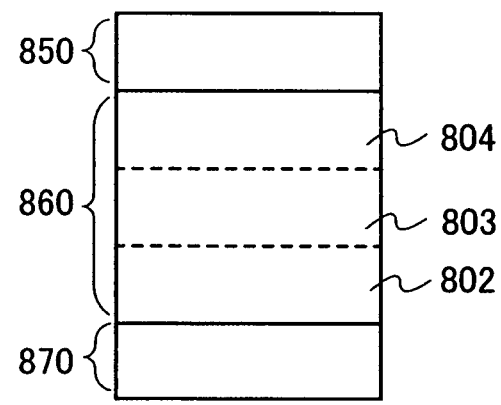

Materials of the first electrode layer 870 and the second electrode layer 850 need to be selected considering the work function. The first electrode layer 870 and the second electrode layer 850 can be either an anode or a cathode depending on the pixel structure. In the case where polarity of a driving thin film transistor is a p-channel type, the first electrode layer 870 may serve as an anode and the second electrode layer 850 may serve as a cathode as shown in FIG. 22A. In the case where polarity of the driving thin film transistor is an n-channel type, the first electrode layer 870 may serve as a cathode and the second electrode layer 850 may serve as an anode as shown in FIG. 22B. Materials that can be used for the first electrode layer 870 and the second electrode layer 850 is described. It is preferable to use a material having a higher work function (specifically, a material having a work function of 4.5 eV or higher) for one of the first electrode layer 870 and the second electrode layer 850, which serves as an anode, and a material having a lower work function (specifically, a material having a work function of 3.5 eV or lower) for the other electrode layer which serves as a cathode. However, since the first layer 804 is superior in a hole-injecting property and a hole-transporting property and the third layer 802 is superior in an electron-injecting property and an electron transporting property, both of the first electrode layer 870 and the second electrode layer 850 are scarcely restricted by a work function, and various materials can be used.

Each of the light-emitting elements shown in FIGS. 22A and 22B has a structure in which light is extracted through the first electrode layer 870, and thus, the second electrode layer 850 does not necessarily need to have a light-transmitting property. The second electrode layer 850 may be formed of a film mainly including an element selected from Ti, Ni, W, Cr, Pt, Zn, Sn, In, Ta, Al, Cu, Au, Ag, Mg, Ca, Li, or Mo, or an alloy material or compound material containing the element as its main component such as TiN, $TiSi_xN_y$, $WSi_x$, $WN_x$, $WSi_xN_y$, NbN or a stacked film thereof with a total thickness ranging from 100 nm to 800 nm.

The second electrode layer 850 can be formed by an evaporation method, a sputtering method, a CVD method, a printing method, a dispenser method, a droplet discharge method, or the like.

In addition, when the second electrode layer 850 is formed using a light-transmitting conductive material, like the material used for the first electrode layer 870, light is also extracted through the second electrode layer 850, and a dual emission structure can be obtained, in which light emitted from the light-emitting element is emitted to both of the first electrode layer 870 side and the second electrode layer 850 side.

Note that the light emitting element according to the present invention has many variations by changing types of the first electrode layer 870 and the second electrode layer 850.

FIG. 22B shows a case where the third layer 802, the second layer 803, and the first layer 804 are provided in this order from the first electrode layer 870 side in the electroluminescent layer 860.

As described above, in the light-emitting element of the present invention, a layer interposed between the first electrode layer 870 and the second electrode layer 850 is formed from the electroluminescent layer 860 including a layer in which an organic compound and an inorganic compound are combined. The light emitting element is an organic-inorganic composite light-emitting element provided with layers (that is, the first layer 804 and the third layer 802) that provide functions such as a high carrier-injecting property and a carrier-transporting property by mixing an organic compound and an inorganic compound, where the functions are not obtainable with either the organic compound or the inorganic compound. Further, the first layer 804 and the third layer 802 need to be layers in which an organic compound and an inorganic compound are combined, particularly when provided on the first electrode layer 870 side, and may contain only one of an organic compound and an inorganic compound when provided on the second electrode layer 850 side.

Further, various methods can be used as a method for forming the electroluminescent layer 860, which is a layer in which an organic compound and an inorganic compound are mixed. For example, the methods include a co-evaporation method of evaporating both an organic compound and an inorganic compound by resistance heating. In addition, for co-evaporation, an inorganic compound may be evaporated by an electron beam (EB) while evaporating an organic compound by resistance heating. Further, the methods also include a method of sputtering an inorganic compound while evaporating an organic compound by resistance heating to deposit the both at the same time. In addition, the electroluminescent layer may also be formed by a wet process.

Similarly, the first electrode layer 870 and the second electrode layer 850 can be formed by evaporation by resistance heating, EB evaporation, sputtering, a wet process, and the like.

Figure 22C:
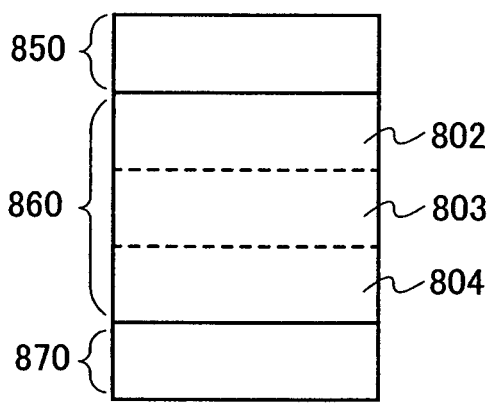
Figure 22D:
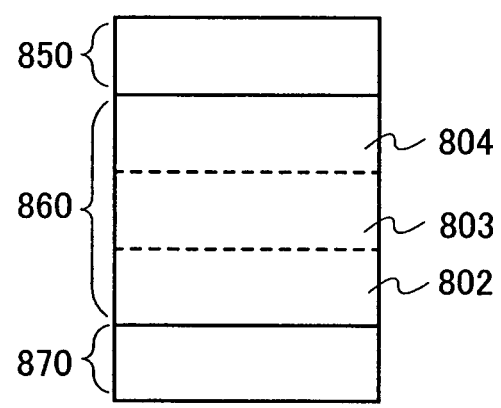

In FIG. 22C, an electrode layer having reflectivity is used for the first electrode layer 870, and an electrode layer having a light-transmitting property is used for the second electrode layer 850 in the structure of FIG. 22A. Light emitted from the light-emitting element is reflected by the first electrode layer 870, then, transmitted through the second electrode layer 850, and is emitted to outside. Similarly, in FIG. 22D, an electrode layer having reflectivity is used for the first electrode layer 870, and an electrode layer having a light-transmitting property is used for the second electrode layer 850 in the structure of FIG. 22B. Light emitted from the light-emitting element is reflected by the first electrode layer 870, then, transmitted through the second electrode layer 850, and is emitted to outside.

This embodiment mode can be freely combined with the above-described embodiment mode regarding the display device including the light emitting element.

In the display device of this embodiment mode, an anti-reflection film having a plurality of projections is also provided over a display screen surface of the display device. Accordingly, the number of times of incidence of external light entering the display device on the anti-reflection film is increased; therefore, the amount of external light transmitted through the anti-reflection film is increased. Thus, the amount of external light reflected to a viewer side is reduced, and the cause of a reduction in visibility such as reflection can be eliminated.

Furthermore, since the protective layer is formed between the projections in the present invention, the entry of a contaminant such as dust into between the projections can be prevented. Therefore, a decrease of an anti-reflection function due to entry of dust or the like can be prevented, and physical strength as the anti-reflection film can be increased by filling a space between the projections. Accordingly, reliability can be improved.

The present invention can provide a high-visibility and high-reliability display device having a high anti-reflection function that can further reduce reflection of external light by providing the anti-reflection film having a plurality of projections on its surface and the protective film between the projections. Accordingly, a more high-quality and high-performance display device can be manufactured.

This embodiment mode can be freely combined with any of Embodiment Modes 1 to 3, 5, and 6 as appropriate.

Embodiment Mode 8

This embodiment mode describes an example of a display device having an anti-reflection function that can further reduce reflection of external light, for the purpose of providing excellent visibility. Specifically, this embodiment mode describes a light emitting display device using a light emitting element as a display element. This embodiment mode describes a structure of a light emitting element which can be applied as a display element of the display device of the present invention, with reference to FIGS. 23A to 24C.

Light emitting elements utilizing electroluminescence are classified according to whether a light emitting material is an organic compound or an inorganic compound. In general, the former is referred to as an organic EL element, and the latter is referred to as an inorganic EL element.

The inorganic EL elements are classified according to their element structures into a dispersed inorganic EL element and a thin-film inorganic EL element. They are different in that the former includes an electroluminescent layer in which particles of a light emitting material are dispersed in a binder and the latter includes an electroluminescent layer formed of a thin film of a light emitting material; however, they are common in that they require electrons accelerated by a high electric field. Note that a mechanism for obtainable light emission includes a donor-acceptor recombination light emission which utilizes a donor level and an acceptor level and a localized light emission which utilizes inner-shell electron transition of metal ions. In general, it is often the case that the dispersed inorganic EL element performs the donor-acceptor recombination light emission and the thin-film inorganic EL element performs the localized light emission.

A light emitting material which can be used in the present invention includes a base material and an impurity element serving as a light emitting center. Light emission of various colors can be obtained by changing impurity elements to be contained. As a method for producing a light emitting material, various methods such as a solid phase method and a liquid phase method (coprecipitation method) can be used. In addition, a liquid phase method such as a spray pyrolysis method, a double decomposition method, a method by precursor pyrolysis, a reverse micelle method, a combined method of one of these methods and high-temperature baking, or a freeze-drying method can be used.

The solid phase method is a method by which a base material and an impurity element or a compound containing an impurity element are weighed, mixed in a mortar, and reacted by heating and baking in an electric furnace to make the impurity element contained in the base material. The baking temperature is preferably in the range of 700° C. to 1500° C. This is because solid phase reaction does not proceed when the temperature is too low and the base material is decomposed when the temperature is too high. Note that the baking may be performed in powder form, but the baking is preferably performed in pellet form. The method requires baking at a relatively high temperature; however, it is a simple method. Therefore, the method provides good productivity and is suitable for mass production.

The liquid phase method (coprecipitation method) is a method by which a base material or a compound containing a base material is reacted in a solution with an impurity element or a compound containing an impurity element and the reactant is baked after being dried. Particles of the light emitting material are uniformly distributed, a particle size is small, and the reaction proceeds even at a low baking temperature.

As the base material used for a light emitting material, sulfide, oxide, or nitride can be used. As sulfide, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used, for example. As oxide, zinc oxide (ZnO), yttrium oxide ($Y_2O_3$), or the like can be used, for example. As nitride, aluminum nitride (AlN), gallium nitride (GaN), indium nitride (InN), or the like can be used, for example. Further, zinc selenide (ZnSe), zinc telluride (ZnTe), or the like can also be used. It may be a ternary mixed crystal such as calcium gallium sulfide ($CaGa_2S_4$), strontium gallium sulfide ($SrGa_2S_4$), or barium gallium sulfide ($BaGa_2S_4$).

As the light emitting center of localized light emission, manganese (Mn), copper (Cu), samarium (Sm), terbium (Tb), erbium (Er), thulium (Tm), europium (Eu), cerium (Ce), praseodymium (Pr), or the like can be used. Note that a halogen element such as fluorine (F) or chlorine (Cl) may be added. A halogen element can also function as a charge compensation.

On the other hand, as the light emitting center of donor-acceptor recombination light emission, a light emitting material which contains a first impurity element forming a donor level and a second impurity element forming an acceptor level can be used. As the first impurity element, fluorine (F), chlorine (Cl), aluminum (Al), or the like can be used, for example. As the second impurity element, copper (Cu), silver (Ag), or the like can be used, for example.

In a case of synthesizing the light emitting material of donor-acceptor recombination light emission by a solid phase method, a base material, a first impurity element or a compound containing a first impurity element, and a second impurity element or a compound containing a second impurity element are separately weighed, mixed in a mortar, and then heated and baked in an electric furnace. As the base material, the above-mentioned base material can be used. As the first impurity element or the compound containing the first impurity element, fluorine (F), chlorine (Cl), aluminum sulfate ($Al_2S_3$), or the like can be used, for example. As the second impurity element or the compound containing the second impurity element, copper (Cu), silver (Ag), copper sulfide ($Cu_2S$), silver sulfide ($Ag_2S$), or the like can be used, for example. The baking temperature is preferably in the range of 700° C. to 1500° C. This is because solid phase reaction does not proceed when the temperature is too low and the base material is decomposed when the temperature is too high. Note that the baking may be performed in powder form, but the baking is preferably performed in pellet form.

As the impurity element in the case of utilizing solid phase reaction, a compound including the first impurity element and the second impurity element may be used. In this case, the impurity element is easily diffused and the solid phase reaction easily proceeds, so that a uniform light emitting material can be obtained. Furthermore, a high-purity light emitting material can be obtained because an unnecessary impurity element is not mixed. As the compound including the first impurity element and the second impurity element, copper chloride (CuCl), silver chloride (AgCl), or the like can be used, for example.

Note that the concentration of the impurity element to the base material may be in the range of 0.01 atomic % to 10 atomic %, preferably 0.05 atomic % to 5 atomic %.

In the case of the thin-film inorganic EL element, the electroluminescent layer is a layer containing the above-described light emitting material, which can be formed by a vacuum evaporation method such as a resistance heating evaporation method or an electron beam evaporation (EB evaporation) method, a physical vapor deposition (PVD) method such as a sputtering method, a chemical vapor deposition (CVD) method such as a metal organic CVD method or a low-pressure hydride transport CVD method, an atomic layer epitaxy (ALE) method, or the like.

Figure 23A:
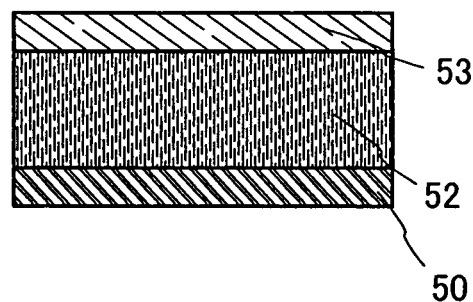
FIGS. 23A to 23C are cross-sectional views each showing a structure of a light emitting element applicable to the present invention.
Figure 23B:
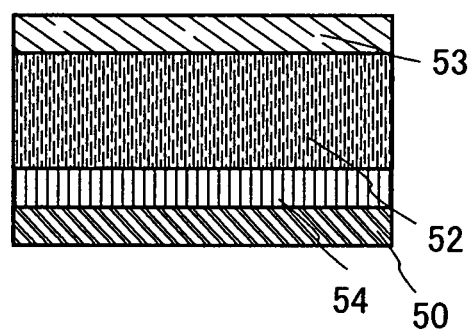
Figure 23C:
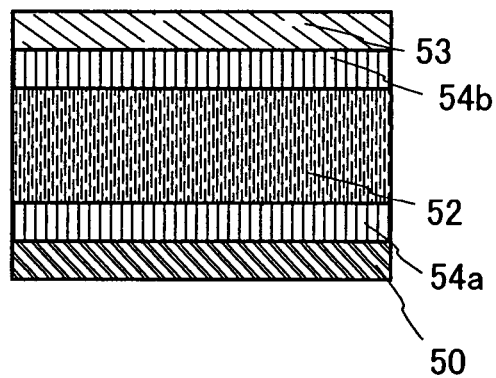

FIGS. 23A to 23C show examples of a thin-film inorganic EL element which can be used as a light emitting element. In each of FIGS. 23A to 23C, a light emitting element includes a first electrode layer 50, an electroluminescent layer 51, and a second electrode layer 53.

Each of the light emitting elements shown in FIGS. 23B and 23C has a structure in which an insulating layer is provided between the electrode layer and the electroluminescent layer in the light-emitting element in FIG. 23A. The light emitting element shown in FIG. 23B includes an insulating layer 54 between the first electrode layer 50 and the electroluminescent layer 52. The light emitting element shown in FIG. 23C includes an insulating layer 54a between the first electrode layer 50 and the electroluminescent layer 52 and an insulating layer 54b between the second electrode layer 53 and the electroluminescent layer 52. As described above, the insulating layer may be provided between the electroluminescent layer and either or both of the pair of electrode layers sandwiching the electroluminescent layer. The insulating layer may be a single layer or a stack of a plurality of layers.

In FIG. 23B, the insulating layer 54 is provided in contact with the first electrode layer 50. However, the insulating layer 54 may be provided in contact with the second electrode layer 53 by reversing the order of the insulating layer and the electroluminescent layer.

In the case of the dispersed inorganic EL element, a particulate light emitting material is dispersed in a binder to form a film-like electroluminescent layer. In a case where a particle having a desired size cannot be sufficiently obtained by a production method of a light emitting material, the material may be processed into particles by crushing in a mortar or the like. The binder is a substance for fixing a particulate light emitting material in a dispersed manner and holding the material in shape as the electroluminescent layer. The light emitting material is uniformly dispersed and fixed in the electroluminescent layer by the binder.

In the case of the dispersed inorganic EL element, the electroluminescent layer can be formed by a droplet discharge method which can selectively form the electroluminescent layer, a printing method (such as screen printing or off-set printing), a coating method such as a spin-coating method, a dipping method, a dispenser method, or the like. The thickness is not particularly limited, but it is preferably in the range of 10 nm to 1000 nm. In addition, in the electroluminescent layer containing the light emitting material and the binder, the proportion of the light emitting material is preferably in the range of 50 wt % to 80 wt %.

Figure 24A:
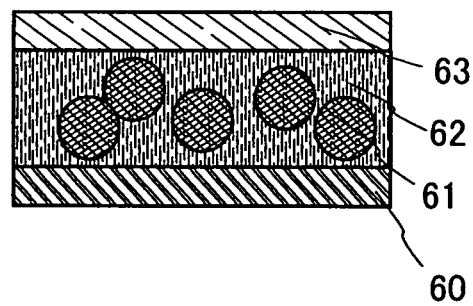
FIGS. 24A to 24C are cross-sectional views each showing a structure of a light emitting element applicable to the present invention.
Figure 24B:
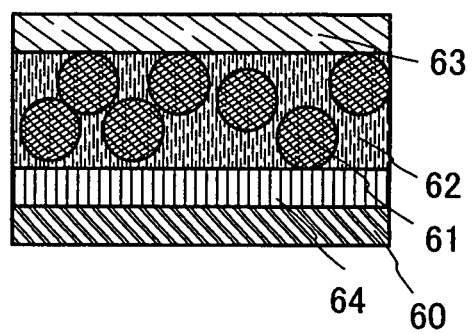
Figure 24C:
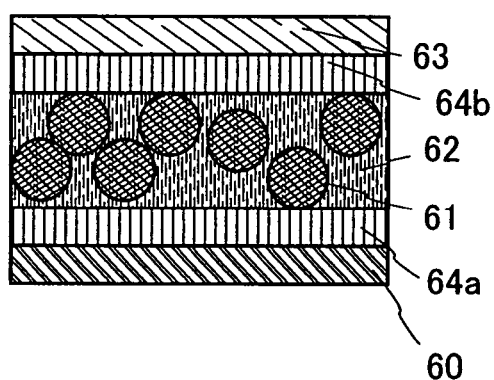

FIGS. 24A to 24C show examples of a dispersed inorganic EL element which can be used as a light emitting element. A light emitting element in FIG. 24A has a stacked structure of a first electrode layer 60, an electroluminescent layer 62, and a second electrode layer 63, and contains a light emitting material 61 held by a binder in the electroluminescent layer 62.

As the binder which can be used in this embodiment mode, an organic material, an inorganic material, or a mixed material of an organic material and an inorganic material can be used. As an organic material, a polymer having a relatively high dielectric constant, such as a cyanoethyl cellulose resin, or a resin such as polyethylene, polypropylene, a polystyrene resin, a silicone resin, an epoxy resin, or vinylidene fluoride can be used. Alternatively, a heat resistant high molecular compound such as aromatic polyamide or polybenzimidazole, or a siloxane resin may be used. Note that the siloxane resin corresponds to a resin including a Si—O—Si bond. Siloxane includes a skeleton formed from a bond of silicon (Si) and oxygen (O). An organic group containing at least hydrogen (for example, an alkyl group or aromatic hydrocarbon) or a fluoro group may be used for a substituent, or an organic group containing at least hydrogen and a fluoro group may be used for substituents. Alternatively, a resin material such as a vinyl resin like polyvinyl alcohol or polyvinylbutyral, a phenol resin, a novolac resin, an acrylic resin, a melamine resin, a urethane resin, or an oxazole resin (polybenzoxazole) may be used. A dielectric constant can be adjusted by appropriately mixing high dielectric constant fine particles of barium titanate ($BaTiO_3$), strontium titanate ($SrTiO_3$), or the like in the above resin.

As an inorganic material included in the binder, a material selected from substances containing inorganic materials can be used, such as silicon oxide ($SiO_X$), silicon nitride ($SiN_X$), silicon containing oxygen and nitrogen, aluminum nitride (AlN), aluminum containing oxygen and nitrogen, aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), or zirconium oxide ($ZrO_2$). A dielectric constant of the electroluminescent layer including the light emitting material and the binder can be controlled by making an organic material contain a high dielectric constant inorganic material (by addition or the like), so that a dielectric constant can be increased. When a mixed layer of an inorganic material and an organic material is used as a binder to obtain high dielectric constant, a higher electric charge can be induced in the light emitting material.

In a producing process, a light emitting material is dispersed in a solution including a binder. As a solvent of the solution including the binder that can be used in this embodiment mode, a solvent in which a binder material is soluble and which can produce a solution having a viscosity suitable for a method for forming the electroluminescent layer (various wet processes) and a desired thickness, may be selected appropriately. An organic solvent or the like can be used. In the case of using, for example, a siloxane resin as the binder, propylene glycol monomethyl ether, propylene glycol monomethyl ether acetate (also referred to as PGMEA), 3-methoxy-3-methyl-1-butanol (also referred to as MMB), or the like can be used.

Each of the light emitting elements shown in FIGS. 24B and 24C has a structure in which an insulating layer is provided between the electrode layer and the electroluminescent layer in the light emitting element in FIG. 24A. The light emitting element shown in FIG. 24B includes an insulating layer 64 between the first electrode layer 60 and the electroluminescent layer 62. The light emitting element shown in FIG. 24C includes an insulating layer 64a between the first electrode layer 60 and the electroluminescent layer 62 and an insulating layer 64b between the second electrode layer 63 and the electroluminescent layer 62. As described above, the insulating layer may be provided between the electroluminescent layer and either or both of the pair of electrodes sandwiching the electroluminescent layer. In addition, the insulating layer may be a single layer or a stack of a plurality of layers.

In FIG. 24B, the insulating layer 64 is provided in contact with the first electrode layer 60. However, the insulating layer 64 may be provided in contact with the second electrode layer 63 by reversing the order of the insulating layer and the electroluminescent layer.

An insulating layer such as the insulating layer 54 in FIGS. 23A to 23C or the insulating layer 64 in FIGS. 24A to 24C is not particularly limited, but it preferably has high withstand voltage and dense film quality. Furthermore, it preferably has a high dielectric constant. For example, a film of silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like, a mixed film thereof, or a stacked film of two or more kinds can be used. These insulating films can be formed by sputtering, evaporation, CVD, or the like. Alternatively, the insulating layer may be formed by dispersing particles of the insulating material in a binder. A binder material may be formed using a material and a method similar to those of the binder included in the electroluminescent layer. The thickness is not particularly limited, but it is preferably in the range of 10 nm to 1000 nm.

The light emitting element described in this embodiment mode, which can provide light emission by applying voltage between a pair of electrode layers sandwiching the electroluminescent layer, can be operated by either DC drive or AC drive.

In the display device of this embodiment mode, an anti-reflection film having a plurality of projections is also provided over a display screen surface of the display device. Accordingly, the number of times of incidence of external light entering the display device on the anti-reflection film is increased; therefore, the amount of external light transmitted through the anti-reflection film is increased. Thus, the amount of external light reflected to a viewer side is reduced, and the cause of a reduction in visibility such as reflection can be eliminated.

Furthermore, since the protective layer is formed between the projections in the present invention, the entry of a contaminant such as dust into between the projections can be prevented. Therefore, a decrease of an anti-reflection function due to entry of dust or the like can be prevented, and physical strength as the anti-reflection film can be increased by filling a space between the projections. Accordingly, reliability can be improved.

The present invention can provide a high-visibility and high-reliability display device having a high anti-reflection function that can further reduce reflection of external light by providing the anti-reflection film having a plurality of projections on its surface and the protective film between the projections. Accordingly, a more high-quality and high-performance display device can be manufactured.

This embodiment mode can be freely combined with any of Embodiment Modes 1 to 3, 5, and 6 as appropriate.

Embodiment Mode 9

This embodiment mode describes a structure of a backlight. A backlight is provided in a display device as a backlight unit having a light source. In the backlight unit, the light source is surrounded by a reflector plate so that light is scattered efficiently.

Figure 16A:
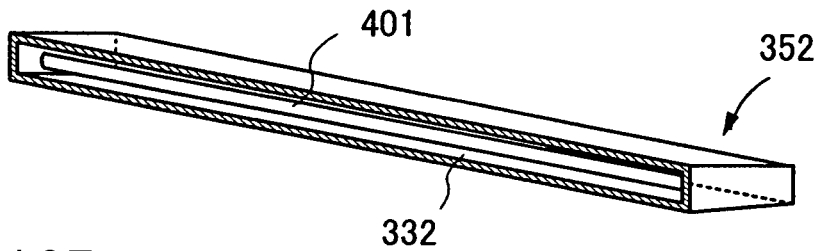
FIGS. 16A to 16D are backlights which can be used in a display device of the present invention.

As shown in FIG. 16A, a cold cathode tube 401 can be used as a light source in a backlight unit 352. In order to efficiently reflect light by the cold cathode tube 401, a lamp reflector 332 can be provided. The cold cathode tube 401 is mostly used for a large-sized display device due to the intensity of the luminance from the cold cathode tube. Therefore, the backlight unit having a cold cathode tube can be used for a display of a personal computer.

Figure 16B:
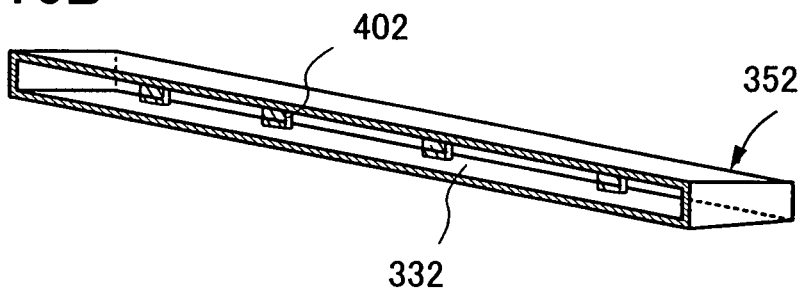

As shown in FIG. 16B, a light emitting diode (LED) 402 can be used as a light source in the backlight unit 352. For example, light emitting diodes (W) 402 emitting light of a white color are arranged at predetermined intervals. In order to efficiently reflect light by the light emitting diode (W) 402, the lamp reflector 332 can be provided.

Figure 16C:
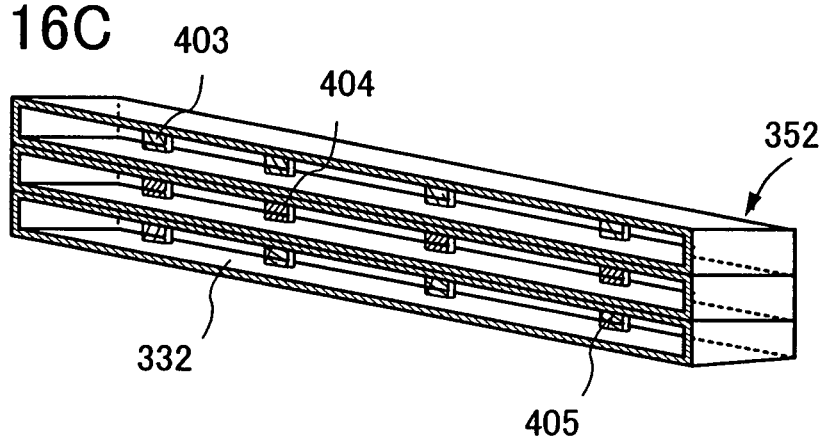

As shown in FIG. 16C, light emitting diodes (LED) 403, 404, and 405 emitting light of colors of RGB can be used as a light source in the backlight unit 352. When the light emitting diodes (LED) 403, 404, and 405 emitting light of colors of RGB are used, color reproducibility can be enhanced as compared with a case when only the light emitting diode (W) 402 emitting light of a white color is used. In order to efficiently reflect light by the light emission diodes, the lamp reflector 332 can be provided.

Figure 16D:
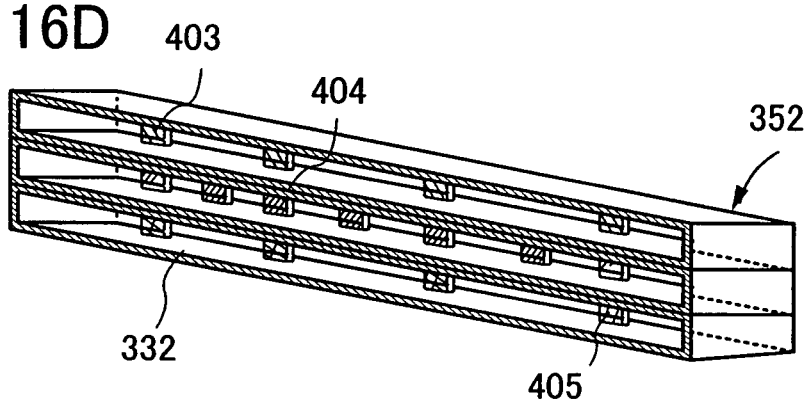

As shown in FIG. 16D, when light emitting diodes (LED) 403, 404, and 405 emitting light of colors of RGB is used as a light source, it is not necessary that the number and arrangement thereof are the same for all. For example, a plurality of light emitting diodes emitting light of a color that has low light emitting intensity (such as green) may be arranged.

Furthermore, the light emitting diode 402 emitting light of a white color and the light emitting diodes (LED) 403, 404, and 405 emitting light of colors of RGB may be combined.

When a field sequential mode is applied in a case of using the light emitting diodes of RGB, color display can be performed by sequentially lighting the light emitting diodes of RGB in accordance with the time.

The light emitting diode is suitable for a large-sized display device because the luminance thereof is high. In addition, color reproducibility of the light emitting diode is superior to that of a cold cathode tube because the color purity of each color of RGB is favorable, and an area required for arrangement can be reduced. Therefore, a narrower frame can be achieved when the light emitting diode is applied to a small-sized display device.

Further, a light source does not need to be provided as the backlight units shown in FIGS. 16A to 16D. For example, when a backlight having a light emitting diode is mounted on a large-sized display device, the light emitting diode can be arranged on the back side of the substrate. In this case, each of the light emitting diodes can be sequentially arranged at predetermined intervals. Color reproducibility can be enhanced in accordance with the arrangement of the light emitting diodes.

By providing a display device using such a backlight with an anti-reflection film having a plurality of projections on its surface, the display device can have a high anti-reflection function that can further reduce reflection of external light and can have high visibility. Accordingly, a more high-quality and high-performance display device can be manufactured. A backlight having a light emitting diode is particularly suitable for a large-sized display device, and a high-quality image can be provided even in a dark place by enhancing the contrast ratio of the large-sized display device.

This embodiment mode can be freely combined with any of Embodiment Modes 1 to 4 as appropriate.

Embodiment Mode 10

Figure 15:
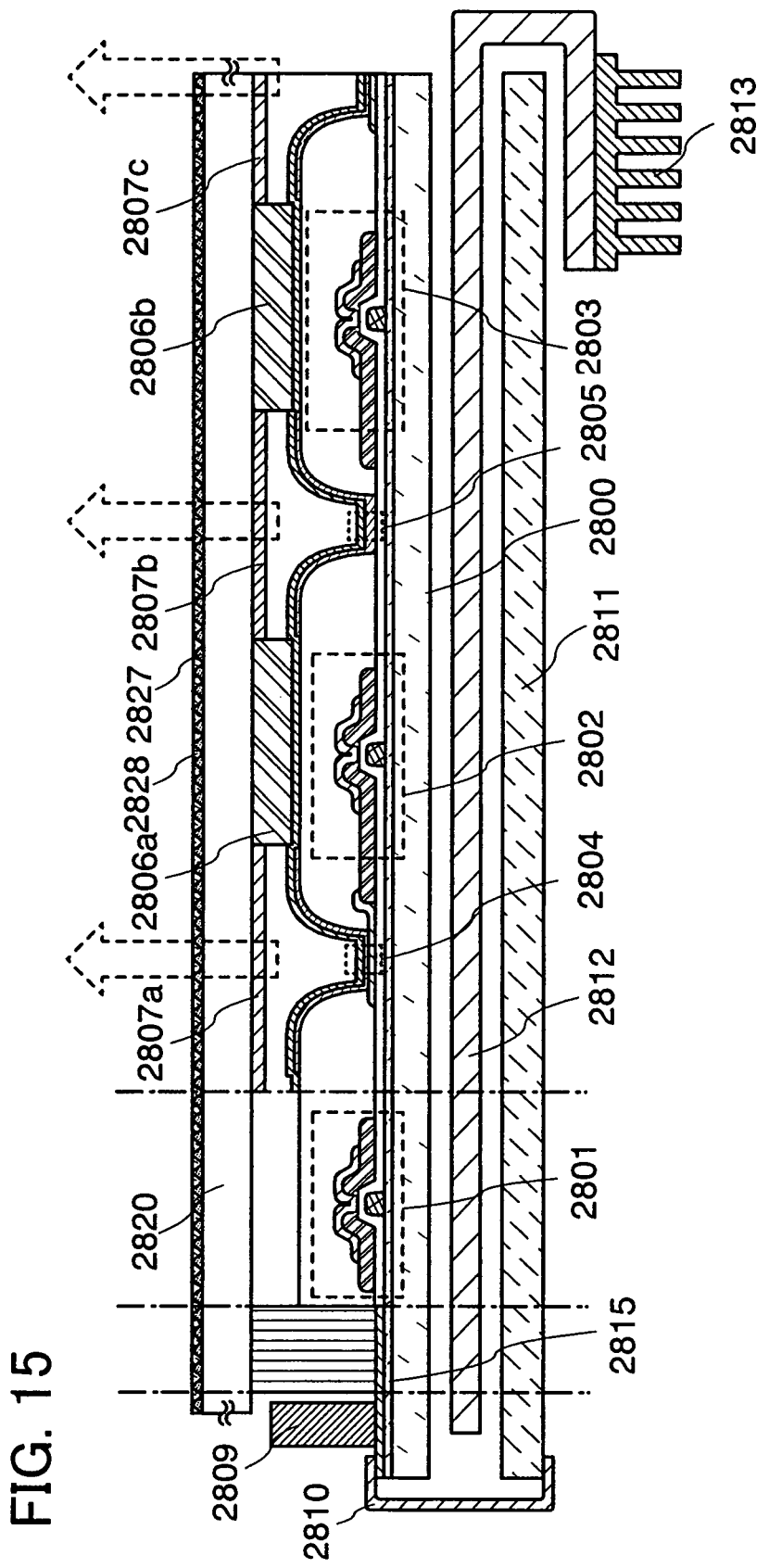
FIG. 15 is a cross-sectional view showing a display module of the present invention.

FIG. 15 shows an example of forming an EL display module manufactured by applying the present invention. In FIG. 15, a pixel portion including pixels is formed over a substrate 2800. A flexible substrate is used as each of the substrate 2800 and a sealing substrate 2820.

In FIG. 15, a TFT which has a similar structure to that formed in the pixel, or a protective circuit portion 2801 operated in a similar manner to a diode by connecting a gate to either a source or a drain of the TFT is provided between a driver circuit and the pixel and outside the pixel portion. A driver IC formed of a single crystalline semiconductor, a stick driver IC formed of a polycrystalline semiconductor film over a glass substrate, a driver circuit formed of a SAS, or the like is applied to a driver circuit 2809.

The substrate 2800 to which an element layer is transferred is fixed to the sealing substrate 2820 with spacers 2806a and 2806b formed by a droplet discharge method interposed therebetween. The spacers are preferably provided to keep a distance between two substrates constant even when the substrate is thin or an area of the pixel portion is enlarged. A space between the substrate 2800 and the sealing substrate 2820 over light emitting elements 2804 and 2805 connected to TFTs 2802 and 2803 respectively may be filled with a light-transmitting resin material and the resin material may be solidified, or may be filled with anhydrous nitrogen or an inert gas. An anti-reflection film 2827 with projections is provided on an outer side of the sealing substrate 2820 which corresponds to a viewer side, and a protective layer 2828 is formed to fill a space between the projections of the anti-reflection film 2827.

FIG. 15 shows a case where the light emitting elements 2804 and 2805 have a top-emission structure, in which light is emitted in the direction of arrows shown in the drawing. Multicolor display can be performed by making the pixels emit light of different colors of red, green, and blue. At this time, color purity of the light emitted outside can be improved by forming colored layers 2807a to 2807c corresponding to respective colors on the sealing substrate 2820 side. Moreover, pixels which emit white light may be used and may be combined with the colored layers 2807a to 2807c.

The driver circuit 2809 which is an external circuit is connected by a wiring board 2810 to a scan line or signal line connection terminal which is provided at one end of an external circuit substrate 2811. In addition, a heat pipe 2813, which is a high-efficiency heat conduction device having a pipe-like shape, and a heat sink 2812 may be provided in contact with or adjacent to the substrate 2800 to enhance a heat dissipation effect.

Note that FIG. 15 shows the top-emission EL module; however, a bottom emission structure may be employed by changing the structure of the light emitting element or the disposition of the external circuit board. Naturally, a dual emission structure in which light is emitted from both the top and bottom surfaces may be used. In the case of the top emission structure, the insulating layer serving as a partition may be colored and used as a black matrix. This partition can be formed by a droplet discharge method and it may be formed by mixing a black resin of a pigment material, carbon black, or the like into a resin material such as polyimide. A stack thereof may alternatively be used.

In addition, reflected light of light which is incident from outside may be blocked by using a retardation plate or a polarizing plate. An insulating layer serving as a partition may be colored and used as a black matrix. This partition can be formed by a droplet discharge method. Carbon black or the like may be mixed into a resin material such as polyimide, and a stack thereof may also be used. By a droplet discharge method, different materials may be discharged to the same region plural times to form the partition. A quarter-wave plate or a half-wave plate may be used as the retardation plate and may be designed to be able to control light. As the structure, a TFT element substrate, the light emitting element, the sealing substrate (sealant), the retardation plate (quarter-wave plate or a half-wave plate), and the polarizing plate are sequentially stacked, through which light emitted from the light emitting element is transmitted and emitted outside from the polarizing plate side. The retardation plate or polarizing plate may be provided on a side where light is emitted or may be provided on both sides in the case of a dual emission display device in which light is emitted from the both surfaces. In addition, an anti-reflection film may be provided on the outer side of the polarizing plate. Accordingly, a more high-definition and accurate image can be displayed.

In this embodiment mode, the anti-reflection film having a plurality of projections is provided over a substrate on a viewer side. In a sealing structure on a side opposite to the viewer side with respect to the element, a sealing structure may be formed by attaching a resin film to the side where the pixel portion is formed, with the use of a sealant or an adhesive resin. Various sealing methods such as resin sealing using a resin, plastic sealing using plastic, and film sealing using a film can be used. A gas barrier film which prevents water vapor from penetrating the resin film is preferably provided over the surface of the resin film. By employing a film sealing structure, further reductions in thickness and weight can be achieved.

In the display device of this embodiment mode, an anti-reflection film having a plurality of projections is also provided over a display screen surface of the display device. Accordingly, the number of times of incidence of external light entering the display device on the anti-reflection film is increased; therefore, the amount of external light transmitted through the anti-reflection film is increased. Thus, the amount of external light reflected to a viewer side is reduced, and the cause of a reduction in visibility such as reflection can be eliminated.

Furthermore, since the protective layer is formed between the projections in the present invention, the entry of a contaminant such as dust into between the projections can be prevented. Therefore, a decrease of an anti-reflection function due to entry of dust or the like can be prevented, and physical strength as the anti-reflection film can be increased by filling a space between the projections. Accordingly, reliability can be improved.

The present invention can provide a high-visibility and high-reliability display device having a high anti-reflection function that can further reduce reflection of external light by providing the anti-reflection film having a plurality of projections on its surface and the protective film between the projections. Accordingly, a more high-quality and high-performance display device can be manufactured.

This embodiment mode can be freely combined with any of Embodiment Modes 1 to 3, and 5 to 8 as appropriate.

Embodiment Mode 11

Figure 14A:
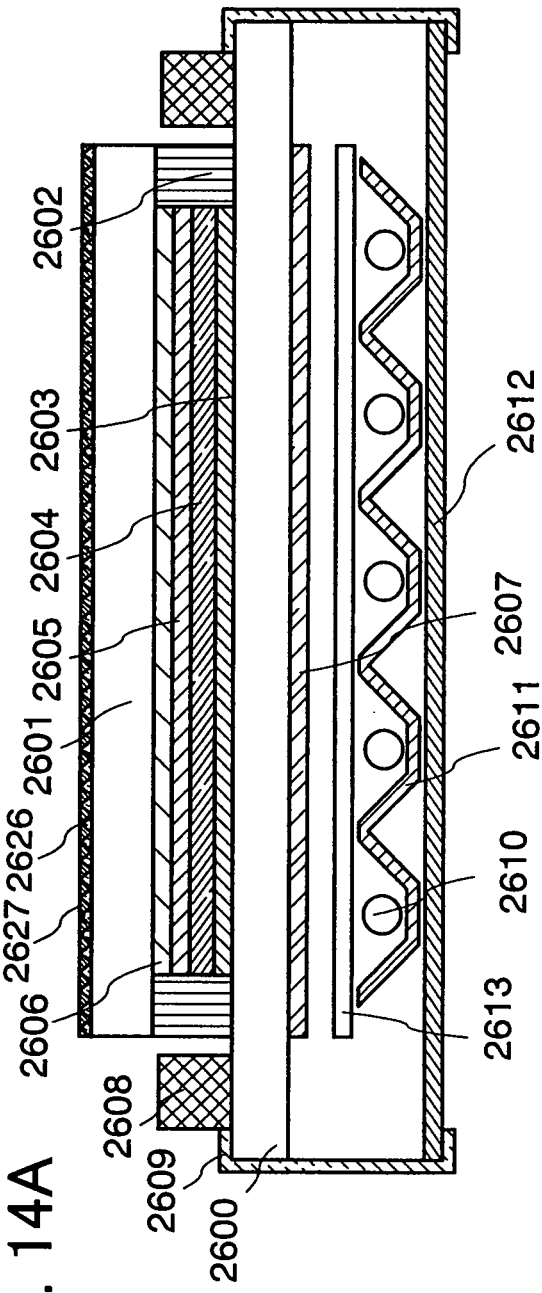
FIGS. 14A and 14B are cross-sectional views each showing a display module of the present invention.
Figure 14B:
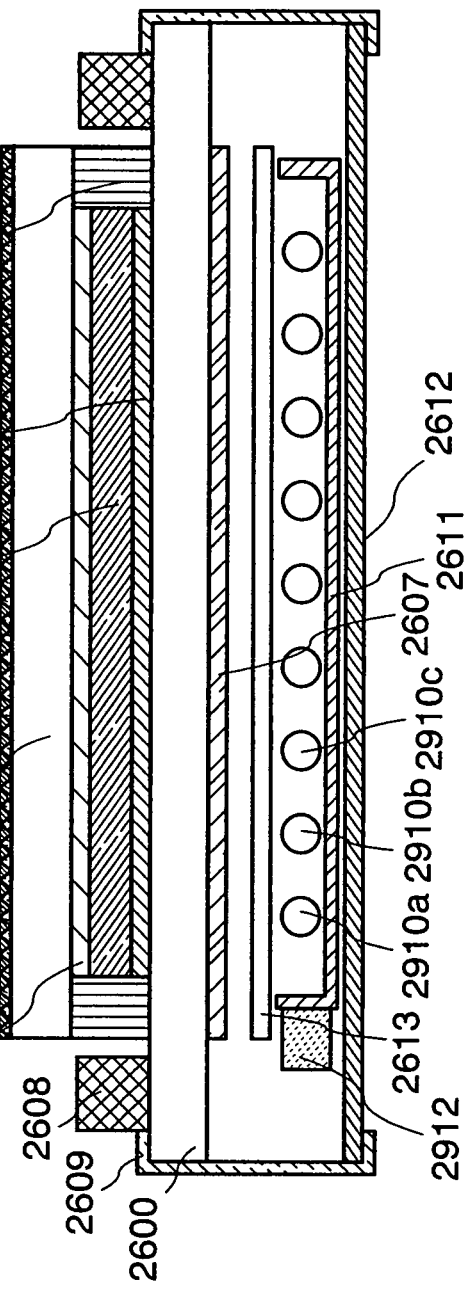

This embodiment mode is described with reference to FIGS. 14A and 14B. FIGS. 14A and 14B show examples of forming a display device (liquid crystal display module) by using a TFT substrate 2600 manufactured in accordance with the present invention.

FIG. 14A shows an example of a liquid crystal display module, in which the TFT substrate 2600 and an opposite substrate 2601 are fixed to each other with a sealant 2602, and a pixel portion 2603 including a TFT, a display element 2604 including a liquid crystal layer, a colored layer 2605, and a polarizing plate 2606 are provided between the substrates to form a display region. The colored layer 2605 is necessary to perform color display. In the case of the RGB system, respective colored layers corresponding to colors of red, green, and blue are provided for respective pixels. A polarizing plate 2607 and a diffuser plate 2613 are provided on an outer side of TFT substrate 2600. A polarizing plate 2606 is provided on an inner side of opposite substrate 2601. An anti-reflection film 2626 is provided on an outer side of opposite substrate 2601. A light source includes a cold cathode tube 2610 and a reflector plate 2611. A circuit board 2612 is connected to the TFT substrate 2600 by a flexible wiring board 2609. External circuits such as a control circuit and a power supply circuit are incorporated in the circuit board 2612. The polarizing plate and the liquid crystal layer may be stacked with a retardation plate interposed therebetween. In this embodiment mode, the anti-reflection film 2626 is an anti-reflection film including a protective layer 2627 so as to fill a space between the projections.

The display device in FIG. 14A is an example in which the anti-reflection film 2626 is provided on an outer side of the opposite substrate 2601, and the polarizing plate 2606 and the colored layer 2605 are sequentially provided on an inner side. However, the polarizing plate 2606 may be provided on the outer side of the opposite substrate 2601 (on a viewer side), and in that case, the anti-reflection film 2626 may be provided over a surface of the polarizing plate 2606. The stacked structure of the polarizing plate 2606 and the colored layer 2605 is also not limited to that shown in FIG. 14A and may be appropriately set depending on materials of the polarizing plate 2606 and the colored layer 2605 or conditions of manufacturing steps.

The liquid crystal display module can employ a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Micro-cell) mode, an OCB (Optical Compensated Birefringence) mode, an FLC (Ferroelectric Liquid Crystal) mode, an AFLC (Anti Ferroelectric Liquid Crystal) mode, or the like.

FIG. 14B shows an example of applying an OCB mode to the liquid crystal display module of FIG. 14A, so that this liquid crystal display module is an FS-LCD (Field Sequential-LCD). The FS-LCD performs red, green, and blue light emissions in one frame period. Color display can be performed by composing an image by a time division method. Also, emission of each color is performed using a light emitting diode, a cold cathode tube, or the like; hence, a color filter is not required. There is no necessity for arranging color filters of three primary colors and limiting a display region of each color. Display of all three colors can be performed in any region. On the other hand, light emission of three colors is performed in one frame period; therefore, high speed response of liquid crystal is needed. When an FLC mode using an FS system and the OCB mode are applied to the display device of the present invention, a display device or a liquid crystal television device having higher performance and high image quality can be completed.

A liquid crystal layer of the OCB mode has, what is called, a $\pi$ cell structure. In the it cell structure, liquid crystal molecules are oriented such that pretilt angles of the molecules are symmetrical with respect to the center plane between the active matrix substrate and the opposite substrate. The orientation in the $\pi$ cell structure is a splay orientation when a voltage is not applied between the substrates, and shifts into a bend orientation when the voltage is applied. White display is performed in this bend orientation. Further voltage application makes the liquid crystal molecules in the bend orientation orientated perpendicular to the substrates, which does not allow light to pass therethrough. Note that a response speed approximately ten times as high as that of a conventional TN mode can be achieved by using the OCB mode.

Further, as a mode corresponding to the FS system, an HV (Half V)-FLC, an SS (Surface Stabilized)-FLC, or the like using a ferroelectric liquid crystal (FLC) that can be operated at high speed can also be used. A nematic liquid crystal that has relatively low viscosity can be used for the OCB mode. A smectic liquid crystal that has a ferroelectric phase can be used for the HV-FLC or the SS-FLC.

An optical response speed of the liquid crystal display module is increased by narrowing a cell gap of the liquid crystal display module. Alternatively, the optical response speed can be increased by lowering the viscosity of the liquid crystal material. The above method of increasing the optical response speed is more effective when a pixel pitch of a pixel region of a TN-mode liquid crystal display module is 30 μm or less. The optical response speed can be further increased by an overdrive method in which an applied voltage is increased (or decreased) only for a moment.

The liquid crystal display module of FIG. 14B is a transmissive liquid crystal display module, in which a red light source 2910a, a green light source 2910b, and a blue light source 2910c are provided as light sources. A control portion 2912 is provided in the liquid crystal display module to separately control the red light source 2910a, the green light source 2910b, and the blue light source 2910c to be turned on or off. The light emission of each color is controlled by the control portion 2912, and light enters the liquid crystal to compose an image using the time division, thereby performing color display.

In the display device of this embodiment mode, an anti-reflection film having a plurality of projections is also provided over a display screen surface of the display device. Accordingly, the number of times of incidence of external light entering the display device on the anti-reflection film is increased; therefore, the amount of external light transmitted through the anti-reflection film is increased. Thus, the amount of external light reflected to a viewer side is reduced, and the cause of a reduction in visibility such as reflection can be eliminated.

Furthermore, since the protective layer is formed between the projections in the present invention, the entry of a contaminant such as dust into between the projections can be prevented. Therefore, a decrease of an anti-reflection function due to entry of dust or the like can be prevented, and physical strength as the anti-reflection film can be increased by filling a space between the projections. Accordingly, reliability can be improved.

The present invention can provide a high-visibility and high-reliability display device having a high anti-reflection function that can further reduce reflection of external light by providing the anti-reflection film having a plurality of projections on its surface and the protective film between the projections. Accordingly, a more high-quality and high-performance display device can be manufactured.

This embodiment mode can be freely combined with any of Embodiment Modes 1 to 4, and 9 as appropriate.

Embodiment Mode 12

Figure 19:
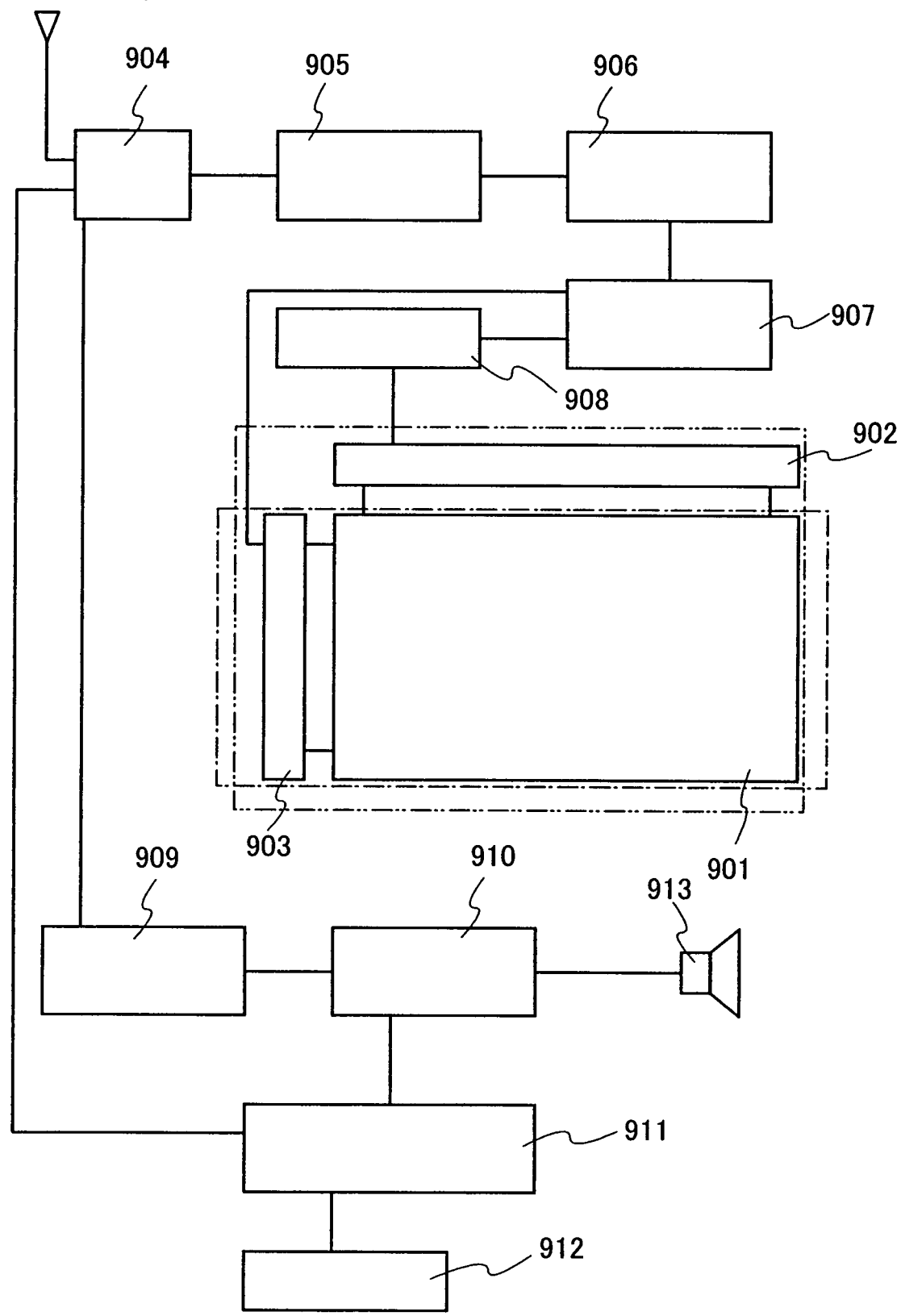
FIG. 19 is a block diagram showing main components of an electronic device to which the present invention is applied.

With the display device formed by the present invention, a television device (also referred to as simply a television, or a television receiver) can be completed. FIG. 19 is a block diagram showing main components of the television device.

Figure 17A:
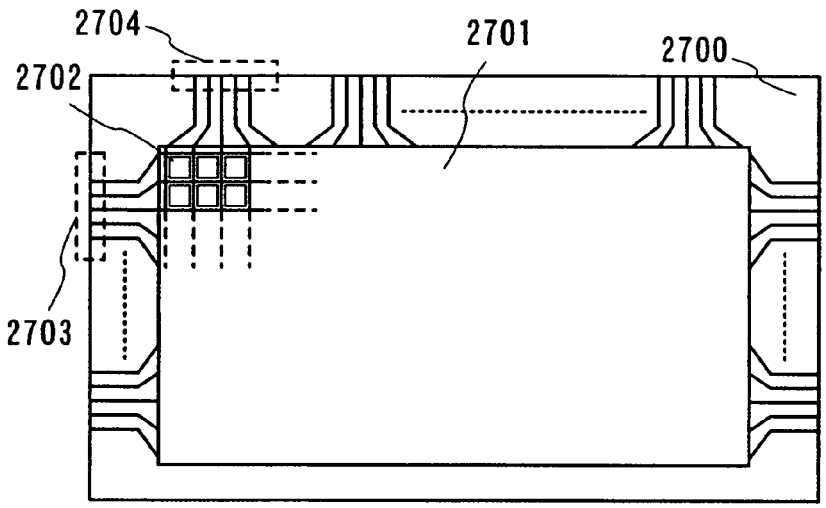
FIGS. 17A to 17C are top views each showing a display device of the present invention.

FIG. 17A is a top view showing a structure of a display panel according to the present invention. A pixel portion 2701 in which pixels 2702 are arranged in matrix, a scan line input terminal 2703, and a signal line input terminal 2704 are formed over a substrate 2700 having an insulating surface. The number of pixels may be determined in accordance with various standards. In a case of XGA full-color display using RGB, the number of pixels may be 1024×768×3 (RGB). In a case of UXGA full-color display using RGB, the number of pixels may be 1600×1200×3 (RGB), and in a case of full-spec, high-definition, and full-color display using RGB, the number may be 1920×1080×3 (RGB).

The pixels 2702 are formed in matrix by intersections of scan lines extended from the scan line input terminal 2703 and signal lines extended from the signal line input terminal 2704. Each pixel 2702 in the pixel portion 2701 is provided with a switching element and a pixel electrode layer connected thereto. A typical example of the switching element is a TFT. A gate electrode layer of the TFT is connected to the scan line, and a source or a drain of the TFT is connected to the signal line, which enables each pixel to be independently controlled by a signal inputted from the outside.

Figure 18A:
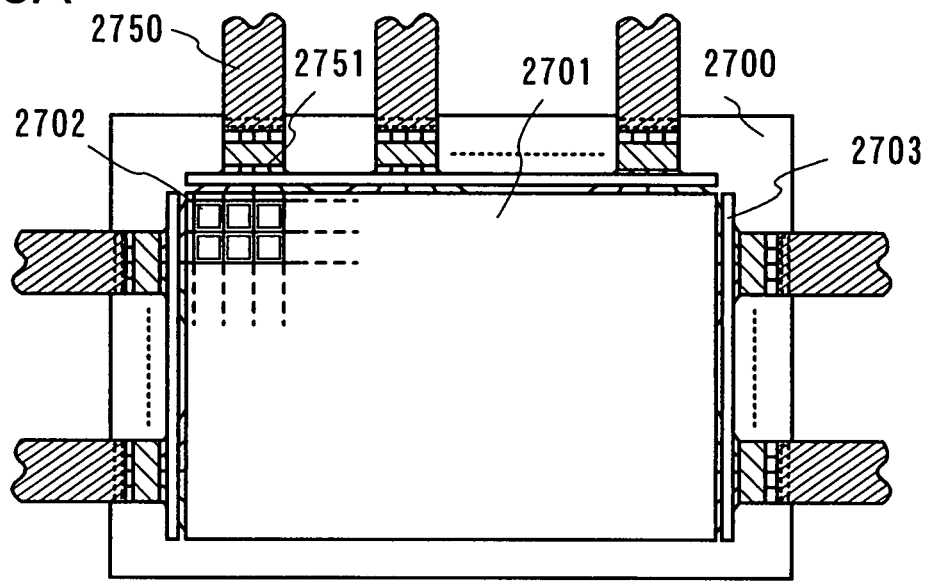
FIGS. 18A and 18B are top views each showing a display device of the present invention.
Figure 18B:
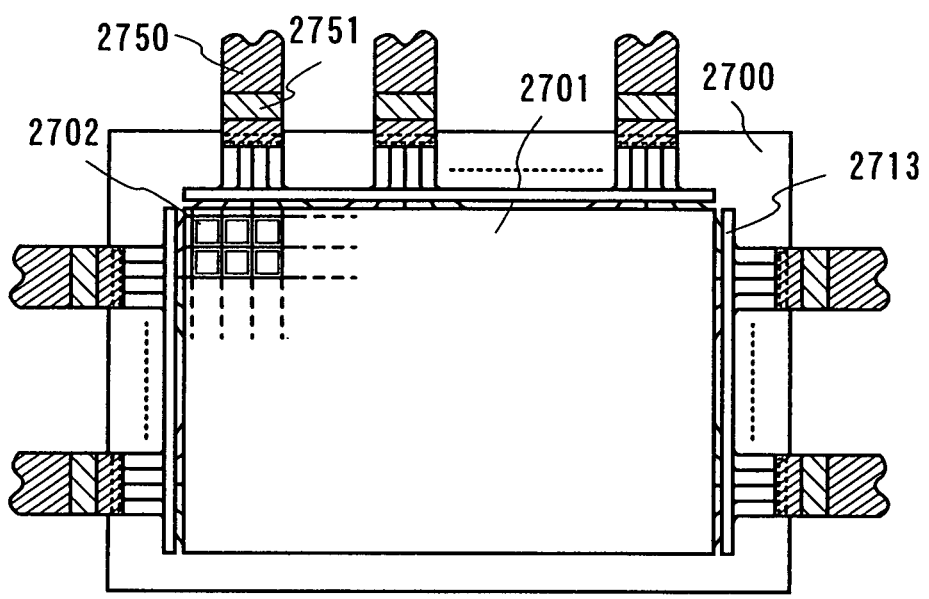

FIG. 17A shows a structure of a display panel in which a signal to be inputted to the scan line and the signal line is controlled by an external driver circuit. Alternatively, a driver IC 2751 may be mounted on the substrate 2700 by a COG (Chip On Glass) method as shown in FIG. 18A. As another mounting mode, a TAB (Tape Automated Bonding) method may be used as shown in FIG. 18B. The driver IC may be formed over a single crystalline semiconductor substrate or may be formed using a TFT over a glass substrate. In each of FIGS. 18A and 18B, the driver IC 2751 is connected to an FPC (Flexible Printed Circuit) 2750.

Figure 17B:
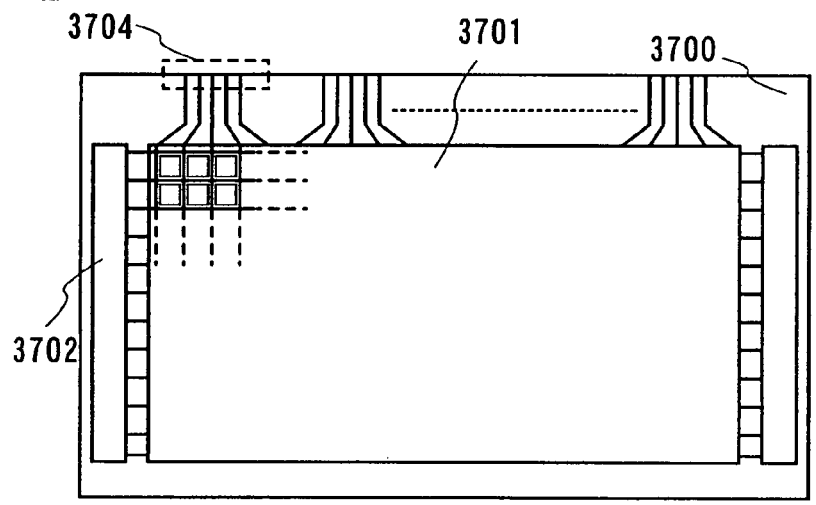

When a TFT provided in a pixel is formed of a crystalline semiconductor, a scan line driver circuit 3702 can be formed over a substrate 3700 as shown in FIG. 17B. In FIG. 17B, a pixel portion 3701 is controlled by an external driver circuit connected to a signal line input terminal 3704, similarly to FIG. 17A. When the TFT provided in a pixel is formed of a polycrystalline (microcrystalline) semiconductor, a single crystalline semiconductor, or the like having high mobility, a pixel portion 4701, a scan line driver circuit 4702, and a signal line driver circuit 4704 can all be formed over a glass substrate 4700 as shown in FIG. 17C.

Figure 17C:
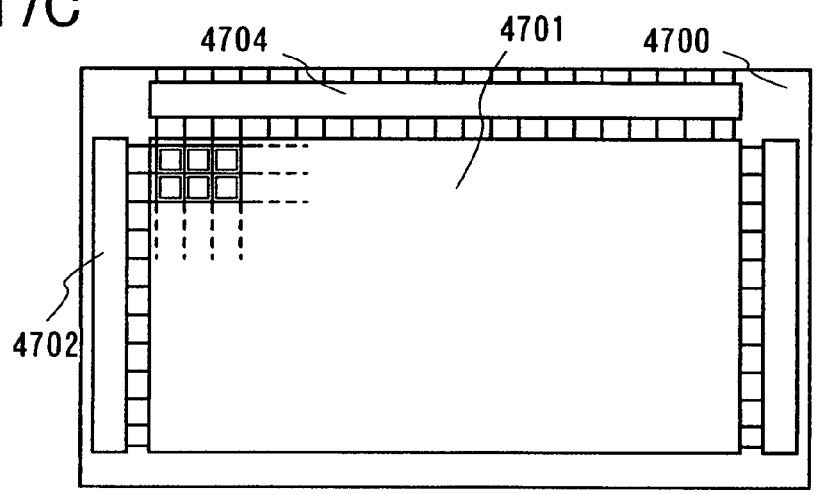

As for the display panel, there are the following cases: a case in which only a pixel portion 901 is formed as shown in FIG. 17A and a scan line driver circuit 903 and a signal line driver circuit 902 are mounted by a TAB method as shown in FIG. 18B; a case in which the scan line driver circuit 903 and the signal line driver circuit 902 are mounted by a COG method as shown in FIG. 18A; a case in which a TFT is formed as shown in FIG. 17B, the pixel portion 901 and the scan line driver circuit 903 are formed over a substrate, and the signal line driver circuit 902 is separately mounted as a driver IC; a case in which the pixel portion 901, the signal line driver circuit 902, and the scan line driver circuit 903 are formed over a substrate as shown in FIG. 17C; and the like. The display panel may have any of the structures.

As another external circuit in FIG. 19, a video signal amplifier circuit 905 which amplifies a video signal among signals received by a tuner 904, a video signal processing circuit 906 which converts the signals outputted from the video signal amplifier circuit 905 into chrominance signals corresponding to respective colors of red, green, and blue, a control circuit 907 which converts the video signal into an input specification of the driver IC, and the like are provided on an input side of the video signal. The control circuit 907 outputs signals to both a scan line side and a signal line side. In the case of digital drive, a signal dividing circuit 908 may be provided on the signal line side and an input digital signal may be divided into m pieces and supplied.

An audio signal among signals received by the tuner 904 is sent to an audio signal amplifier circuit 909 and is supplied to a speaker 913 through an audio signal processing circuit 910. A control circuit 911 receives control information of a receiving station (reception frequency) or sound volume from an input portion 912 and transmits signals to the tuner 904 and the audio signal processing circuit 910.

A television device can be completed by incorporating the display module into a chassis as shown in FIGS. 20A and 20B. When a liquid crystal display module is used as a display module, a liquid crystal television device can be manufactured. When an EL display module is used, an EL television device can be manufactured. Alternatively, a plasma television, electronic paper, or the like can be manufactured. In FIG. 20A, a main screen 2003 is formed by using the display module, and a speaker portion 2009, an operation switch, and the like are provided as its accessory equipment. Thus, a television device can be completed in accordance with the present invention.

A display panel 2002 is incorporated in a chassis 2001, and general TV broadcast can be received by a receiver 2005. When the display device is connected to a communication network by wired or wireless connections via a modem 2004, one-way (from a sender to a receiver) or two-way (between a sender and a receiver or between receivers) information communication can be performed. The television device can be operated by using a switch built in the chassis 2001 or a remote control unit 2006. A display portion 2007 for displaying output information may also be provided in the remote control device 2006.

Further, the television device may include a sub screen 2008 formed using a second display panel so as to display channels, volume, or the like, in addition to the main screen 2003. In this structure, both the main screen 2003 and the sub screen 2008 can be formed using the liquid crystal display panel of the present invention. Alternatively, the main screen 2003 may be formed using an EL display panel having a wide viewing angle, and the sub screen 2008 may be formed using a liquid crystal display panel capable of displaying images with less power consumption. In order to reduce the power consumption preferentially, the main screen 2003 may be formed using a liquid crystal display panel, and the sub screen may be formed using an EL display panel, which can be switched on and off. In accordance with the present invention, a high-reliability display device can be formed even when a large-sized substrate is used and a large number of TFTs or electronic components are used.

FIG. 20B shows a television device having a large-sized display portion, for example, a 20-inch to 80-inch display portion. The television device includes a chassis 2010, a display portion 2011, a remote control device 2012 that is an operation portion, a speaker portion 2013, and the like. The present invention is applied to manufacturing of the display portion 2011. Since the television device in FIG. 20B is a wall-hanging type, it does not require a large installation space.

Naturally, the present invention is not limited to the television device, and can be applied to various use applications as a large-sized display medium such as an information display board at a train station, an airport, or the like, or an advertisement display board on the street, as well as a monitor of a personal computer.

This embodiment mode can be freely combined with any of Embodiment Modes 1 to 11 as appropriate.

Embodiment Mode 13

Examples of electronic devices in accordance with the present invention are as follows: a television device (also referred to as simply a television, or a television receiver), a camera such as a digital camera or a digital video camera, a cellular telephone device (simply also referred to as a cellular phone or a cell-phone), an information terminal such as PDA, a portable game machine, a computer monitor, a computer, a sound reproducing device such as a car audio system, an image reproducing device including a recording medium, such as a home-use game machine, and the like. Preferred modes of them are described with reference to FIGS. 21A to 21E.

Figure 21A:
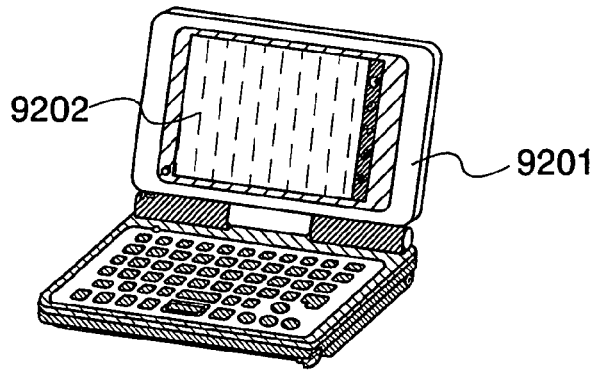
FIGS. 21A to 21E are diagrams each showing an electronic device of the present invention.

A portable information terminal device shown in FIG. 21A includes a main body 9201, a display portion 9202, and the like. The display device of the present invention can be applied to the display portion 9202. As a result, a high-performance portable information terminal device which can display a high-quality image with high visibility can be provided.

Figure 21B:
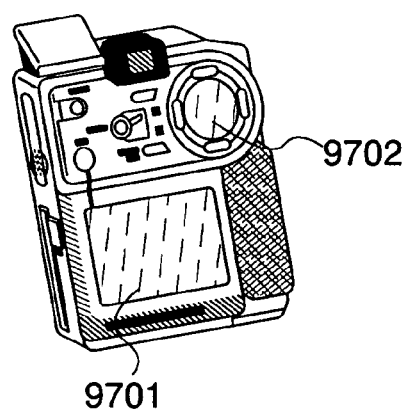

A digital video camera shown in FIG. 21B includes a display portion 9701, a display portion 9702, and the like. The display device of the present invention can be applied to the display portion 9701. As a result, a high-performance digital video camera which can display a high-quality image with high visibility can be provided.

Figure 21C:
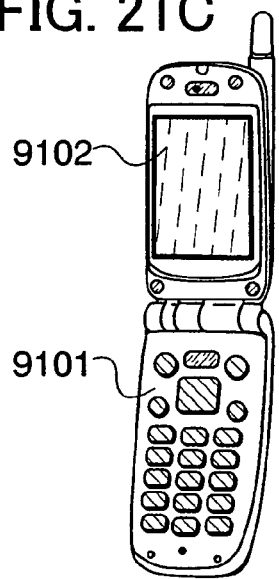

A cellular phone shown in FIG. 21C includes a main body 9101, a display portion 9102, and the like. The display device of the present invention can be applied to the display portion 9102. As a result, a high-performance cellular phone which can display a high-quality image with high visibility can be provided.

Figure 21D:
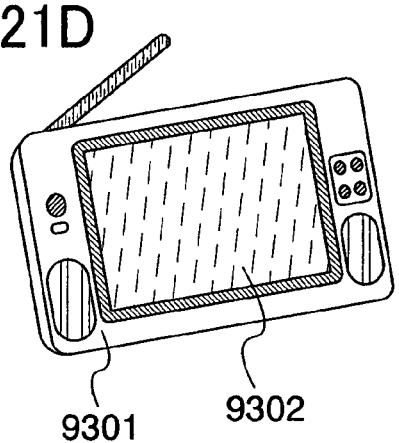

A portable television device shown in FIG. 21D includes a main body 9301, a display portion 9302 and the like. The display device of the present invention can be applied to the display portion 9302. As a result, a high-performance portable television device which can display a high-quality image with high visibility can be provided. The display device of the present invention can be applied to a wide range of television devices ranging from a small-sized television device mounted on a portable terminal such as a cellular phone, a medium-sized television device which can be carried, to a large-sized (for example, 40-inch or larger) television device.

Figure 21E:
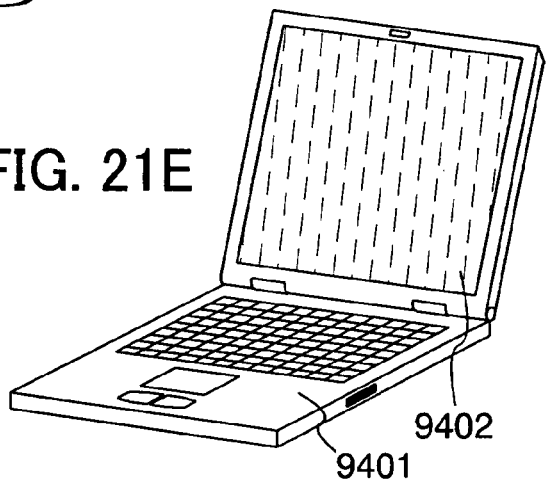

A portable computer shown in FIG. 21E includes a main body 9401, a display portion 9402, and the like. The display device of the present invention can be applied to the display portion 9402. As a result, a high-performance portable computer which can display a high-quality image with high visibility can be provided.

As described above, a high-performance electronic device which can display a high-quality image with high visibility can be provided by using the display device of the present invention.

This embodiment mode can be freely combined with any of Embodiment Modes 1 to 12.

Embodiment 1

This embodiment describes the result of optical calculation of the anti-reflection film used in the present invention. In addition, the optical calculation of an anti-reflection film having a stacked structure was also performed for comparison. In this embodiment, the description is given with reference to Tables 1 and 2 and FIGS. 26 to 30.

The calculation in this embodiment was performed using an optical calculation simulator for optical devices, Full-WAVE (manufactured by RSoft Design Group, Inc.). The reflectance was calculated by 2D optical calculation.

Figure 26:
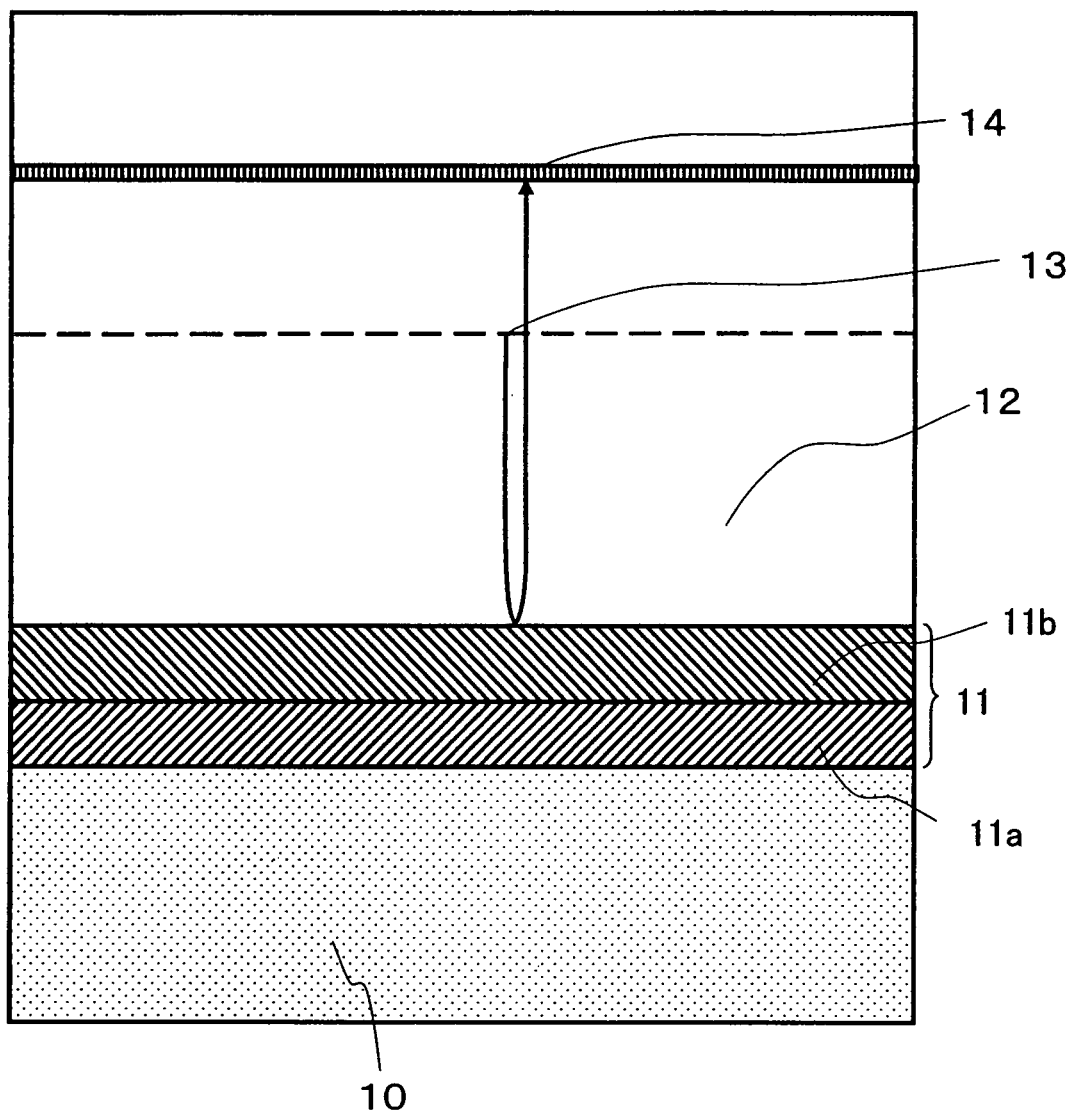
FIG. 26 is a diagram showing an experimental model of a comparative example.

As a comparative example, the reflection of external light by an anti-reflection film with a multilayer structure which is formed by a stack of a low refractive index layer and a high refractive index layer was calculated. As the comparative example, an anti-reflection film 11 including a high refractive index layer 11a (n=1.9) and a low refractive index layer 11b (n=1.34) is formed over a glass substrate 10 (n=1.52, reflectance: 4%), and a surface of the low refractive index layer 11b is exposed to air 12 (n=1.0) as shown in FIG. 26. Table 1 shows the components, each reflectance, and each thickness of the comparative example.

TABLE 1

| COMPONENTS | REFLECTANCE | THICKNESS[μm] |
|---|---|---|
| AIR 12 | 1 | ∞ |
| LOW REFRACTIVE INDEX LAYER 11b(Q: λ/4) | 1.34 | 0.103 |
| HIGH REFRACTIVE INDEX LAYER 11a(H: λ/2) | 1.9 | 0.145 |
| GLASS SUBSTRATE 10 | 1.52 | ∞ |

Note that the high refractive index layer 11a is a thin film in which an optical path length (actual distance×refractive index) is set to a quarter of a wavelength λ of 550 nm having high luminous efficacy (the thin film is also referred to as Q: quarter-wave film), and the low refractive index layer 11b is a thin film in which an optical path length (actual distance× refractive index) is set to a half of a wavelength of 550 nm having high luminous efficacy (the thin film is also referred to as H: half-wave film). Therefore, the anti-reflection film 11 is a so-called QH type anti-reflection film. Light that corresponds to external light is perpendicularly incident on the glass substrate 10 and the anti-reflection film 11 from above through air, and reflected light that is reflected by the glass substrate 10 and the anti-reflection film 11 to the air side was detected by a monitor 14. Light emitted from a light source 13 passes through an air layer and is incident on the low refractive index layer 11b, the high refractive index layer 11a, and the glass substrate 10.

Figure 27:
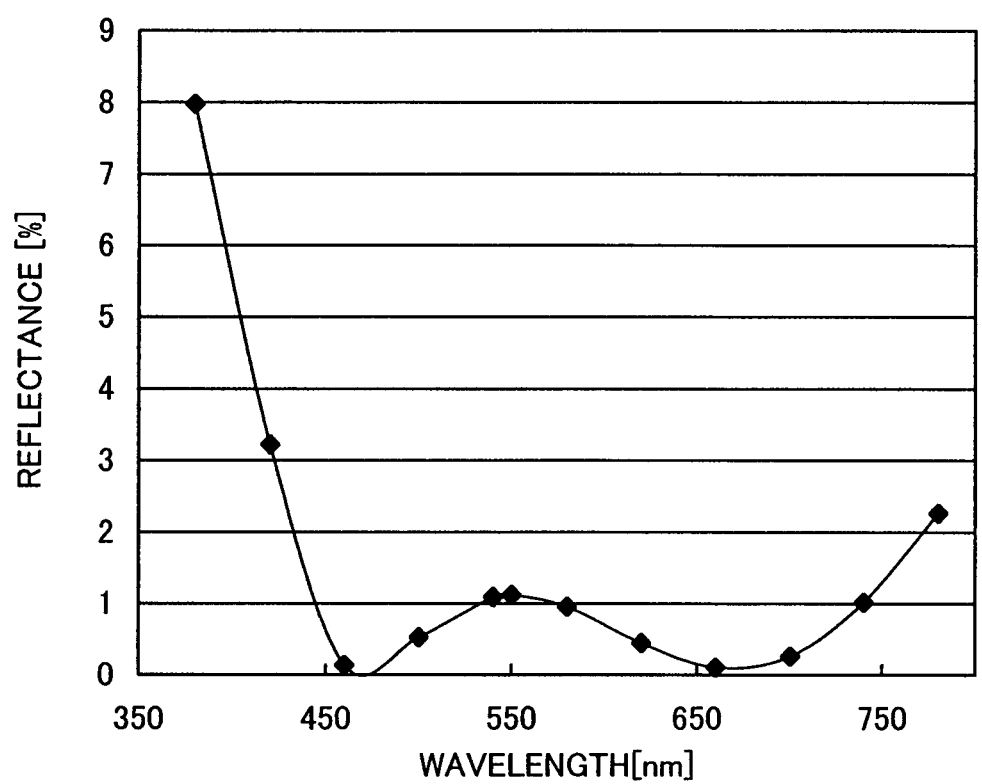
FIG. 27 is a diagram showing experimental data of a comparative example.

FIG. 27 shows the relationship between a wavelength and a reflectance in the comparative example. As shown in FIG. 27, the reflectance is not constant in a measured wavelength range from 380 nm to 780 nm which corresponds to a visible light range, and wavelength dependence can be observed. The reflectance is 1% or less at a wavelength of approximately 450 nm to 750 nm, whereas the reflectance is increased in a short-wavelength range of 450 nm or less and a long-wavelength range of 750 nm or more. This increase in reflectance was particularly noticeable at a short wavelength of 450 nm or less, or ultraviolet light. In a case of such a stacked structure as the comparative example, it is confirmed that it is difficult to obtain constant low reflectance in a measured wavelength range of 380 nm to 780 nm which corresponds to a visible light range and it is only possible to decrease the reflectance by approximately 1% even in the vicinity of 550 nm.

Figure 28:
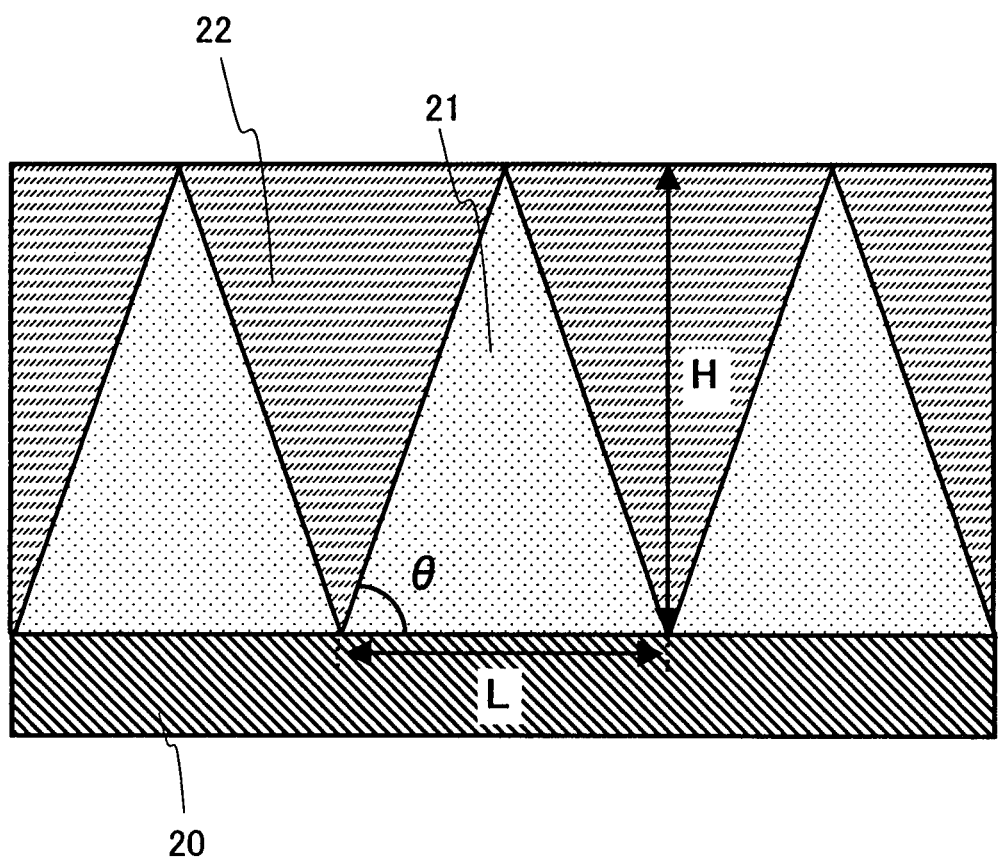
FIG. 28 is a diagram showing an experimental model of Embodiment 1.

The reflection of external light by the anti-reflection film having projections on its surface using the present invention was calculated. In this embodiment, a plurality of adjacent conical projections are used as samples A1 to A8, and each projection is an isosceles triangle in a cross section perpendicular to the base, as shown in FIG. 28. In FIG. 28, projections 21 and a protective layer 22 filling a space between the projections are provided over a substrate 20. As shown in the cross-sectional view, an angle θ is determined depending on a ratio of a cone height H to a base diameter L. The samples A1 to A8 respectively have ratios of cone heights H to base diameters L of 29:1, 10:1, 9.5:1, 5.7:1, 4.1:1, 2.8:1, 2.4:1, and 1.9:1 and have angles θ of 89, 87.2, 87, 85, 83, 80, 78, and 75 (deg.). Reflectances of light corresponding to external light, which is incident on the samples A1 to A8 and reflected by the anti-reflection films each having projections, were calculated. Table 2 shows the angles θ, the heights H: the diameters (bases) L, the heights H, and the diameters (bases) L in cross-sections of the samples A1 to A8.

TABLE 2

| STRUCTURE OF PROJECTIONS | A1 | A2 | A3 | A4 | A5 | A6 | A7 | A8 |
|---|---|---|---|---|---|---|---|---|
| θ [deg] | 89 | 87.2 | 87 | 85 | 83 | 80 | 78 | 75 |
| H [μm] | 2.864 | 1.022 | 0.954 | 0.572 | 0.407 | 0.284 | 0.235 | 0.187 |
| L [μm] | 0.1 | 0.1 | 0.1 | 0.1 | 0.1 | 0.1 | 0.1 | 0.1 |
| H:L | 29:1 | 10:1 | 9.5:1 | 5.7:1 | 4.1:1 | 2.8:1 | 2.4:1 | 1.9:1 |

Each projection was made of silicon nitride containing oxygen. A refractive index thereof was set relative to a wavelength of light (for example, a refractive index, 1.48 (a wavelength, 380 nm), 1.47 (a wavelength, 550 nm), or 1.46 (a wavelength, 780 nm). A substrate provided with the anti-reflection film with projections was a glass substrate (with a refractive index of 1.52), and a refractive index of the protective layer was 1.05.

Figure 29:
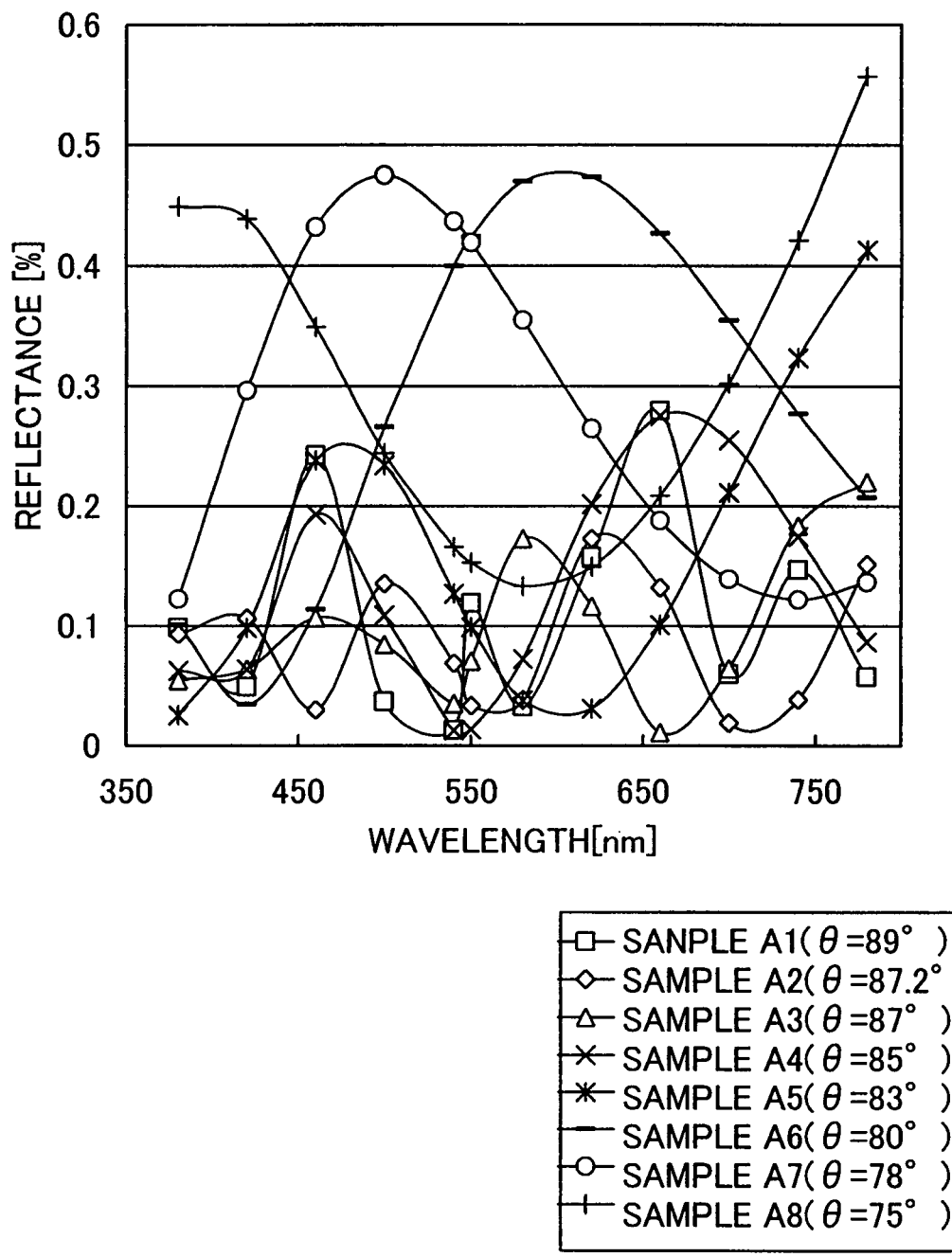
FIG. 29 is a diagram showing experimental data of Embodiment 1.
Figure 30:
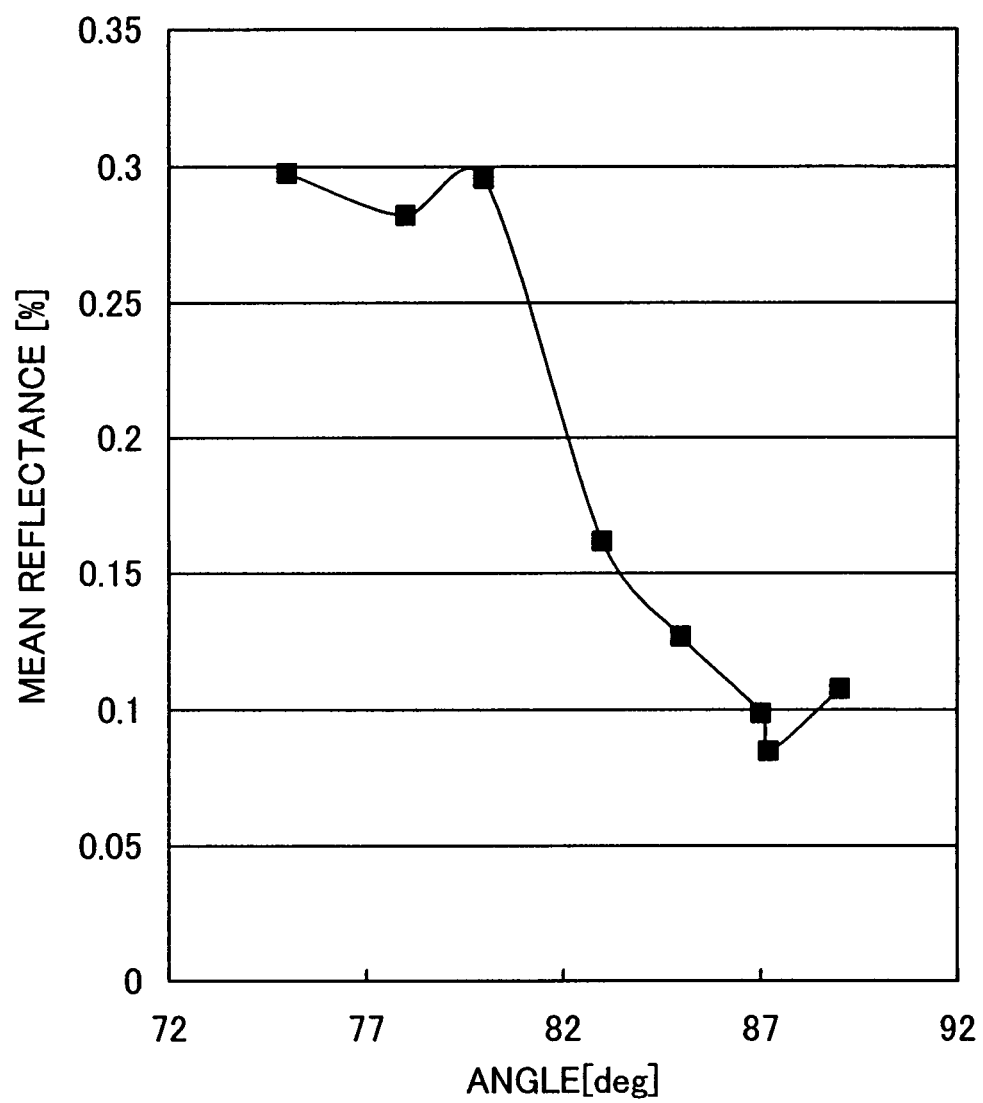
FIG. 30 is a diagram showing experimental data of Embodiment 1.

FIG. 29 shows the relationship between a wavelength of external light and each reflectance of the samples A1 to A8. As shown in FIG. 29, each reflectance of the samples A1 to A5 was approximately 0.4% or less in a measured visible light wavelength range (380 nm to 700 nm), whereas each reflectance of the samples A6 to A8 was approximately 0.2% or more in the visible light wavelength range and was high, approximately 0.4% to 0.6%, at certain wavelength. FIG. 30 is a graph showing the result of FIG. 29 in the relationship between an angle of an oblique line of each projection and a mean reflectance at the measured wavelength. The sample A1 has an angle of 89°; the sample A2, 87.2°; the sample A3, 87°; the sample A4, 85°; the sample A5, 83°; the sample A6, 80°; the sample A7, 78°; and the sample A8, 75°. The mean reflectance is 0.15% or less at an angle of 84° or more and less than 90°, whereas the mean reflectance is sharply increased at 82° and 80° up to approximately 0.3%. From this result, the reflection of external light can be reduced to 0.15% or less when the angle of an oblique line of each projection is equal to or greater than 84° and less than 90°. Thus, it is confirmed that the anti-reflection film of the present invention can exert a high anti-reflection effect.

Embodiment 2

In this embodiment, the reflection of external light by the anti-reflection film with projections on its surface using the present invention was calculated. This embodiment is described with reference to Table 3, and FIGS. 31 and 32.

The reflection of external light by the anti-reflection film with projections on its surface using the present invention was calculated. Also in this embodiment, a plurality of adjacent conical projections are used as samples B similarly to Embodiment 1, and each projection is an isosceles triangle in a cross section perpendicular to the base, as shown in FIG. 28. As shown in the cross-sectional view, an angle θ is determined depending on a ratio of a cone height H to a base diameter L. Samples B1 to B6 respectively have cone heights H of 1 μm, 1.5 μm, 2.0 μm, 2.25 μm, 2.5 μm, and 3.0 μm and accordingly have base diameters L of 0.1 μm, 0.15 μm, 0.20 μm, 0.225 μm, 0.25 μm, and 0.30 μm so that each ratio of the cone height H to the base diameter L is 10:1 and the angle θ is kept constant at 87.2 (deg.) where low reflectance is exhibited in FIG. 30. Reflectances of light corresponding to external light, which is incident on the samples B1 to B6 and reflected by the anti-reflection films each having projections, were calculated. Table 3 shows the angles θ, the heights H: the diameters (bases) L, the heights H, and the diameters (bases) L in cross-sections of the samples B1 to B6.

TABLE 3

| STRUCTURE OF PROJECTIONS | B1 | B2 | B3 | B4 | B5 | B6 |
|---|---|---|---|---|---|---|
| θ [deg] | 87.2 | 87.2 | 87.2 | 87.2 | 87.2 | 87.2 |
| H:L | 10:1 | 10:1 | 10:1 | 10:1 | 10:1 | 10:1 |
| H [μm] | 1.0 | 1.5 | 2 | 2.25 | 2.5 | 3 |
| L [μm] | 0.10 | 0.15 | 0.20 | 0.225 | 0.25 | 0.30 |

Each projection was made of silicon nitride containing oxygen. A refractive index thereof was set relative to a wavelength of light (for example, a refractive index, 1.48 (a wavelength, 380 nm), 1.47 (a wavelength, 550 nm), or 1.46 (a wavelength, 780 nm). A substrate provided with the anti-reflection film with projections was a glass substrate (with a refractive index of 1.52), and a refractive index of the protective layer was 1.05.

Figure 31:
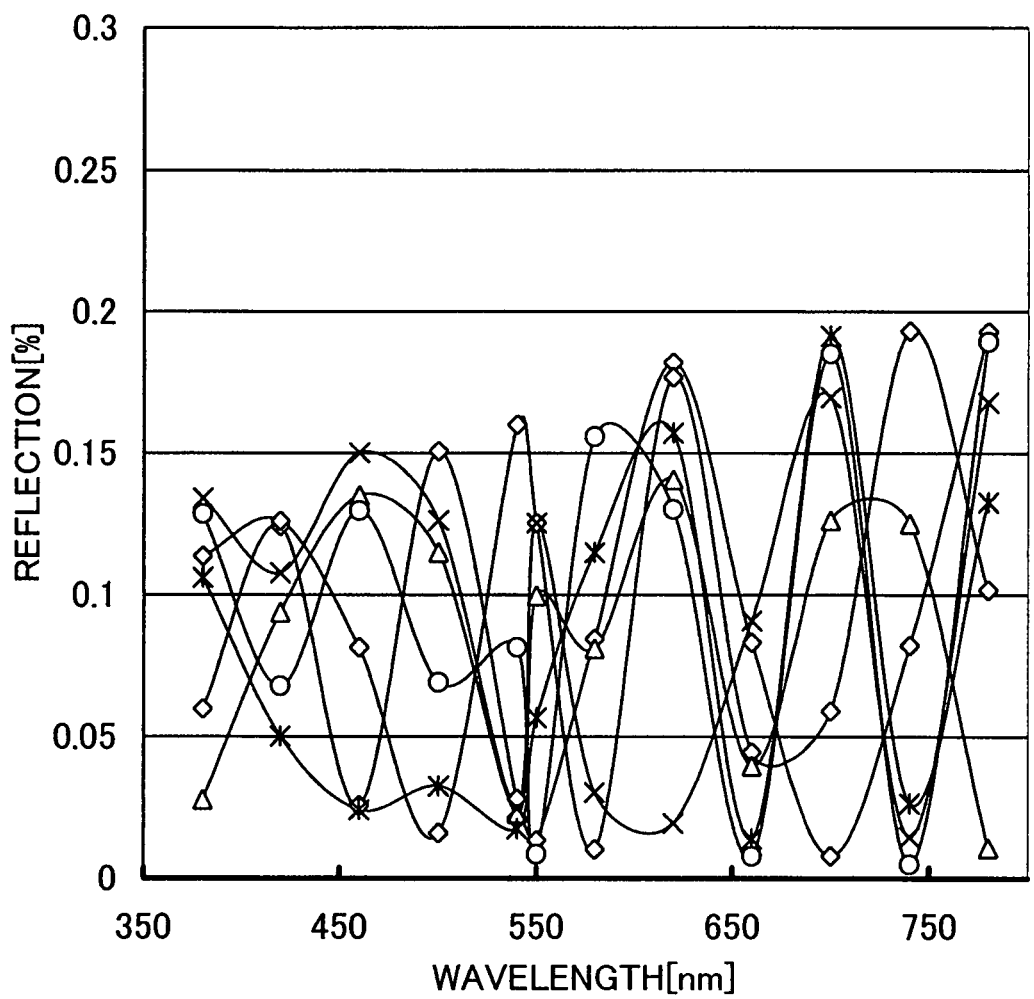
FIG. 31 is a diagram showing experimental data of Embodiment 2.
Figure 32:
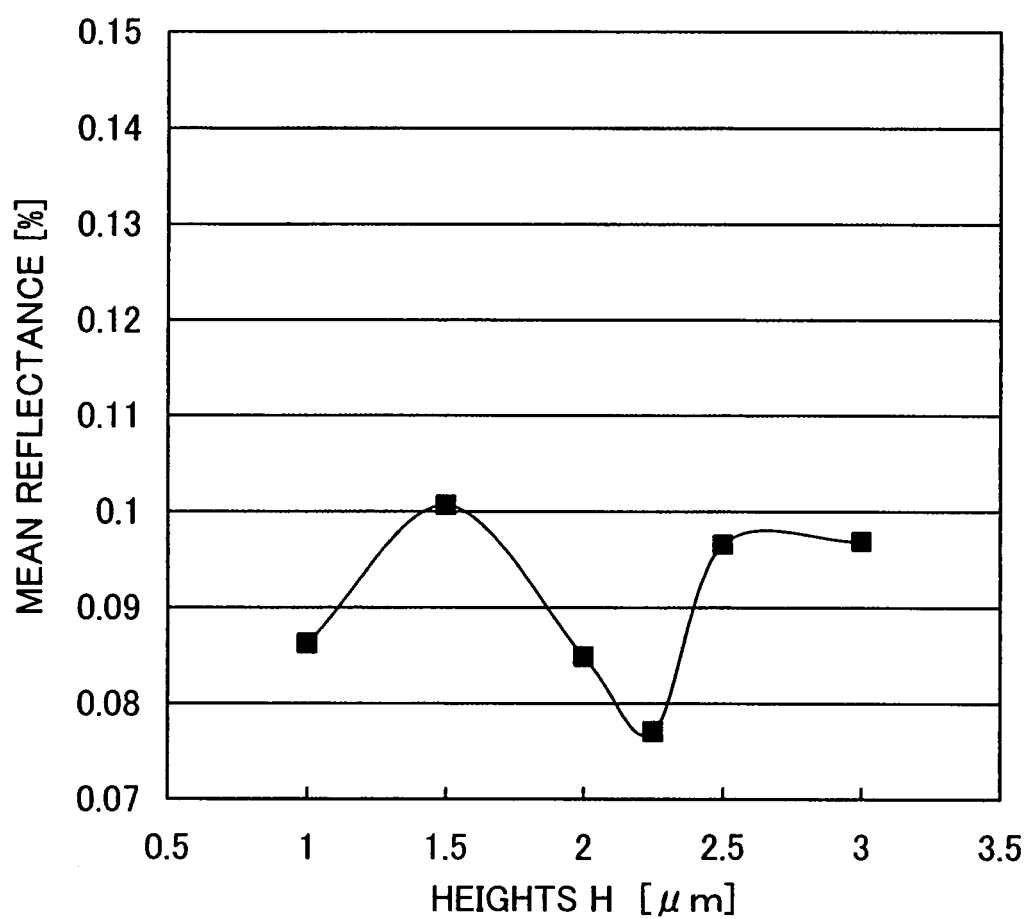
FIG. 32 is a diagram showing experimental data of Embodiment 2.

FIG. 31 shows the relationship between a wavelength of external light and each reflectance of the samples B1 to B6. As shown in FIG. 31, each reflectance of the samples B1 to B6 was approximately 0.2% or less in a measured visible light wavelength range (380 nm to 780 nm). FIG. 32 is a graph showing the result of FIG. 31 in the relationship between a height of an oblique line of each projection and a mean reflectance at the measured wavelength. The sample B1 has a height of 1 μm; the sample B2, 1.5 μm; the sample B3, 2.0 μm; the sample B4, 2.25 μm; the sample B5, 2.5 μm; and the sample B6, 3 μm. The mean reflectance is approximately 0.1% or less with the height of 1 μm to 3 μm. From this result, it is confirmed that when the angle of an oblique line of each projection is at 87.2°, the reflectance of external light can be reduced to approximately 0.1% or less with the height in the range of 1 μm to 3 μm and a high anti-reflection effect can be exerted. In addition, when each projection has a height of 1 μm to 3 μm, visible light transmittance thereof is not decreased.

Embodiment 3

In this embodiment, the reflection of external light by the anti-reflection film with projections on its surface using the present invention was calculated. This embodiment is described with reference to Table 4 and FIGS. 33 to 35.

Figure 33:
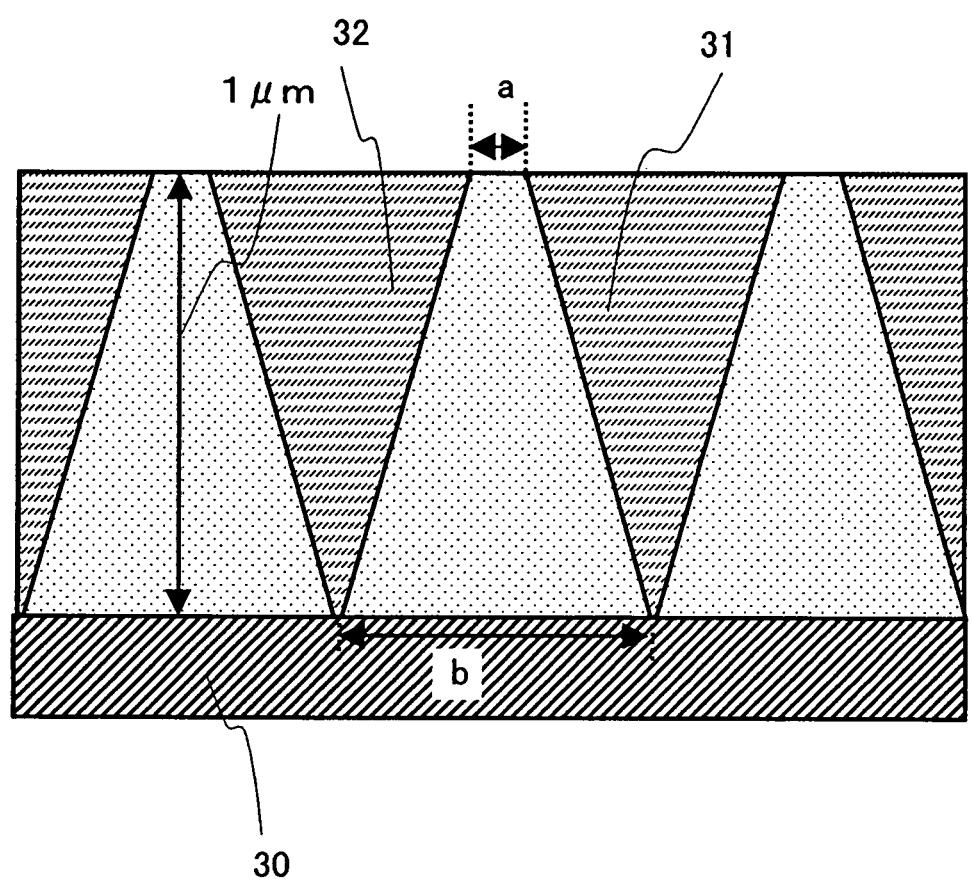
FIG. 33 is a diagram showing an experimental model of Embodiment 3.

The reflection of external light by the anti-reflection film with projections on its surface using the present invention was calculated. In this embodiment, a plurality of adjacent conical projections each with an upper base surface are used as samples C1 to C7, and each projection is trapezoidal in a cross section perpendicular to the base, as shown in FIG. 33. In FIG. 33, projections 31 and a protective layer filling a space between the projections are provided over a substrate 30. As shown in the cross-sectional view, a height of each trapezoid is 1 μm, and an angle θ is determined depending on a ratio of an upper base diameter (referred to as an upper base a) to a lower base diameter (referred to as a lower base b). The samples C1 to C7 respectively have ratios of upper bases a to lower bases b of 0, 0.05, 0.075, 0.1, 0.125, 0.15, and 0.2. Reflectances of light corresponding to external light, which is incident on the samples C1 to C7 and reflected by the anti-reflection films each having projections, were calculated. Table 4 shows the ratios of the upper bases a to the lower bases b in cross-sections of the samples C1 to C7.

TABLE 4

| STRUCTURE OF PROJECTIONS | C1 | C2 | C3 | C4 | C5 | C6 | C7 |
|---|---|---|---|---|---|---|---|
| a/b | 0 | 0.05 | 0.075 | 0.1 | 0.125 | 0.15 | 0.2 |

Each projection was made of silicon nitride containing oxygen. A refractive index thereof was set relative to a wavelength of light (for example, a refractive index, 1.48 (a wavelength, 380 nm), 1.47 (a wavelength, 550 nm), or 1.46 (a wavelength, 780 nm). A substrate provided with the anti-reflection film with projections was a glass substrate (with a refractive index of 1.52), and a refractive index of the protective layer was 1.05.

Figure 34:
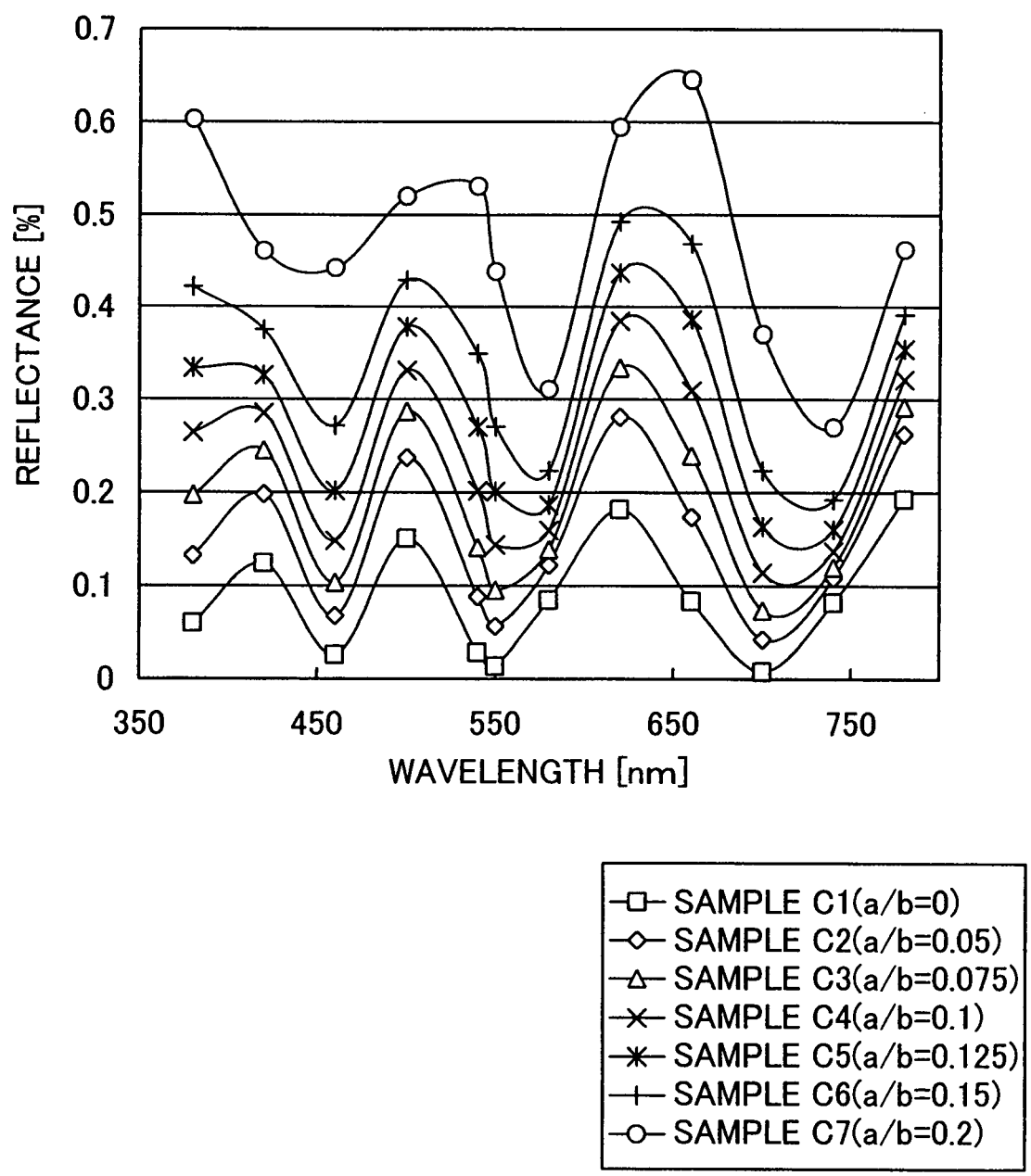
FIG. 34 is a diagram showing experimental data of Embodiment 3.
Figure 35:
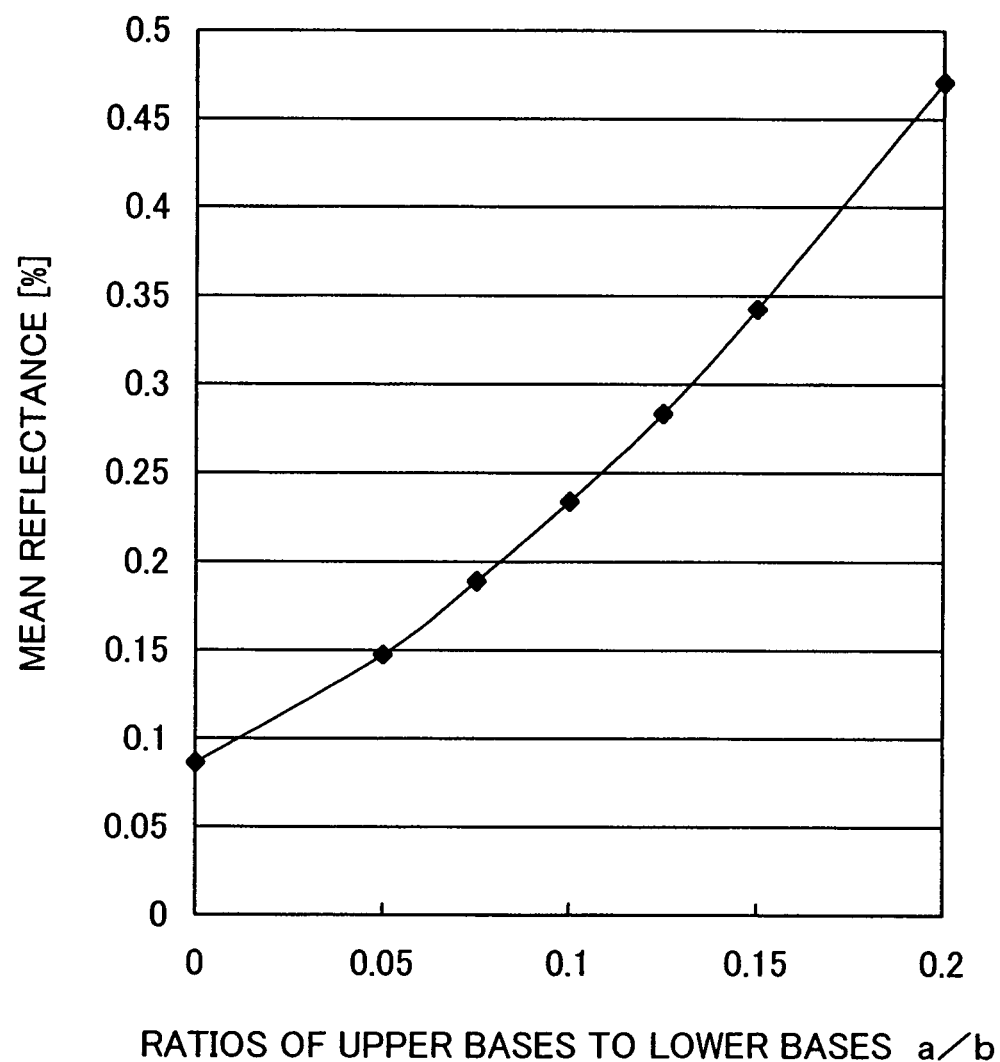
FIG. 35 is a diagram showing experimental data of Embodiment 3.

FIG. 34 shows the relationship between a wavelength of external light and each reflectance of the samples C1 to C7. As shown in FIG. 34, each reflectance of the samples C1 to C7 was approximately 0.7% or less in a measured visible light wavelength range (380 nm to 700 nm). FIG. 35 is a graph showing the result of FIG. 34 in the relationship between the upper bases a/the lower bases b showing the ratios of the upper bases a to the lower bases b and a mean reflectance at the measured wavelength. The sample C1 has an upper base a/a lower base b of 0; the sample C2, 0.05; the sample C3, 0.075; the sample C4, 0.1; the sample C5, 0.125; the sample C6, 0.15; and the sample C7, 0.2. The mean reflectance is approximately 0.7% or less when the ratio is 0 to 0.2. From this result, it is confirmed that at a projection including an upper base surface and a lower base surface, the reflectance of external light can be reduced to approximately 0.7% or less and the mean reflectance to approximately 0.5%, or less when the ratio of the upper base to the lower base is 0.2 or less, and that a high anti-reflection effect can be exerted.

This application is based on Japanese Patent Application serial no. 2006-151950 filed in Japan Patent Office on May 31, 2006, the entire contents of which are hereby incorporated by reference.

EXPLANATION OF REFERENCE

10, Glass Substrate; 11, Anti-reflection Film; 12, Air; 20, Substrate; 21, Projection; 22, Protective layer; 30, Substrate; 31, Projection, 32, Protective layer; 50, First Electrode Layer; 52, Electroluminescent Layer; 53, Second Electrode Layer; 54, Insulating Layer; 54a, Insulating Layer; 54b, Insulating Layer; 60, First Electrode Layer; 61, Light Emitting Material; 62, Electroluminescent Layer; 63, Second Electrode Layer; 64, Insulating Layer; 100, Substrate; 107, Gate Insulating Layer; 11a, High Refractive Index Layer; 11b, Low Refractive Index Layer; 167, Insulating Film; 168, Insulating Film; 177, Anti-reflection Film; 178, Terminal Electrode Layer; 181, Insulating Film; 185, First Electrode Layer; 186, Insulating Layer; 188, Electroluminescent Layer; 189, Second Electrode Layer; 190, Light Emitting Element; 192, Sealant; 193, Filler; 194, FPC; 195, Sealing Substrate; 196, Anisotropic Conductive Layer; 199, Wiring Layer; 201, Separation Region; 202, External Terminal Connection Region; 203, Wiring Region; 204, Peripheral Driver Circuit Region; 206, Pixel Region; 207, Peripheral Driver Circuit Region; 208, Peripheral Driver Circuit Region; 209, Peripheral Driver Circuit Region; 232, External Terminal Connection Region; 233, Sealing Region; 234, Peripheral Driver Circuit Region; 236, Pixel Region; Thin Film Transistor 255, Thin Film Transistor; 265, Thin Film Transistor; 275, Thin Film Transistor; 285, Thin Film Transistor; 332, Lamp Reflector; 352, Backlight Unit; 395, First Electrode Layer; 401, Cold Cathode Tube; 410, Display Screen; 414, External Light; 415, Reflected Light; 416, Protective Layer; 450, Display Device; 451, Projection; 452, Protective Layer; 460, Display Device; 461, Projection; 465, Display Device; 467, Protective Layer; 470, Display Device; 471, Projection; 475, Display Device; 477, Protective Layer; 480, Display Device; 481, Projection; 485, Display Device; 486, Anti-reflection Film; 487, Protective Layer; 490, Display Device; 491, Projection; 492, Protective Layer; 493, Protective Layer; 495, Protective Layer; 502, Gate Electrode Layer; 504, Semiconductor Layer; 520, Substrate; 521, Thin Film Transistor; 523, Insulating Layer; 524, Substrate; 526, Gate Insulating Layer; 528, Partition (Insulating Layer); 529, Anti-reflection Film; 530, Light Emitting Element; 531, First Electrode Layer; 532, Electroluminescent Layer; 533, Second Electrode Layer; 534, Insulating Layer; 536, Protective Layer; 538, Substrate; 550, Substrate; 551, Transistor; 556, Polarizer; 560, Pixel Electrode Layer; 561, Insulating Layer; 562, Liquid Crystal Layer; 563, Insulating Layer; 564, Conductive Layer; 565, Colored Layer; 566, Protective Layer; 567, Anti-reflection Film; 568, Substrate; 569, Polarizer; 581, Transistor; 582, Gate Electrode Layer; 584, Gate Insulating Layer; 586, Semiconductor Layer; 589, Spherical Particle; 594, Cavity; 595, Filler; 596, Protective Layer; 597, Anti-reflection Film; 598, Insulating Layer; 599, Substrate; 600, Substrate; 606, Pixel Region; 607, Driver Circuit Region; 611, Insulating Film; 612, Insulating Film; 615, Insulating Film; 616, Insulating Film; 620, Transistor; 621, Transistor; 622, Transistor; 623, Capacitor; 630, Pixel Electrode Layer; 631, Insulating Layer; 632, Liquid Crystal Layer; 633, Insulating Layer; 634, Conductive Layer; 635, Colored Layer; 637, Spacer; 641, Polarizer; 642, Anti-reflection Film; 643, Polarizer (Polarizing Plate); 64a, Insulating Layer; 64b, Insulating Layer; 678, Terminal Electrode Layer; 692, Sealant; 694, FPC; 695, Opposite Substrate; 696, Anisotropic Conductive Layer; 752, Electroluminescent Layer; 754, Insulating Layer; 756, Protective Layer; 757, Anti-reflection Film; 758, Substrate; 762, Electroluminescent Layer; 764, Insulating Layer; 765, Partition (Insulating Layer); 768, Protective Layer; 772, Electroluminescent Layer; 774, Insulating Layer; 775, Partition (Insulating Layer); 776, Insulating Layer; 778, Substrate; 792, Electroluminescent Layer; 794, Insulating Layer; 798, Substrate; 802, Third Layer; 803, Second Layer; 804, First Layer; 850, Second Electrode Layer; 860, Electroluminescent Layer; 870, First Electrode Layer; 901, Pixel Portion; 902, Signal Line Side Driver Circuit; 903, Scan Line Side Driver Circuit; 904, Tuner; 905, Video Signal Amplifier Circuit; 906, Video Signal Processing Circuit; 907, Control Circuit; 908, Signal Dividing Circuit; 909, Audio Signal Processing Circuit; 910, Audio Signal Processing Circuit; 911, Control Circuit; 912, Input Portion; 913, Speaker; 101a, Base Film; 101b, Base Film; 1300, Element Substrate; 1310, Gate Insulating Layer; 1311, Insulating Film; 1312, Insulating Film; 1314, Insulating Layer; 1317, First Electrode Layer; 1319, Electroluminescent Layer; 1320, Second Electrode Layer; 1322, Filler; 1324, Wiring Layer; 1325, Sealing Substrate; 1327, Anti-reflection Film; 1332, Sealant; 1333, Wiring Layer; 1355, Thin Film Transistor; 1365, Thin Film Transistor; 1375, Thin Film Transistor; 1381, Terminal Electrode Layer; 1382, Anisotropic Conductive Layer; 1383, FPC; 1385, Thin Film Transistor; 1600, Element Substrate; 1605, Light Emitting Element; 1610, Gate Insulating Layer; 1611, Insulating Film; 1612, Insulating Film; 1614, Insulating Layer; 1617, First Electrode Layer; 1619, Electroluminescent Layer; 1620, Second Electrode Layer; 1621, Protective Film; 1622, Filler; 1625, Sealing Substrate; 1632, Sealant; 1633, Wiring Layer; 1655, Thin Film Transistor; 1665, Thin Film Transistor; 1675, Thin Film Transistor; 1681, Terminal Electrode Layer; 1682, Anisotropic Conductive Layer; 1683, FPC; 1685, Thin Film Transistor; 1700, Substrate; 1703, Liquid Crystal Layer; 1704, Insulating Layer; 1705, Opposite Electrode Layer; 1706, Colored Layer; 1710, Substrate; 1712, Insulating Layer; 1714, Polarizing Plate; 179a, Wiring; 179b, Wiring; 2001, Chassis; 2002, Display Panel; 2003, Main Screen; 2004, Modem; 2005, Receiver; 2006, Remote Control Unit; 2007, Display Portion; 2008, Sub Screen; 2009, Speaker Portion; 2010, Chassis; 2011, Display Portion; 2012, Remote Control Unit; 2013, Speaker Portion; 2600, TFT Substrate; 2601, Opposite Substrate; 2602, Sealant; 2603, Pixel Portion; 2604, Display Element; 2605, Colored Layer; 2606, Polarizing Plate; 2607, Polarizing Plate; 2609, Flexible Wiring Board; 2610, Cold Cathode Tube; 2611, Reflector Plate; 2612, Circuit Board; 2613, Diffuser Panel; 2626, Anti-reflection Film; 2700, Substrate; 2701, Pixel Portion; 2702, Pixel; 2703, Scan Line Side Input Terminal; 2704, Signal Line Side Input Terminal; 2751, IC Driver; 2800, Substrate; 2801, Protective Circuit Portion; 2802, TFT; 2803, TFT; 2804, Light Emitting Element; 2805, Light Emitting Element; 2809, Driver Circuit; 2810, Wiring Board; 2811, External Circuit Substrate; 2812, Heat Sink; 2813, Heat Pipe; 2820, Sealing Substrate; 2912, Control Portion; 3700, Substrate; 3701, Pixel Portion; 3702, Scan Line Side Driver Circuit; 3704, Signal Line Side Input Terminal; 411a, Projection; 411b, Projection; 411c, Projection; 412a, Transmitted light; 412b, Reflected Light; 412c, Reflected Light; 412d, Reflected Light; 413a, Transmitted Light; 413b, Transmitted Light; 413c, Transmitted Light; 413d, Transmitted Light; 466a, Projection; 4700, Substrate; 4701, Pixel Portion; 4702, Scan Line Driver Circuit; 4704, Signal Line Driver Circuit; 476a, Projection; 503a, Semiconductor Layer; 503b, Semiconductor Layer; 525a, Wiring Layer; 525b, Wiring Layer; 585a, Wiring Layer; 585b, Wiring Layer; 587a, First Electrode Layer; 587b, First Electrode Layer; 588, Second Electrode Layer; 590a, Black Region; 590b, White Region; 604a, Base Film; 604b, Base Film; 608a, Driver Circuit Region; 608b, Driver Circuit Region; 751a, First Electrode Layer; 751b, First Electrode Layer; 751c, First Electrode Layer; 753a, Second Electrode Layer; 753b, Second Electrode Layer; 753c, Second Electrode Layer; 761a, First Electrode Layer; 761b, First Electrode Layer; 761c, First Electrode Layer; 763b, Second Electrode Layer; 771a, First Electrode Layer; 771b, First Electrode Layer; 771c, First Electrode Layer; 773b, Second Electrode Layer; 791a, First Electrode Layer; 791b, First Electrode Layer; 791c, First Electrode Layer; 793b, Second Electrode Layer; 9101, Main Body; 9102, Display Portion; 9201, Main Body; 9202, Display Portion; 9301, Main Body; 9302, Display Portion; 9401, Main Body; 9402, Display Portion; 9701, Display Portion; 9702, Display Portion; 1301a, Insulating Film; 1301b, Insulating Film; 1601a, Insulating Film; 1601b, Insulating Film; 1627a, Anti-reflection Film; 1701a, Pixel Electrode Layer; 2806a, Spacer; 2806b, Spacer; 2807a, Colored Layer; 2807b, Colored Layer; 2807c, Colored Layer; 2910a, Red Light Source; 2910b, Green Light Source; and 2910c, Blue Light Source.

The invention claimed is:

1. A display device comprising:
   an anti-reflection film including a plurality of projections over a display screen; and
   a protective layer having a lower refractive index than the plurality of projections between side surfaces of the plurality of projections, the protective layer being in contact with the side surfaces of the plurality of projections,
   wherein an angle made by a base and a slope of each of the plurality of projections is equal to or greater than 84° and less than 90°,
   wherein each of the plurality of projections is formed of a film comprising fluoride, oxide or nitride, and
   wherein each of the plurality of projections is formed of a material of which a refractive index continuously changes toward the display screen.

2. A display device comprising:
   a first substrate;
   a second substrate;
   a display element between one surface of the first substrate and one surface of the second substrate;
   an anti-reflection film including a plurality of projections over the other surface of the second substrate; and
   a protective layer having a lower refractive index than the plurality of projections between side surfaces of the plurality of projections, the protective layer being in contact with the side surfaces of the plurality of projections,
   wherein the second substrate is a light-transmitting substrate,
   wherein an angle made by a base and a slope of each of the plurality of projections is equal to or greater than 84° and less than 90°,
   wherein each of the plurality of projections is formed of a film comprising fluoride, oxide or nitride, and
   wherein each of the plurality of projections is formed of a material of which a refractive index continuously changes toward the second substrate.

3. A display device according to claim 2, further comprising a polarizing plate between the second substrate and the anti-reflection film.

4. A display device according to claim 1, wherein each of the plurality of projections has a conical shape.

5. A display device according to claim 1, wherein each top of the plurality of projections is flat or round.

6. A display device according to claim 1, wherein each of the plurality of projections has a shape of a stack of a conical shape over a cylindrical shape.

7. A display device according to claim 1, wherein a ratio of a height to a base diameter of each of the plurality of projections is 5:1 to 29:1.

8. A display device according to claim 1, wherein each of the plurality of projections has a height of 1 µm to 3 µm and a base diameter of 0.1 µm to 0.3 µm.

9. A display device according to claim 1, wherein the plurality of projections are adjacent to each other.

10. A display device according to claim 2, wherein the protective layer is formed of a material of which a refractive index continuously changes toward the second substrate.

11. A display device according to claim 1, wherein the anti-reflection film including the plurality of projections is covered with the protective layer.

12. A display device according to claim 1, wherein the anti-reflection film including the plurality of projections is selectively covered with the protective layer and an apical portion of each of the plurality of projections is exposed.

13. A display device according to claim 2, wherein the display element is a liquid crystal element.

14. A display device according to claim 2, wherein the display element is a light emitting element.

15. A display device comprising:
a first light-transmitting substrate;
a second light-transmitting substrate;
a display element between one surface of the first light-transmitting substrate and one surface of the second light-transmitting substrate;
a first anti-reflection film including a plurality of projections over the other surface of the first light-transmitting substrate;
a second anti-reflection film including a plurality of projections over the other surface of the second light-transmitting substrate;
a first protective layer having a lower refractive index than the plurality of projections of the first anti-reflection film between side surfaces of the plurality of projections of the first anti-reflection film, the first protective layer being in contact with the side surfaces of the plurality of projections of the first anti-reflection film; and
a second protective layer having a lower refractive index than the plurality of projections of the second anti-reflection film side surfaces of between the plurality of projections of the second anti-reflection film, the second protective layer being in contact with the side surfaces of the plurality of projections of the second anti-reflection film,
wherein an angle made by a base and a slope of each of the plurality of projections of the first anti-reflection film and the plurality of projections of the second anti-reflection film is equal to or greater than 84° and less than 90°,
wherein each of the plurality of projections of the first anti-reflection film is formed of a material of which a refractive index continuously changes toward the first light-transmitting substrate, and
wherein each of the plurality of projections of the second anti-reflection film is formed of a material of which a refractive index continuously changes toward the second light-transmitting substrate.

16. A display device according to claim 15, further comprising a first polarizing plate and a second polarizing plate,
wherein the first polarizing plate is provided between the first light-transmitting substrate and the first anti-reflection film, and
wherein the second polarizing plate is provided between the second light-transmitting substrate and the second anti-reflection film.

17. A display device according to claim 15, wherein each of the plurality of projections of the first anti-reflection film and the plurality of projections of the second anti-reflection film has a conical shape.

18. A display device according to claim 15, wherein each top of the plurality of projections is flat or round.

19. A display device according to claim 15, wherein each of the plurality of projections has a shape of a stack of a conical shape over a cylindrical shape.

20. A display device according to claim 15, wherein a ratio of a height to a base diameter of each of the plurality of projections of the first anti-reflection film and the plurality of projections of the second anti-reflection film is 5:1 to 29:1.

21. A display device according to claim 15, wherein each of the plurality of projections of the first anti-reflection film and the plurality of projections of the second anti-reflection film has a height of 1 µm to 3 µm and a base diameter of 0.1 µm to 0.3 µm.

22. A display device according to claim 15,
wherein the plurality of projections of the first anti-reflection film are adjacent to each other, and
wherein the plurality of projections of the second anti-reflection film are adjacent to each other.

23. A display device according to claim 15,
wherein the first protective layer is formed of a material of which a refractive index continuously changes toward the first light-transmitting substrate, and
wherein the second protective layer is formed of a material of which a refractive index continuously changes toward the second light-transmitting substrate.

24. A display device according to claim 15,
wherein the first anti-reflection film including the plurality of projections is covered with the first protective layer, and
wherein the second anti-reflection film including the plurality of projections is covered with the second protective layer.

25. A display device according to claim 15,
wherein the first anti-reflection film including the plurality of projections is selectively covered with the first protective layer and an apical portion of each of the plurality of projections is exposed, and
wherein the second anti-reflection film including the plurality of projections is selectively covered with the second protective layer and an apical portion of each of the plurality of projections is exposed.

26. A display device according to claim 15, wherein the display element is a liquid crystal element.

27. A display device according to claim 15, wherein the display element is a light emitting element.

28. A display device comprising:
an anti-reflection film including a plurality of projections over a display screen; and
a protective layer having a lower refractive index than the plurality of projections between side surfaces of the plurality of projections, the protective layer being in contact with the side surfaces of the plurality of projections, wherein each of the plurality of projections is formed of a material of which a refractive index continuously changes toward the display screen.

29. A display device according to claim 28, wherein an angle made by a base and a slope of at least one of the plurality of projections is equal to or greater than 84° and less than 90°.

30. A display device according to claim 1, wherein the protective layer is formed using a material for forming the anti-reflection film.

31. A display device according to claim 2, wherein the protective layer is formed using a material for forming the anti-reflection film.

32. A display device according to claim 15,
wherein the first protective layer is formed using a material for forming the first anti-reflection film, and
wherein the second protective layer is formed using a material for forming the second anti-reflection film.

33. A display device according to claim 28, wherein the protective layer is formed using a material for forming the anti-reflection film.

34. A display device according to claim 1, wherein each of the plurality of projections is formed of a material of which a refractive index increases from an apical portion to the base thereof.

35. A display device according to claim 2, wherein each of the plurality of projections is formed of a material of which a refractive index increases from an apical portion to the base thereof.

36. A display device according to claim 15, wherein each of the plurality of projections is formed of a material of which a refractive index increases from an apical portion to the base thereof.

37. A display device according to claim 28, wherein each of the plurality of projections is formed of a material of which a refractive index increases from an apical portion to a base thereof.

* * * * *